(12) United States Patent
Lee et al.

(10) Patent No.: US 12,550,426 B2
(45) Date of Patent: Feb. 10, 2026

(54) SEMICONDUCTOR DEVICE

(71) Applicant: SAMSUNG ELECTRONICS CO., LTD., Suwon-si (KR)

(72) Inventors: Kyen-Hee Lee, Seoul (KR); Kyung Soo Kim, Hwaseong-si (KR); Sung Il Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 779 days.

(21) Appl. No.: 17/736,367

(22) Filed: May 4, 2022

(65) Prior Publication Data

US 2023/0120551 A1   Apr. 20, 2023

(30) Foreign Application Priority Data

Oct. 14, 2021   (KR) .................. 10-2021-0136202

(51) Int. Cl.
*H10D 84/85* (2025.01)
*H10D 30/67* (2025.01)
*H10D 62/10* (2025.01)

(52) U.S. Cl.
CPC ....... *H10D 84/856* (2025.01); *H10D 30/6713* (2025.01); *H10D 30/6729* (2025.01); *H10D 30/6735* (2025.01); *H10D 30/6757* (2025.01); *H10D 62/118* (2025.01)

(58) Field of Classification Search
CPC ........... H10D 30/6735; H10D 30/6713; H10D 30/6757; H10D 30/6729; H10D 62/118–123; H10D 84/856; H10D 84/0186
See application file for complete search history.

(56) References Cited

U.S. PATENT DOCUMENTS

| | | | |
|---|---|---|---|
| 9,991,261 B2 | 6/2018 | Mitard | |
| 10,373,942 B2 | 8/2019 | Asra et al. | |
| 10,483,166 B1 | 11/2019 | Cheng et al. | |
| 10,748,994 B2 | 8/2020 | Reznicek et al. | |
| 10,832,969 B2 | 11/2020 | Miao et al. | |
| 11,018,264 B1 | 5/2021 | Gomes et al. | |
| 2018/0315709 A1* | 11/2018 | Schultz | H10D 89/10 |
| 2019/0172828 A1* | 6/2019 | Smith | H10D 88/00 |
| 2020/0098859 A1 | 3/2020 | Reboh et al. | |

(Continued)

FOREIGN PATENT DOCUMENTS

| | | |
|---|---|---|
| KR | 10-2020-0064241 A | 6/2020 |
| KR | 10-2020-0085914 A | 7/2020 |
| KR | 10-2021-0099994 A | 8/2021 |

*Primary Examiner* — Steven B Gauthier
*Assistant Examiner* — E. Rhett Cheek
(74) *Attorney, Agent, or Firm* — Sughrue Mion, PLLC

(57) ABSTRACT

A semiconductor device is provided. The semiconductor device includes: lower nanosheets; upper nanosheets on the lower nanosheets; gate electrodes on the substrate and provided around each of the nanosheets; a first lower source/drain region on a first side of the first and second gate electrodes; a second lower source/drain region on a second side of the first and second gate electrodes; a first upper source/drain region on the first lower source/drain region; and a second upper source/drain region on the second lower source/drain region. A first length of the second lower source/drain region is greater than a second length of the second upper source/drain region.

20 Claims, 37 Drawing Sheets

(56) References Cited

U.S. PATENT DOCUMENTS

| | | |
|---|---|---|
| 2020/0126987 A1* | 4/2020 | Rubin ................ H10D 84/0186 |
| 2020/0168617 A1* | 5/2020 | Hong ........................ G11C 8/14 |
| 2020/0203343 A1 | 6/2020 | Zhu et al. |
| 2020/0235098 A1 | 7/2020 | Li et al. |
| 2020/0335501 A1 | 10/2020 | Dewey et al. |
| 2021/0035975 A1 | 2/2021 | Kim et al. |
| 2021/0098500 A1* | 4/2021 | Wang ..................... H10D 88/00 |
| 2022/0406715 A1* | 12/2022 | Xie ................... H01L 21/76898 |
| 2022/0406908 A1* | 12/2022 | Reznicek ........... H10D 30/6735 |
| 2025/0087491 A1* | 3/2025 | Lin ........................ H10D 30/43 |

\* cited by examiner

SEMICONDUCTOR DEVICE

CROSS-REFERENCE TO RELATED APPLICATION

This application claims priority from Korean Patent Application No. 10-2021-0136202 filed on Oct. 14, 2021 in the Korean Intellectual Property Office, the disclose of which is incorporated by reference herein in its entirety.

BACKGROUND

1. Technical Field

The present disclosure relates to a semiconductor device.

2. Description of Related Art

Integration density of a semiconductor device may be increased through use of a multi-gate transistor in which a silicon body in a shape of a fin or a nanowire is formed on a substrate, and a gate is formed on a surface of the silicon body.

Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress a short channel effect (SCE) in which potential of a channel area is affected by drain voltage.

SUMMARY

One or more embodiments provide a semiconductor device having a structure in which a lower source/drain region and an upper source/drain region are stacked in a vertical direction such that a length of the upper source/drain region is shorter than a length of the lower source/drain region, thereby improving integration of the device.

One or more embodiments provide a semiconductor device having a structure in which a lower source/drain region and an upper source/drain region are stacked in a vertical direction such that a buried contact electrically connected to the lower source/drain region is disposed below the upper source/drain region, thereby improving integration of the device.

According to an aspect of an embodiment, a semiconductor device includes: a substrate; a plurality of lower nanosheets on the substrate and extending in a first horizontal direction, wherein the plurality of lower nanosheets are stacked and spaced apart from each other in a vertical direction; a plurality of upper nanosheets on the plurality of lower nanosheets and extending in the first horizontal direction, wherein the plurality of upper nanosheets are stacked and spaced apart from each other in the vertical direction; first to fourth gate electrodes on the substrate and extending in a second horizontal direction different from the first horizontal direction, wherein the first to fourth gate electrodes are provided around each of the plurality of lower nanosheets and each of the plurality of upper nanosheets, the second gate electrode is spaced apart from the first gate electrode in the second horizontal direction, the third gate electrode is spaced apart from the first gate electrode in the first horizontal direction, and the fourth gate electrode is spaced apart from the third gate electrode in the second horizontal direction; a first lower source/drain region on a first side of the first and second gate electrodes; a second lower source/drain region on a second side of the first and second gate electrodes opposite to the first side in the first horizontal direction, wherein the second side of the first and second gate electrodes faces the third and fourth gate electrodes; a first upper source/drain region on the first lower source/drain region; a second upper source/drain region on the second lower source/drain region; and an interlayer insulating layer between the first lower source/drain region and the first upper source/drain region, and between the second lower source/drain region and the second upper source/drain region. A first length in the second horizontal direction of the second lower source/drain region is greater than a second length in the second horizontal direction of the second upper source/drain region.

According to an aspect of an embodiment, a semiconductor device includes: a substrate; a plurality of lower nanosheets on the substrate and extending in a first horizontal direction, wherein the plurality of lower nanosheets are stacked and spaced apart from each other in a vertical direction; a plurality of upper nanosheets on the plurality of lower nanosheets and extending in the first horizontal direction, wherein the plurality of upper nanosheets are stacked and spaced apart from each other in the vertical direction; a first gate electrode on the substrate and extending in a second horizontal direction different from the first horizontal direction, wherein the first gate electrode is provided around each of the plurality of lower nanosheets and each of the plurality of upper nanosheets; a second gate electrode on the substrate and extending in the second horizontal direction, wherein the second gate electrode is spaced apart from the first gate electrode in the second horizontal direction, and the second gate electrode is provided around each of the plurality of lower nanosheets and each of the plurality of upper nanosheets; a lower source/drain region on first and second sides of the first and second gate electrodes; an upper source/drain region on the lower source/drain region on the first and second sides of the first and second gate electrodes; and an interlayer insulating layer between the lower source/drain region and the upper source/drain region. On at least one side of the first and second sides of the first and second gate electrodes, a first length in the second horizontal direction of the lower source/drain region is greater than a second length in the second horizontal direction of the upper source/drain region.

According to an aspect of an embodiment, a semiconductor device includes: a substrate; a plurality of lower nanosheets on the substrate and extending in a first horizontal direction, wherein the plurality of lower nanosheets are stacked and spaced apart from each other in a vertical direction; a plurality of upper nanosheets on the plurality of lower nanosheets and extending in the first horizontal direction, the plurality of upper nanosheets are stacked and spaced apart from each other in the vertical direction; a first gate electrode on the substrate and extending in a second horizontal direction different from the first horizontal direction, wherein the first gate electrode is provided around each of the plurality of lower nanosheets and each of the plurality of upper nanosheets; a second gate electrode on the substrate and extending in the second horizontal direction, wherein the second gate electrode is spaced apart from the first gate electrode in the second horizontal direction, and the second gate electrode is provided around each of the plurality of lower nanosheets and each of the plurality of upper nanosheets; a first lower source/drain region on a first side of the first and second gate electrodes; a second lower source/drain region on a second side of the first and second gate electrodes opposite to the first side in the first horizontal direction; a first upper source/drain region on the first lower source/drain region; a second upper source/drain region on the second lower source/drain region; an interlayer insulating layer between the first lower source/drain region and the first upper source/drain region, and between the second lower source/drain region and the second upper source/drain region; and a buried contact electrically connected to one of the first and second lower source/drain regions and extending into an inside of the substrate.

Embodiments are not limited to the above. Other aspects and advantages that are not mentioned may be understood based on following description.

BRIEF DESCRIPTION OF DRAWINGS

The above and other aspects will be more clearly understood from the follow description of embodiments, taken in conjunction with the attached drawings, in which.

DETAILED DESCRIPTIONS

Figure 1:
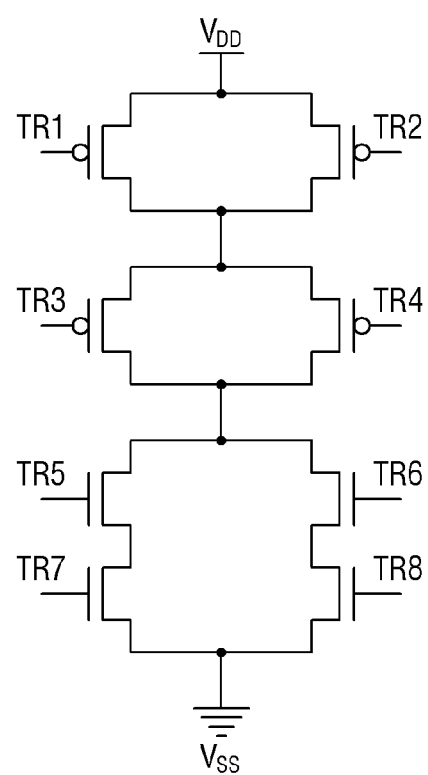
FIG. 1 is a circuit diagram for illustrating a semiconductor device according to some embodiments.

Hereinafter, embodiments will be described in detail with reference to the accompanying drawings. Like components are denoted by like reference numerals throughout the specification, and repeated descriptions thereof are omitted. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
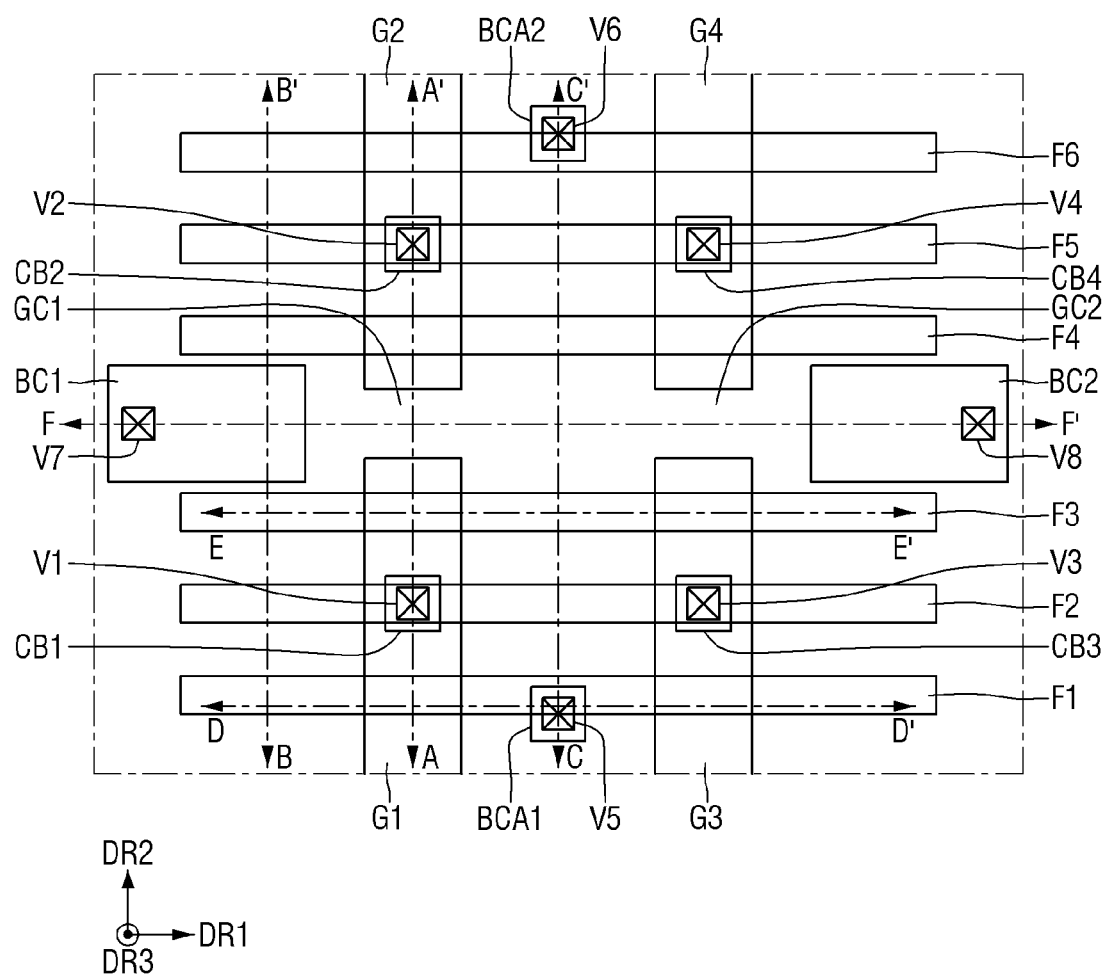
FIG. 2 is a layout diagram for illustrating a contact connected to a lower source/drain region in a semiconductor device according to some embodiments.
Figure 3:
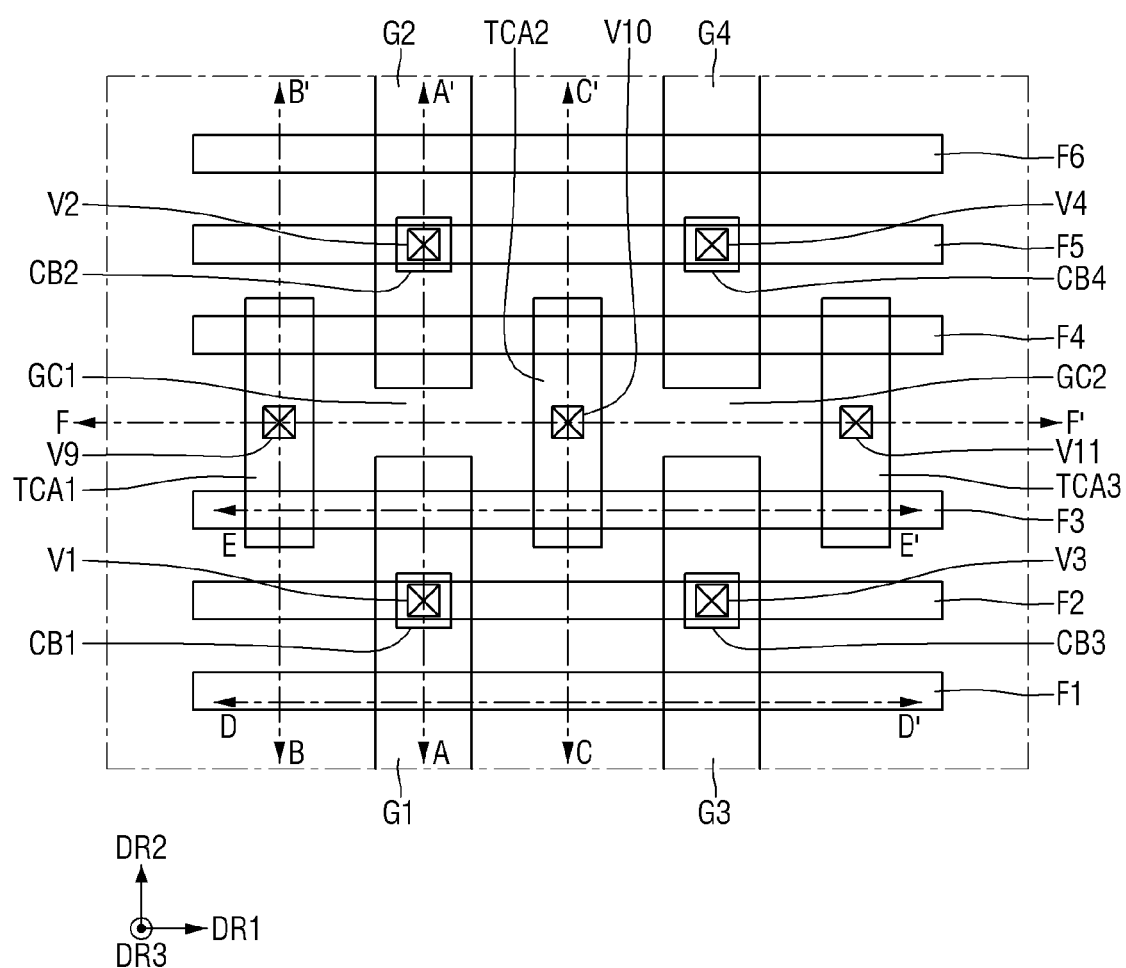
FIG. 3 is a layout diagram for illustrating a contact connected to an upper source/drain region in a semiconductor device according to some embodiments.
Figure 4:
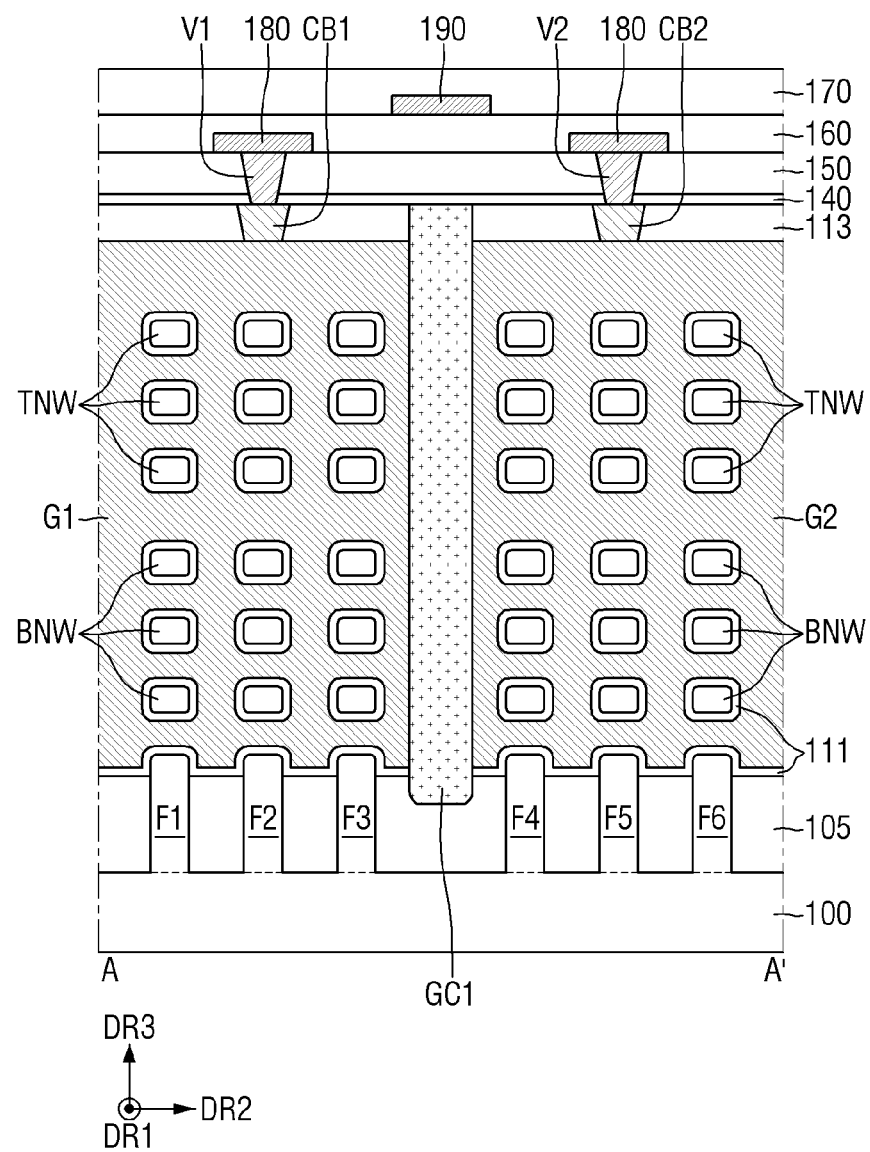
FIG. 4 is a cross-sectional view taken along a line A-A' in each of FIG. 2 and FIG. 3.
Figure 5:
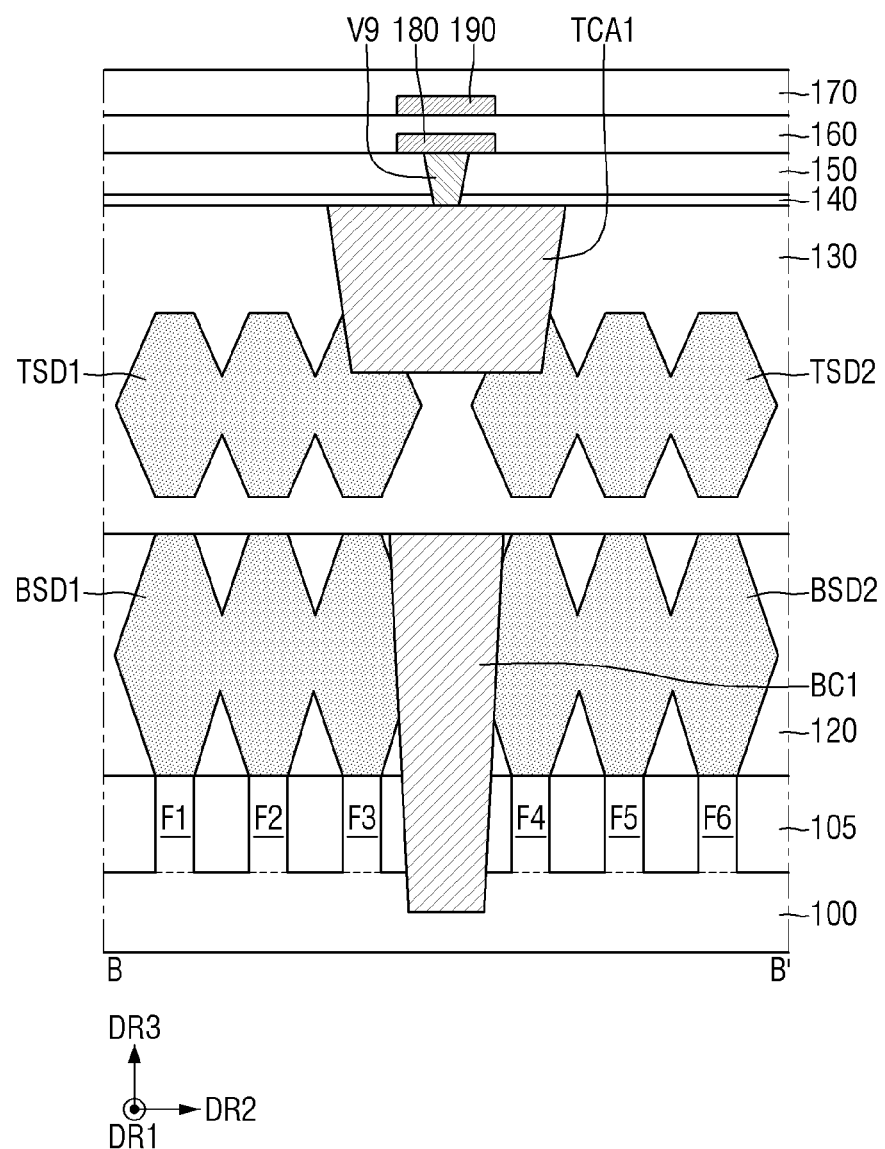
FIG. 5 is a cross-sectional view taken along a line B-B' in each of FIG. 2 and FIG. 3.
Figure 6:
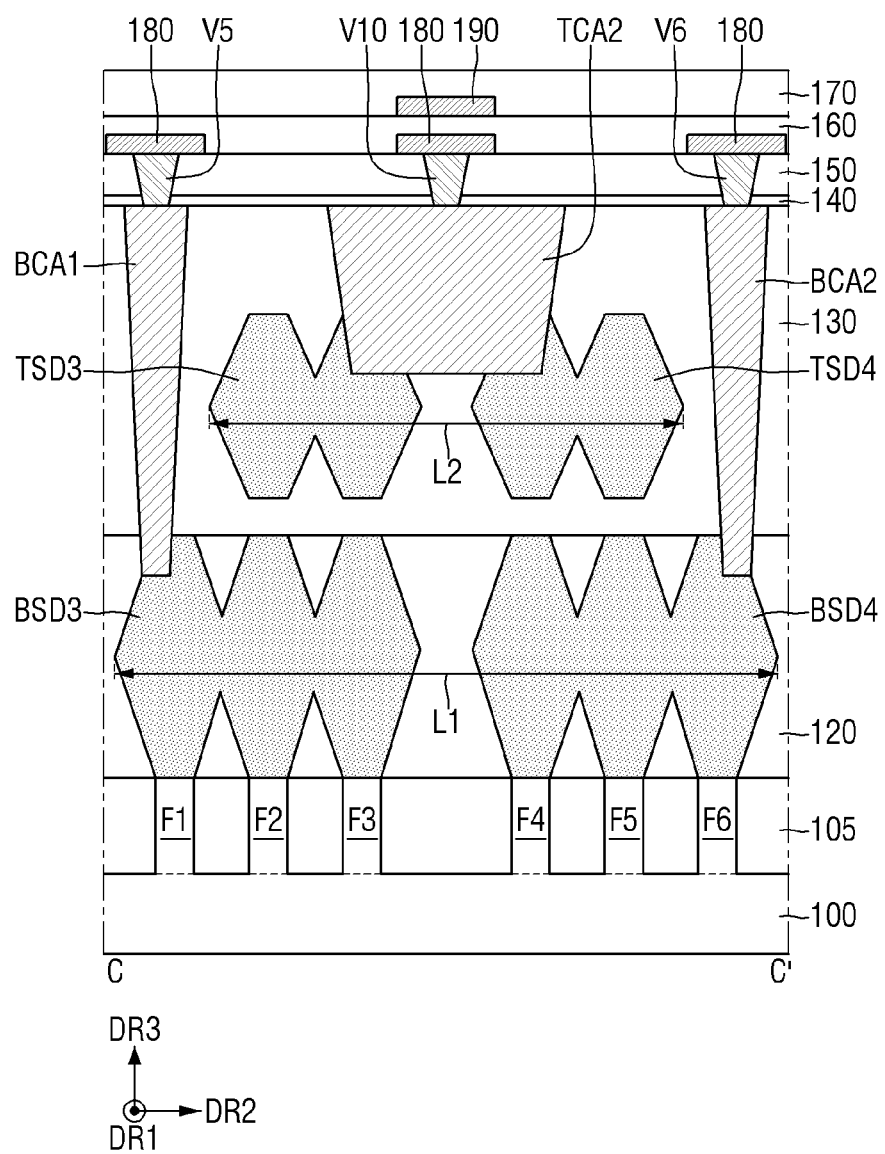
FIG. 6 is a cross-sectional view taken along a line C-C' in each of FIG. 2 and FIG. 3.
Figure 7:
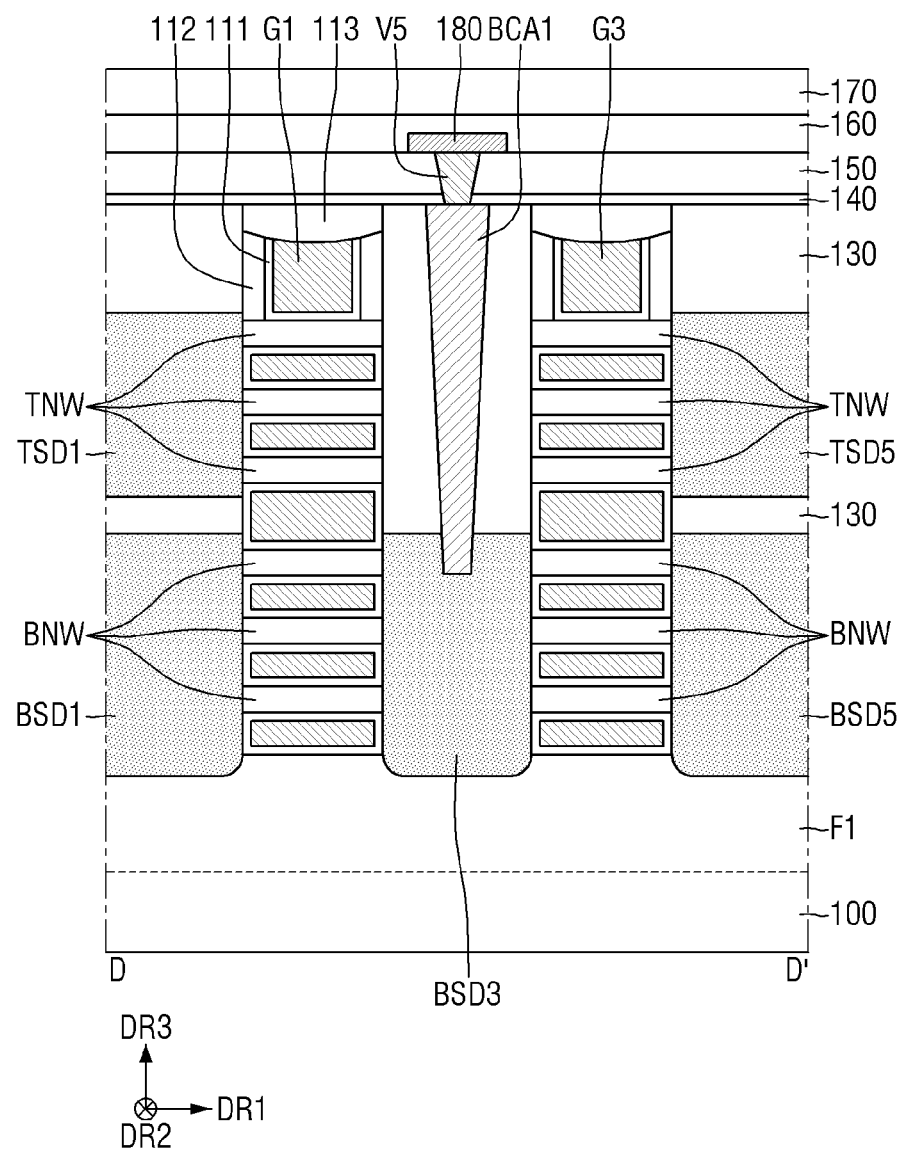
FIG. 7 is a cross-sectional view taken along a line D-D' in each of FIG. 2 and FIG. 3.
Figure 8:
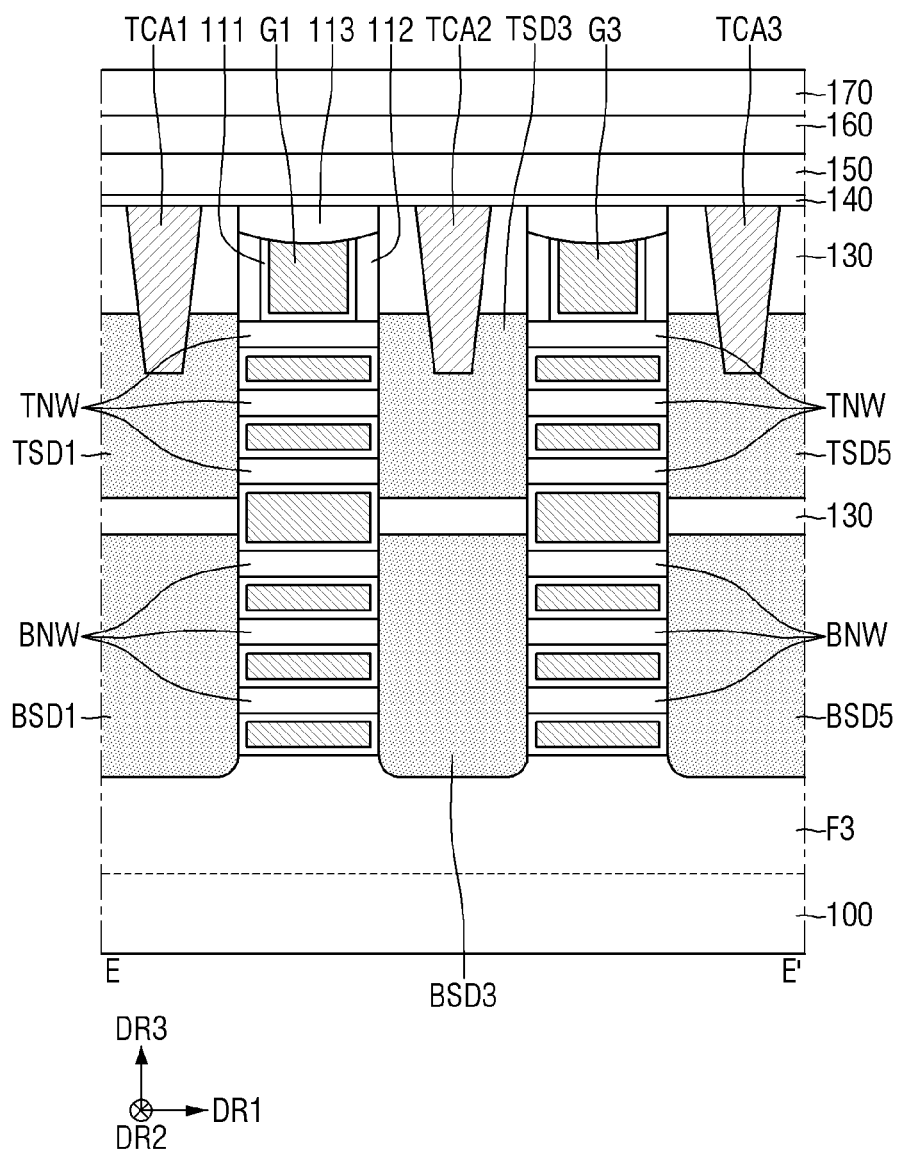
FIG. 8 is a cross-sectional view taken along a line E-E' in each of FIG. 2 and FIG. 3.
Figure 9:
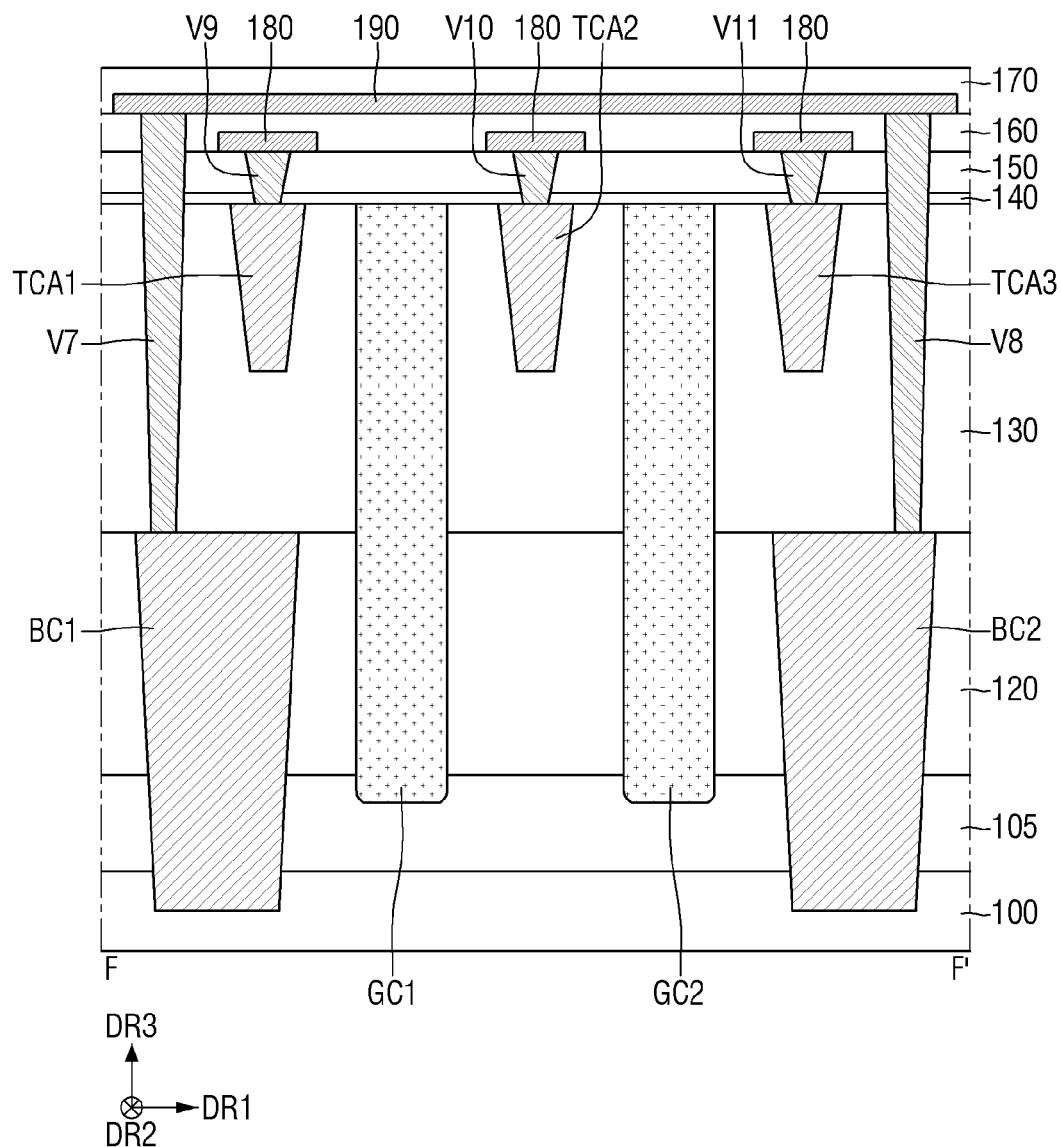
FIG. 9 is a cross-sectional view taken along a line F-F' in each of FIG. 2 and FIG. 3.

FIG. 1 is a circuit diagram for illustrating a semiconductor device according to some embodiments. FIG. 2 is a layout diagram for illustrating a contact connected to a lower source/drain region in a semiconductor device according to some embodiments. FIG. 3 is a layout diagram for illustrating a contact connected to an upper source/drain region in a semiconductor device according to some embodiments. FIG. 4 is a cross-sectional view taken along a line A-A' in each of FIG. 2 and FIG. 3. FIG. 5 is a cross-sectional view taken along a line B-B' in each of FIG. 2 and FIG. 3. FIG. 6 is a cross-sectional view taken along a line C-C' in each of FIG. 2 and FIG. 3. FIG. 7 is a cross-sectional view taken along a line D-D' in each of FIG. 2 and FIG. 3. FIG. 8 is a cross-sectional view taken along a line E-E' in each of FIG. 2 and FIG. 3. FIG. 9 is a cross-sectional view taken along a line F-F' in each of FIG. 2 and FIG. 3.

Referring to FIG. 1 to FIG. 9, a semiconductor device according to some embodiments includes a substrate 100, a field insulating layer 105, first to sixth active patterns F1 to F6, a plurality of lower nanosheets BNW, a plurality of upper nanosheets TNW, first to fourth gate electrodes G1 to G4, a gate insulating layer 111, a gate spacer 112, a capping pattern 113, a first gate cut GC1, a second gate cut GC2, first to fifth lower source/drain regions BSD1 to BSD5, first to fifth upper source/drain regions TSD1 to TSD5, first to fourth gate contacts CB1 to CB4, first and second buried contacts BC1 and BC2, first and second lower source/drain contacts BCA1 and BCA2, first to third upper source/drain contacts TCA1 to TCA3, first to eleventh vias V1 to V11, a first interlayer insulating layer 120, a second interlayer insulating layer 130, an etching stop layer 140, a third interlayer insulating layer 150, a fourth interlayer insulating layer 160, a fifth interlayer insulating layer 170, a first line pattern 180, and a second line pattern 190.

The substrate 100 may be embodied as a silicon substrate or a silicon-on-insulator (SOI). Alternatively, the substrate 100 may include silicon germanium, a silicon germanium on insulator (SGOI), indium antimonide, lead telluride, indium arsenide, indium phosphide, gallium arsenide or gallium antimonide. However, embodiments are not limited thereto.

Each of the first to sixth active patterns F1 to F6 may protrude from the substrate 100 in a vertical direction DR3. Each of the first to sixth active patterns F1 to F6 may extend in a first horizontal direction DR1. The second active pattern F2 may be spaced apart from the first active pattern F1 in a second horizontal direction DR2 different from the first horizontal direction DR1. The third active pattern F3 may be spaced apart from the second active pattern F2 in the second horizontal direction DR2. The fourth active pattern F4 may be spaced apart from the third active pattern F3 in the second horizontal direction DR2. The fifth active pattern F5 may be spaced apart from the fourth active pattern F4 in the second horizontal direction DR2. The sixth active pattern F6 may be spaced apart from the fifth active pattern F5 in the second horizontal direction DR2.

For example, the first to third active patterns F1, F2, and F3 may be spaced apart from each other by the same spacing. The fourth to sixth active patterns F4, F5, and F6 may be spaced apart from each other by the same spacing. For example, a spacing between the third active pattern F3 and the fourth active pattern F4 may be greater than a spacing between the second active pattern F2 and the third active pattern F3.

Each of the first to sixth active patterns F1 to F6 may be a portion of the substrate 100, or may include an epitaxial layer grown from the substrate 100. Each of the first to sixth active patterns F1 to F6 may include, for example, silicon or germanium as an elemental semiconductor material. Further, each of the first to the sixth active pattern F1 to F6 may include a compound semiconductor. For example, each of the first to sixth active patterns F1 to F6 may include a group IV-IV compound semiconductor or a group III-V compound semiconductor.

The field insulating layer 105 may be disposed on the substrate 100. The field insulating layer 105 may surround a side wall of each of the first to sixth active patterns F1 to F6. For example, each of the first to sixth active patterns F1 and F6 may protrude, in the vertical direction DR3, beyond a top face of the field insulating layer 105. The field insulating layer 105 may include, for example, an oxide film, a nitride film, an oxynitride film, or a combination film thereof.

The plurality of lower nanosheets BNW may be disposed on the substrate 100. The plurality of lower nanosheets BNW may be disposed on each of the first to sixth active patterns F1 to F6. The plurality of lower nanosheets BNW may extend in the first horizontal direction DR1. The plurality of lower nanosheets BNW may include a plurality of nanosheets stacked to be spaced apart from each other in the vertical direction DR3.

The plurality of lower nanosheets BNW disposed on each of the first to sixth active patterns F1 to F6 may be spaced apart from each other in the second horizontal direction DR2. Further, the plurality of lower nanosheets BNW surrounded with each of the first to fourth gate electrodes G1 to G4 may be spaced apart from each other in the first horizontal direction DR1.

The plurality of upper nanosheets TNW may be disposed on the plurality of lower nanosheets BNW. The plurality of upper nanosheets TNW may be disposed on each of the first to sixth active patterns F1 and to F6. The plurality of upper nanosheets TNW may extend in the first horizontal direction DR1. The plurality of upper nanosheets TNW may include a plurality of nanosheets stacked to be spaced apart from each other in the vertical direction DR3.

The plurality of upper nanosheets TNW disposed on each of the first to sixth active patterns F1 to F6 may be spaced apart from each other in the second horizontal direction DR2. Further, the plurality of upper nanosheets TNW surrounded with each of the first to fourth gate electrodes G1 to G4 may be spaced apart from each other in the first horizontal direction DR1.

In FIG. 4, the number of the plurality of lower nanosheets BNW spaced apart from each other in the vertical direction DR3 is three, and the number of the plurality of upper nanosheets TNW spaced apart from each other in the vertical direction DR3 is three. However, this is for convenience of description, and embodiments are not limited thereto. In some embodiments, the number of the plurality of lower nanosheets BNW spaced apart from each other in the vertical direction DR3 may be at least four, and the number of the plurality of upper nanosheets TNW spaced apart from each other in the vertical direction DR3 may be at least four.

For example, an area in which the plurality of lower nanosheets BNWs are disposed may be an NMOS region. Further, an area in which the plurality of upper nanosheets TNW are disposed may be a PMOS region.

The first gate electrode G1 may extend in the second horizontal direction DR2 and may be disposed on the first to third active patterns F1, F2, and F3. The second gate electrode G2 may extend in the second horizontal direction DR2 and may be disposed on the fourth to sixth active patterns F4, F5, and F6. The second gate electrode G2 may be spaced apart from the first gate electrode G1 in the second horizontal direction DR2. The third gate electrode G3 may extend in the second horizontal direction DR2 and may be disposed on the first to third active patterns F1, F2, and F3. The third gate electrode G3 may be spaced apart from the first gate electrode G1 in the first horizontal direction DR1. The fourth gate electrode G4 may extend in the second horizontal direction DR2 and may be disposed on the fourth to sixth active patterns F4, F5, and F6. The fourth gate electrode G4 may be spaced apart from the third gate electrode G3 in the second horizontal direction DR2.

Each of the first to fourth gate electrodes G1, G2, G3, and G4 may surround each of the plurality of lower nanosheets BNW and each of the plurality of upper nanosheets TNW. Each of the first to fourth gate electrodes G1, G2, G3, and G4 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. Embodiments are not limited thereto. Each of the first to fourth gate electrodes G1, G2, G3, and G4 may include a conductive metal oxide, a conductive metal oxynitride, and the like or may include oxidized products of the above-mentioned materials.

The semiconductor device according to some embodiments may include 8 transistors. For example, the semiconductor device according to some embodiments may include first to eighth transistors TR1 to TR8.

For example, the first transistor TR1 may include the plurality of upper nanosheets TNW and the second gate electrode G2. The second transistor TR2 may include the plurality of upper nanosheets TNW and the first gate electrode G1. The third transistor TR3 may include the plurality of upper nanosheets TNW and the fourth gate electrode G4. The fourth transistor TR4 may include the plurality of upper nanosheets TNW and the third gate electrode G3.

Further, the fifth transistor TR5 may include the plurality of lower nanosheets BNW and the second gate electrode G2. The sixth transistor TR6 may include the plurality of lower nanosheets BNW and the fourth gate electrode G4. The seventh transistor TR7 may include the plurality of lower nanosheets BNW and the first gate electrode G1. The eighth transistor TR8 may include the plurality of lower nanosheets BNW and the third gate electrode G3.

For example, a power node VDD may be connected to each of the first transistor TR1 and the second transistor TR2. A ground node VSS may be connected to each of the seventh transistor TR7 and the eighth transistor TR8.

The first gate cut GC1 may be disposed between the first gate electrode G1 and the second gate electrode G2. The first gate cut GC1 may space the first gate electrode G1 and the second gate electrode G2 from each other in the second horizontal direction DR2. The second gate cut GC2 may be disposed between the third gate electrode G3 and the fourth gate electrode G4. The second gate cut GC2 may space the third gate electrode G3 and the fourth gate electrode G4 from each other in the second horizontal direction DR2. Each of the first gate cut GC1 and the second gate cut GC2 may include at least one of, for example, silicon nitride (SiN), silicon oxynitride (SiON), silicon oxide (SiO$_2$), silicon carbonitride (SiCN), silicon oxycarbonitride (SiOCN), silicon boron nitride (SiBN), silicon oxyboron nitride (SiOBN), silicon oxycarbide (SiOC), and combinations thereof.

The gate insulating layer 111 may be disposed along a side wall of each of the first to fourth gate electrodes G1 to G4. The gate insulating layer 111 may be disposed between each of the first to fourth gate electrodes G1, G2, G3, and G4 and each of the plurality of lower nanosheets BNW. The gate insulating layer 111 may be disposed between each of the first to fourth gate electrodes G1, G2, G3, and G4 and each of the plurality of upper nanosheets TNW. The gate insulating layer 111 may be disposed between each of the first to fourth gate electrodes G1, G2, G3, and G4 and the field insulating layer 105. The gate insulating layer 111 may be disposed between each of the first to fourth gate electrodes G1, G2, G3, and G4 and each of the first to sixth active patterns F1 to F6.

Although it is shown in FIG. 4 that the gate insulating layer 111 is not disposed between the first gate cut GC1 and each of the first and second gate electrodes G1 and G2, embodiments are not limited thereto. In some embodiments, the gate insulating layer 111 may also be disposed between the first gate cut GC1 and each of the first and second gate electrodes G1 and G2.

The gate insulating layer 111 may include at least one of silicon oxide, silicon oxynitride, silicon nitride, or a high dielectric constant material having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some further embodiments may include a negative capacitance (NC) FET using a negative capacitor. For example, the gate insulating layer 111 may include a ferroelectric material film having ferroelectric properties and a paraelectric material film having paraelectric properties.

The ferroelectric material film may have negative capacitance, and the paraelectric material film may have positive capacitance. For example, when two or more capacitors are connected in series to each other, and capacitance of each of the capacitors has a positive value, a total capacitance is less than a capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, embodiments are not limited thereto.

The ferroelectric material film and the paraelectric material film may include the same material but have different properties. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties, and may be, for example, in a range of about 0.5 to about 10 nm, although embodiments are not limited thereto. Because a critical thickness exhibiting the ferroelectric properties may be vary based on a type of the ferroelectric material, the thickness of the ferroelectric material film may vary depending on the type of the ferroelectric material.

In one example, the gate insulating layer 111 may include one ferroelectric material film. In another example, the gate insulating layer 111 may include a plurality of ferroelectric material films spaced apart from each other. The gate insulating layer 111 may have a stack film structure in which a plurality of ferroelectric material films and a plurality of paraelectric material films are alternately stacked with each other.

The gate spacer 112 may extend in the second horizontal direction DR2 and along a side wall of each of the first to fourth gate electrodes G1 to G4 and may be disposed on the topmost nanosheet of the plurality of upper nanosheets TNW and the field insulating layer 105. The gate spacer 112 may include, for example, at least one of silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC), and combinations thereof.

The capping pattern 113 may be disposed on each of the first to fourth gate electrodes G1 to G4. For example, the capping pattern 113 may surround a side wall of each of the first and second gate cuts GC1 and GC2. The capping pattern 113 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

The lower source/drain regions BSD1 to BSD5 may be respectively disposed on both sides of each of the first to fourth gate electrodes G1 to G4 and may be disposed on each of the first to sixth active patterns F1 to F6. The lower source/drain regions BSD1 to BSD5 may be disposed in the NMOS region.

For example, the first lower source/drain region BSD1 may be disposed on a first side of the first gate electrode G1 and may be disposed on each of the first to third active patterns F1 to F3. The second lower source/drain region BSD2 may be disposed on a first side of the second gate electrode G2 and may be disposed on each of the fourth to sixth active patterns F4 to F6. The second lower source/drain region BSD2 may be spaced apart from the first lower source/drain region BSD1 in the second horizontal direction DR2.

The third lower source/drain region BSD3 may be disposed on a second side of the first gate electrode G1 opposite to the first side of the first gate electrode G1 in the first horizontal direction DR1 and may be disposed on each of the first to third active patterns F1 to F3. That is, the third lower source/drain region BSD3 may be disposed between the first gate electrode G1 and the third gate electrode G3 and may be disposed on each of the first to third active patterns F1 to F3.

The fourth lower source/drain region BSD4 may be disposed on a second side of the second gate electrode G2 opposite to the first side of the second gate electrode G2 in the first horizontal direction DR1 and may be disposed on each of the fourth to sixth active patterns F4 to F6. That is, the fourth lower source/drain region BSD4 may be disposed between the second gate electrode G2 and the fourth gate electrode G4 and may be disposed on each of the fourth to sixth active patterns F4 to F6. The fourth lower source/drain region BSD4 may be spaced apart from the third lower source/drain region BSD3 in the second horizontal direction DR2.

Each of the third and fourth gate electrodes G3 and G4 may have a first side facing toward the second side of each of the first and second gate electrodes G1 and G2, and a second side opposite to the first side of each of the third and fourth gate electrodes G3 and G4 in the first horizontal direction DR1. The fifth lower source/drain region BSD5 may be disposed on the second side of the third gate electrode G3 and may be disposed on each of the first to third active patterns F1 to F3. Additionally, a sixth lower source/drain region may be disposed on the second side of the fourth gate electrode G4 and may be disposed on each of the fourth to sixth active patterns F4 to F6. The sixth lower source/drain region may be spaced apart from the fifth lower source/drain region BSD5 in the second horizontal direction DR2.

The upper source/drain regions TSD1 to TSD5 may be disposed on each of the first to sixth active patterns F1 to F6 and may be respectively disposed on both sides of each of the first to fourth gate electrodes G1 to G4. The upper source/drain regions TSD1 to TSD5 may be disposed on the lower source/drain regions BSD1 to BSD5. The upper source/drain regions TSD1 to TSD5 may be disposed in the PMOS region.

For example, the first upper source/drain region TSD1 may be disposed on the first lower source/drain region BSD1 and on the first side of the first gate electrode G1. The first upper source/drain region TSD1 may overlap each of the first to third active patterns F1 to F3 in the vertical direction DR3. The second upper source/drain region TSD2 may be disposed on the second lower source/drain region BSD2 and on the first side of the second gate electrode G2. The second upper source/drain region TSD2 may overlap each of the fourth to sixth active patterns F4 to F6 in the vertical direction DR3. The second upper source/drain region TSD2 may be spaced apart from the first upper source/drain region TSD1 in the second horizontal direction DR2.

The third upper source/drain region TSD3 may be disposed on the third lower source/drain region BSD3 and between the first gate electrode G1 and the third gate electrode G3. The third upper source/drain region TSD3 may overlap with each of the second and third active patterns F2 and F3 in the vertical direction DR3. The fourth upper source/drain region TSD4 may be disposed on the fourth lower source/drain region BSD4 and between the second gate electrode G2 and the fourth gate electrode G4. The fourth upper source/drain region TSD4 may overlap each of the fourth and fifth active patterns F4 and F5 in the vertical direction DR3. The fourth upper source/drain region TSD4 may be spaced apart from the third upper source/drain region TSD3 in the second horizontal direction DR2.

The fifth upper source/drain region TSD5 may be disposed on the fifth lower source/drain region BSD5 and on the second side of the third gate electrode G3. The fifth upper source/drain region TSD5 may overlap each of the first to third active patterns F1 to F3 in the vertical direction DR3. Additionally, the sixth upper source/drain region may be disposed on the sixth lower source/drain region and on the second side of the fourth gate electrode G4. The sixth upper source/drain region may overlap each of the fourth to sixth active patterns F4 to F6 in the vertical direction DR3. The sixth upper source/drain region may be spaced apart from the fifth upper source/drain region TSD5 in the second horizontal direction DR2.

Between the first gate electrode G1 and the third gate electrode G3, the third upper source/drain region TSD3 may not be disposed on the first active pattern F1. Further, between the second gate electrode G2 and the fourth gate electrode G4, the fourth upper source/drain region TSD4 may not be disposed on the sixth active pattern F6.

A length in the second horizontal direction DR2 from a side wall of the third lower source/drain region BSD3 disposed on the first active pattern F1 to a side wall of the fourth lower source/drain region BSD4 disposed on the sixth active pattern F6 may be referred to as a first length L1. Further, a length in the second horizontal direction DR2 from a side wall of the third upper source/drain region TSD3 disposed on the second active pattern F2 to a side wall of the fourth upper source/drain region TSD4 disposed on the fifth active pattern F5 may be referred to as a second length L2.

Between the first and second gate electrodes G1 and G2 and the third and fourth gate electrodes G3 and G4, the first length L1 in the second horizontal direction DR2 of the lower source/drain regions may be greater than the second length L2 in the second horizontal direction DR2 of the upper source/drain regions. Further, between the first and second gate electrodes G1 and G2 and the third and fourth gate electrodes G3 and G4, the first length L1 in the second horizontal direction DR2 of the lower source/drain regions may be shorter than 3 times of the second length L2 in the second horizontal direction DR2 of the upper source/drain regions.

The second interlayer insulating layer 130 may be disposed between the lower source/drain regions BSD1 to BSD5 and the upper source/drain regions TSD1 to TSD5. The lower source/drain regions BSD1 to BSD5 and the upper source/drain regions TSD1 to TSD5 may be insulated from each other.

The first interlayer insulating layer 120 may be disposed on the field insulating layer 105. The first interlayer insulating layer 120 may surround a side wall of each of the lower source/drain regions BSD1 to BSD5. For example, a top face of the first interlayer insulating layer 120 may be coplanar with top faces of the lower source/drain regions BSD1 to BSD5. However, embodiments are not limited thereto.

The first interlayer insulating layer 120 may include, for example, at least one of silicon oxide, silicon nitride, silicon oxynitride, and a low dielectric constant material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilil phosphate (TMSP), polytetrafluoroethylene (PTFE), Tonen SilaZen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or combinations thereof. However, embodiments are not limited thereto.

The second interlayer insulating layer 130 may be disposed on the first interlayer insulating layer 120. The second interlayer insulating layer 130 may surround each of the upper source/drain regions TSD1 to TSD5. The second interlayer insulating layer 130 may be disposed between the lower source/drain regions BSD1 to BSD5 and the upper source/drain regions TSD1 to TSD5. The second interlayer insulating layer 130 may include, for example, at least one of silicon oxide, silicon nitride, silicon oxynitride, and a low dielectric constant material.

The etching stop layer 140 may be disposed on the second interlayer insulating layer 130. Although the etching stop layer 140 is shown to be embodied as a single film in FIG. 3 to FIG. 9, embodiments are not limited thereto. In some embodiments, the etching stop layer 140 may be embodied as a multilayer. The etching stop layer 140 may include, for example, at least one of silicon oxide, silicon nitride, silicon oxynitride, and a low dielectric constant material.

The third interlayer insulating layer 150 may be disposed on the etching stop layer 140. The fourth interlayer insulating layer 160 may be disposed on the third interlayer insulating layer 150. The fifth interlayer insulating layer 170 may be disposed on the fourth interlayer insulating layer 160. Each of the third to fifth interlayer insulating layers 150, 160, and 170 may include, for example, at least one of silicon oxide, silicon nitride, silicon oxynitride, and a low dielectric constant material.

The first line pattern 180 may be disposed inside the fourth interlayer insulating layer 160. The second line pattern 190 may be disposed inside the fifth interlayer insulating layer 170. Each of the first and second line patterns 180 and 190 may include a conductive material.

The first gate contact CB1 may be disposed on the first gate electrode G1. The first gate contact CB1 may extend through the capping pattern 113 in the vertical direction DR3, and thus may be electrically connected to the first gate electrode G1. The second gate contact CB2 may be disposed on the second gate electrode G2. The second gate contact CB2 may extend through the capping pattern 113 in the vertical direction DR3, and thus may be electrically connected to the second gate electrode G2. The third gate contact CB3 may be disposed on the third gate electrode G3. The third gate contact CB3 may extend through the capping pattern 113 in the vertical direction DR3, and thus may be electrically connected to the third gate electrode G3. The fourth gate contact CB4 may be disposed on the fourth gate electrode G4. The fourth gate contact CB4 may extend through the capping pattern 113 in the vertical direction DR3, and thus may be electrically connected to the fourth gate electrode G4.

The first buried contact BC1 may be disposed on the first side of each of the first and second gate electrodes G1 and G2. The first buried contact BC1 may be disposed between the third active pattern F3 and the fourth active pattern F4. The first buried contact BC1 may protrude, in an opposite direction to the first horizontal direction DR1, beyond a distal end of each of the third active pattern F3 and the fourth active pattern F4.

The first buried contact BC1 may be disposed between the first lower source/drain region BSD1 and the second lower source/drain region BSD2. The first buried contact BC1 may be electrically connected to each of the first lower source/drain region BSD1 and the second lower source/drain region BSD2. The first buried contact BC1 may include a conductive material. At least a portion of the first buried contact BC1 may not overlap with each of the first lower source/drain region BSD1 and the second lower source/drain region BSD2 in the second horizontal direction DR2.

The second buried contact BC2 may be disposed on the second side of each of the third and fourth gate electrodes G3 and G4. The second buried contact BC2 may be disposed between the third active pattern F3 and the fourth active pattern F4. The second buried contact BC2 may protrude, in the first horizontal direction DR1, beyond a distal end of each of the third active pattern F3 and the fourth active pattern F4.

The second buried contact BC2 may be disposed between the fifth lower source/drain region BSD5 and the sixth lower source/drain region. The second buried contact BC2 may be electrically connected to each of the fifth lower source/drain region BSD5 and the sixth lower source/drain region. The second buried contact BC2 may include a conductive material. At least a portion of the second buried contact BC2 may not overlap with each of the fifth lower source/drain region BSD5 and the sixth lower source/drain region in the second horizontal direction DR2.

Each of the first and second buried contacts BC1 and BC2 may extend through the first interlayer insulating layer 120 and the field insulating layer 105 in the vertical direction DR3 and then extend into an inside of the substrate 100. That is, a bottom face of each of the first and second buried contacts BC1 and BC2 may be formed inside the substrate 100. However, embodiments are not limited thereto. In some embodiments, each of the first and second buried contacts BC1 and BC2 may extend through the first interlayer insulating layer 120 in the vertical direction DR3 and then extend into the field insulating layer 105. That is, the bottom face of each of the first and second buried contacts BC1 and BC2 may be formed inside the field insulating layer 105.

A top face of each of the first and second buried contacts BC1 and BC2 may be coplanar with top faces of the lower source/drain regions BSD1 to BSD5. However, embodiments are not limited thereto. In some embodiments, a vertical level of the top face of each of the first and second buried contacts BC1 and BC2 may be lower than that of the top face of each of the lower source/drain regions BSD1 to BSD5.

The first lower source/drain contact BCA1 may be disposed on the first active pattern F1 and between the first gate electrode G1 and the third gate electrode G3. The first lower source/drain contact BCA1 may extend through the second interlayer insulating layer 130 in the vertical direction DR3, and thus may be electrically connected to the third lower source/drain region BSD3. The first lower source/drain contact BCA1 may be spaced apart from the third upper source/drain region TSD3.

The second lower source/drain contact BCA2 may be disposed on the sixth active pattern F6 and between the second gate electrode G2 and the fourth gate electrode G4. The second lower source/drain contact BCA2 may extend through the second interlayer insulating layer 130 in the vertical direction DR3, and thus may be electrically connected to the fourth lower source/drain region BSD4. The second lower source/drain contact BCA2 may be spaced apart from the fourth upper source/drain region TSD4. Each of the first and second lower source/drain contacts BCA1 and BCA2 may include a conductive material.

The first upper source/drain contact TCA1 may be disposed on the first side of each of the first and second gate electrodes G1 and G2 and on the third and fourth active patterns F3 and F4. The first upper source/drain contact TCA1 may extend in the second horizontal direction DR2. The first upper source/drain contact TCA1 may extend through a portion of the second interlayer insulating layer 130 in the vertical direction DR3, and thus may be electrically connected to each of the first upper source/drain region TSD1 and the second upper source/drain region TSD2.

The second upper source/drain contact TCA2 may be disposed between the first and second gate electrodes G1 and G2 and the third and fourth gate electrodes G3 and G4, and on the third and fourth active patterns F3 and F4. The second upper source/drain contact TCA2 may extend in the second horizontal direction DR2. The second upper source/drain contact TCA2 may extend through a portion of the second interlayer insulating layer 130 in the vertical direction DR3, and thus may be electrically connected to each of the third upper source/drain region TSD3 and the fourth upper source/drain region TSD4.

The third upper source/drain contact TCA3 may be disposed on the second side of each of the third and fourth gate electrodes G3 and G4, and on the third and fourth active patterns F3 and F4. The third upper source/drain contact TCA3 may extend in the second horizontal direction DR2. The third upper source/drain contact TCA3 may extend through a portion of the second interlayer insulating layer 130 in the vertical direction DR3, and thus may be electrically connected to each of the fifth upper source/drain region TSD5 and the sixth upper source/drain region. Each of the first to third upper source/drain contacts TCA1 to TCA3 may include a conductive material.

The first via V1 may be disposed on the first gate contact CB1. The first via V1 may extend through the third interlayer insulating layer 150 and the etching stop layer 140 in the vertical direction DR3, thereby electrically connecting the first gate contact CB1 and the first line pattern 180 to each other. The second via V2 may be disposed on the second gate contact CB2. The second via V2 may extend through the third interlayer insulating layer 150 and the etching stop layer 140 in the vertical direction DR3, thereby electrically connecting the second gate contact CB2 and the first line pattern 180 to each other. The third via V3 may be disposed on the third gate contact CB3. The third via V3 may extend through the third interlayer insulating layer 150 and the etching stop layer 140 in the vertical direction DR3, thereby electrically connecting the third gate contact CB3 and the first line pattern 180 to each other. The fourth via V4 may be disposed on the fourth gate contact CB4. The fourth via V4 may extend through the third interlayer insulating layer 150 and the etching stop layer 140 in the vertical direction DR3, thereby electrically connecting the fourth gate contact CB4 and the first line pattern 180 to each other.

The fifth via V5 may be disposed on the first lower source/drain contact BCA1. The fifth via V5 may extend through the third interlayer insulating layer 150 and the etching stop layer 140 in the vertical direction DR3, thereby electrically connecting the first lower source/drain contact BCA1 and the first line pattern 180 to each other. The sixth via V6 may be disposed on the second lower source/drain contact BCA2. The sixth via V6 may extend through the third interlayer insulating layer 150 and the etching stop layer 140 in the vertical direction DR3, thereby electrically connecting the second lower source/drain contact BCA2 and the first line pattern 180 to each other.

The seventh via V7 may be disposed on the first buried contact BC1. The seventh via V7 may be disposed on a portion of the first buried contact BC1 protruding, in the opposite direction to the first horizontal direction DR1, beyond the distal end of each of the third active pattern F3 and the fourth active pattern F4. The seventh via V7 may extend through the fourth interlayer insulating layer 160, the third interlayer insulating layer 150, the etching stop layer 140 and the second interlayer insulating layer 130 in the vertical direction DR3, thereby electrically connecting the first buried contact BC1 and the second line pattern 190 to each other.

The eighth via V8 may be disposed on the second buried contact BC2. The eighth via V8 may be disposed on a portion of the second buried contact BC2 protruding, in the first horizontal direction DR1, beyond the distal end of each of the third active pattern F3 and the fourth active pattern F4. The eighth via V8 may extend through the fourth interlayer insulating layer 160, the third interlayer insulating layer 150, the etching stop layer 140 and the second interlayer insulating layer 130 in the vertical direction DR3, thereby electrically connecting the second buried contact BC2 and the second line pattern 190 to each other. The first buried contact BC1 and the second buried contact BC2 may be electrically connected to each other via the second line pattern 190.

The ninth via V9 may be disposed on the first upper source/drain contact TCA1. The ninth via V9 may extend through the third interlayer insulating layer 150 and the etching stop layer 140 in the vertical direction DR3, thereby electrically connecting the first upper source/drain contact TCA1 and the first line pattern 180 to each other. The tenth via V10 may be disposed on the second upper source/drain contact TCA2. The tenth via V10 may extend through the third interlayer insulating layer 150 and the etching stop layer 140 in the vertical direction DR3, thereby electrically connecting the second upper source/drain contact TCA2 and the first line pattern 180 to each other. The eleventh via V11 may be disposed on the third upper source/drain contact TCA3. The eleventh via V11 may extend through the third interlayer insulating layer 150 and the etching stop layer 140 in the vertical direction DR3, thereby electrically connecting the third upper source/drain contact TCA3 and the first line pattern 180 to each other.

In a structure in which the lower source/drain region and the upper source/drain region are stacked in the vertical direction in the semiconductor device according to some embodiments, the length of the upper source/drain region is shorter than the length of the lower source/drain region, thereby improving the integration of the semiconductor device.

Further, in the structure in which the lower source/drain region and the upper source/drain region are stacked in the vertical direction in the semiconductor device according to some embodiments, the buried contact electrically connected to the lower source/drain region is disposed below the upper source/drain region such that the integration of the semiconductor device may be improved.

Hereinafter, a semiconductor device according to some further embodiments will be described with reference to FIG. 1, and FIG. 10 to FIG. 16. Following descriptions will be based on differences from those of the semiconductor device shown in FIG. 1 to FIG. 9.

Figure 10:
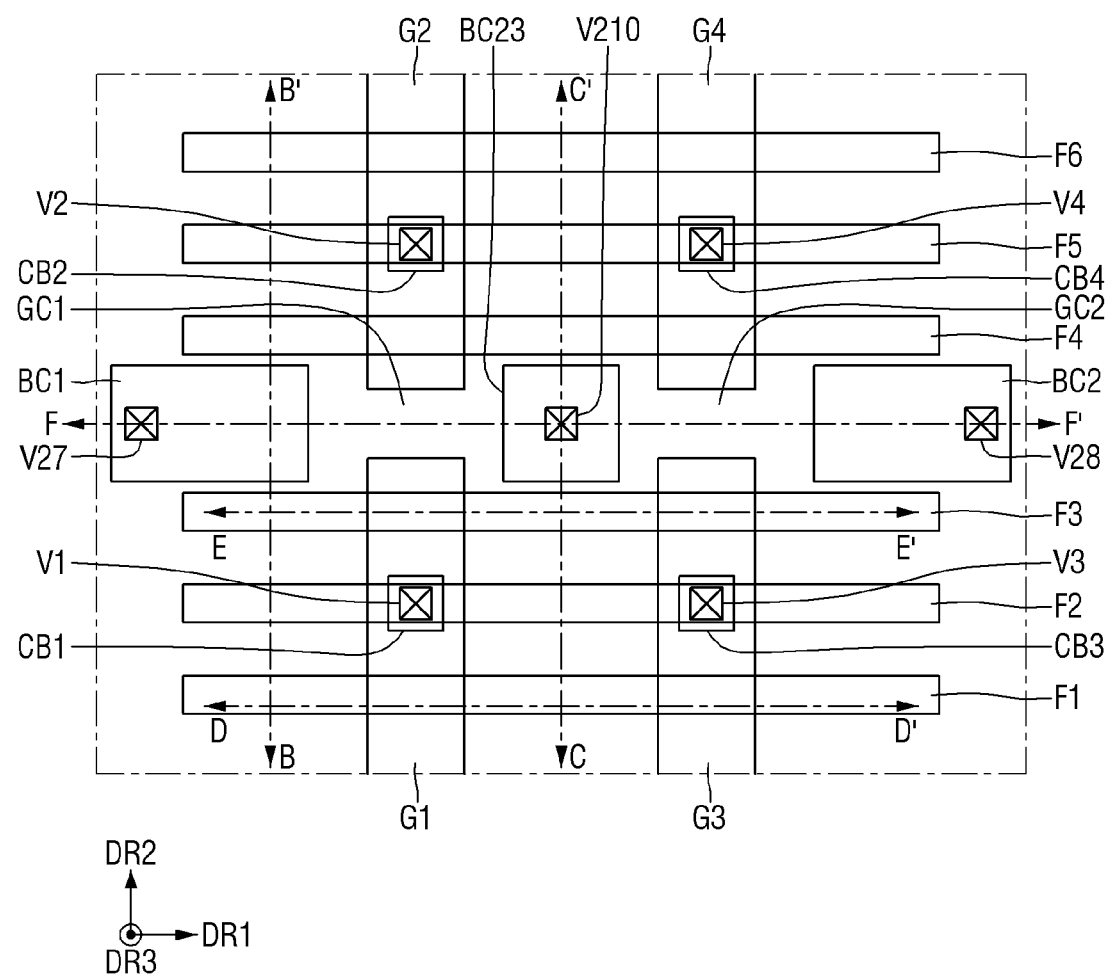
FIG. 10 is a layout diagram for illustrating a contact connected to a lower source/drain region in a semiconductor device according to some further embodiments.
Figure 11:
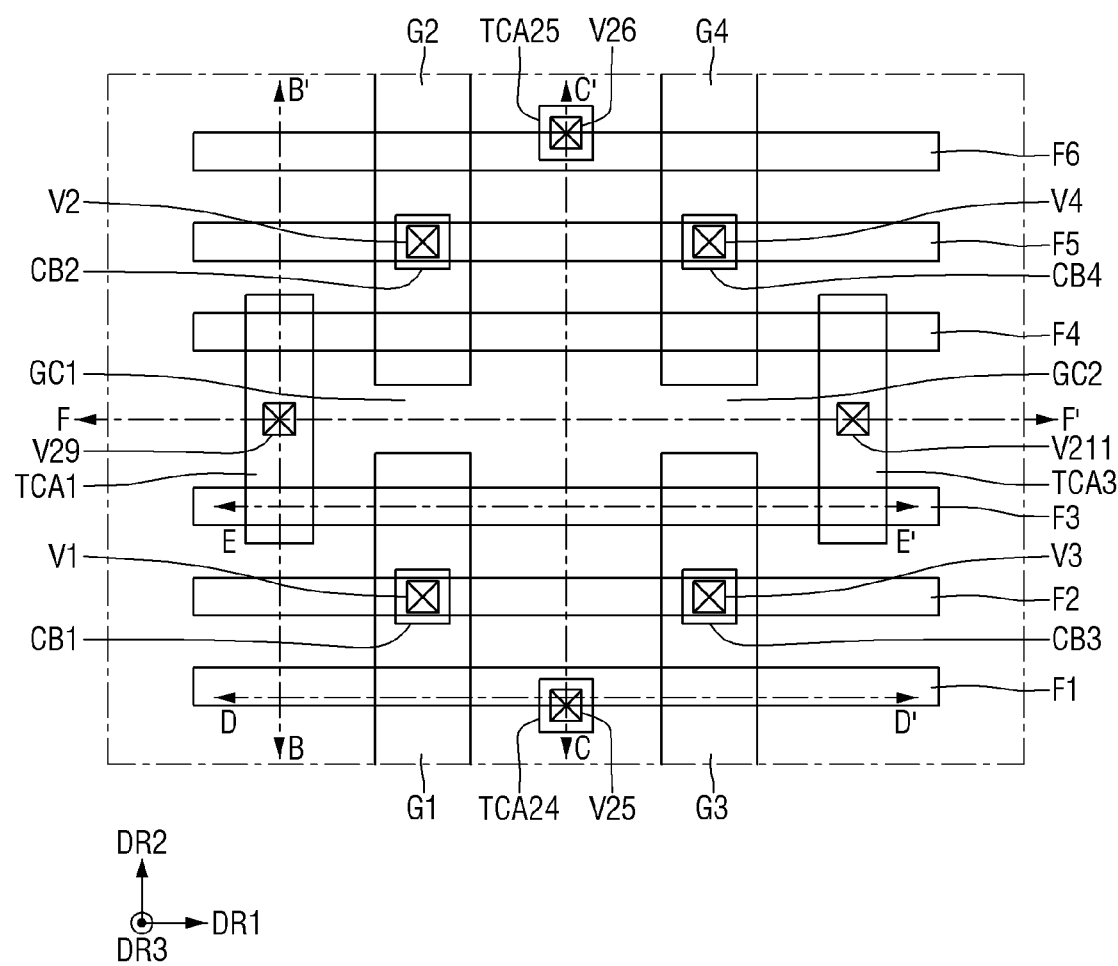
FIG. 11 is a layout diagram for illustrating a contact connected to an upper source/drain region in a semiconductor device according to some further embodiments.
Figure 12:
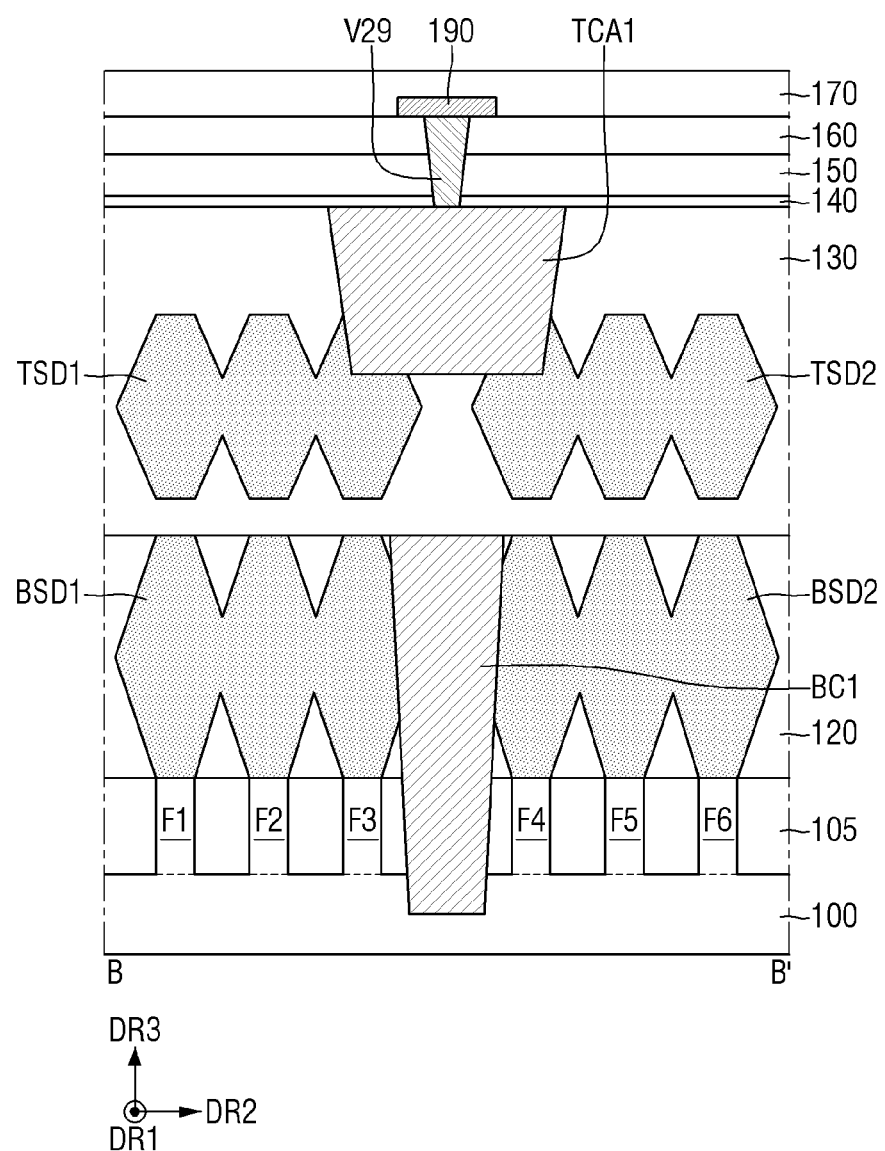
FIG. 12 is a cross-sectional view taken along a line B-B' in each of FIG. 10 and FIG. 11.
Figure 13:
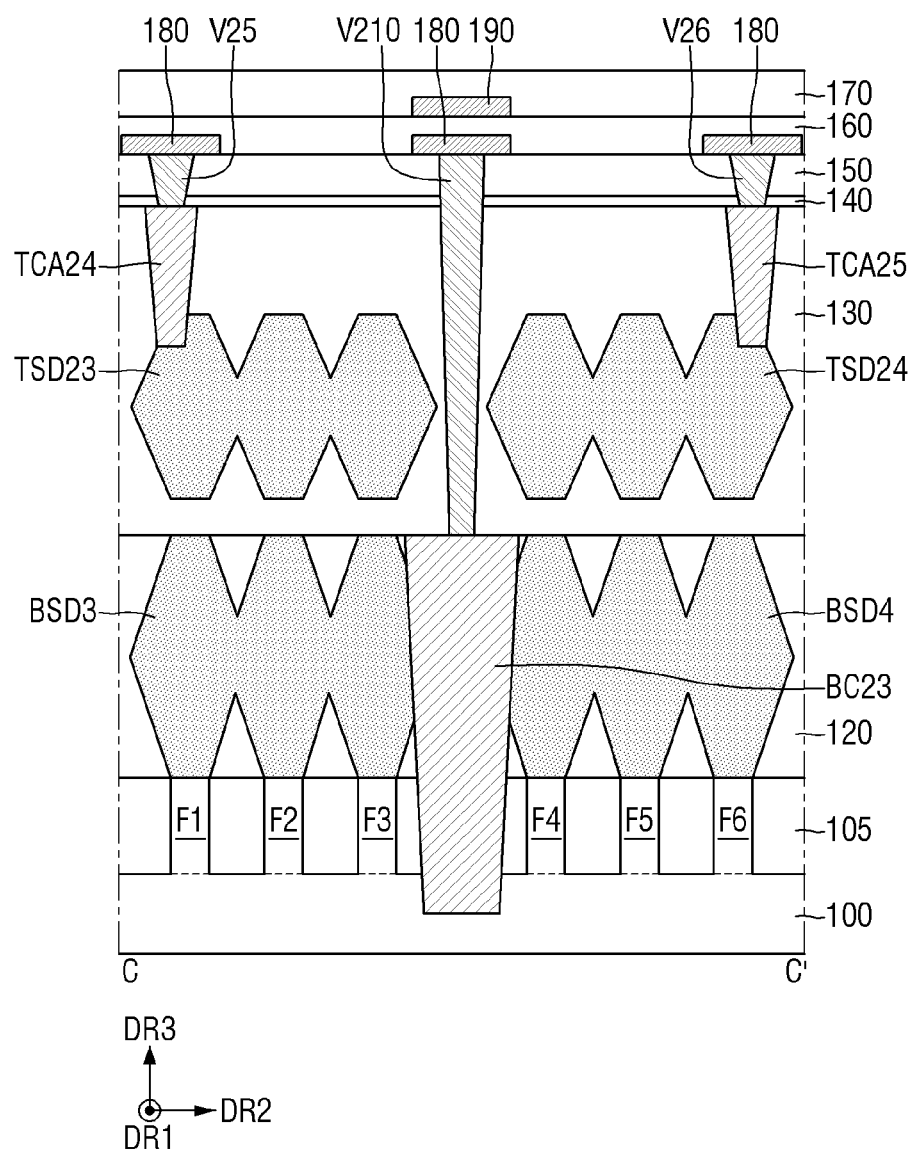
FIG. 13 is a cross-sectional view taken along a line C-C' in each of FIG. 10 and FIG. 11.
Figure 14:
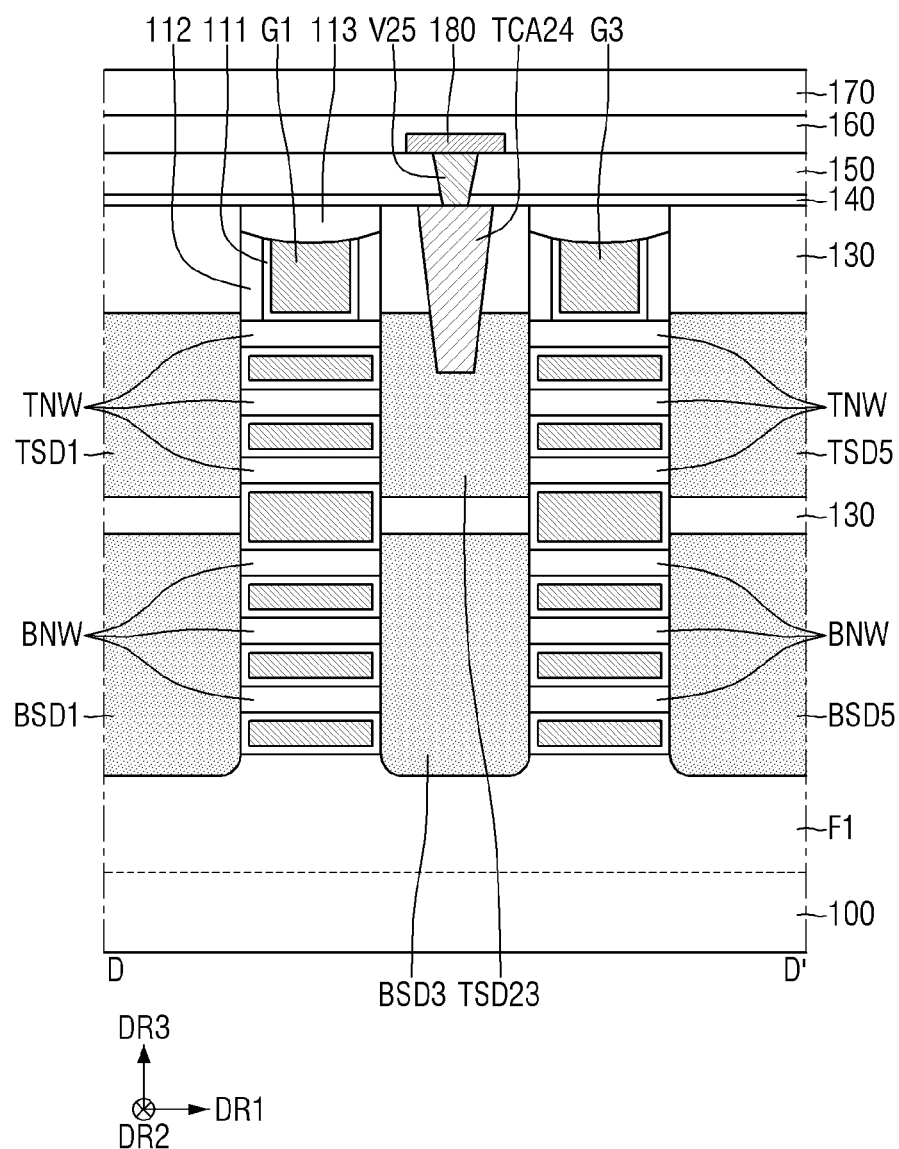
FIG. 14 is a cross-sectional view taken along a line D-D' in each of FIG. 10 and FIG. 11.
Figure 15:
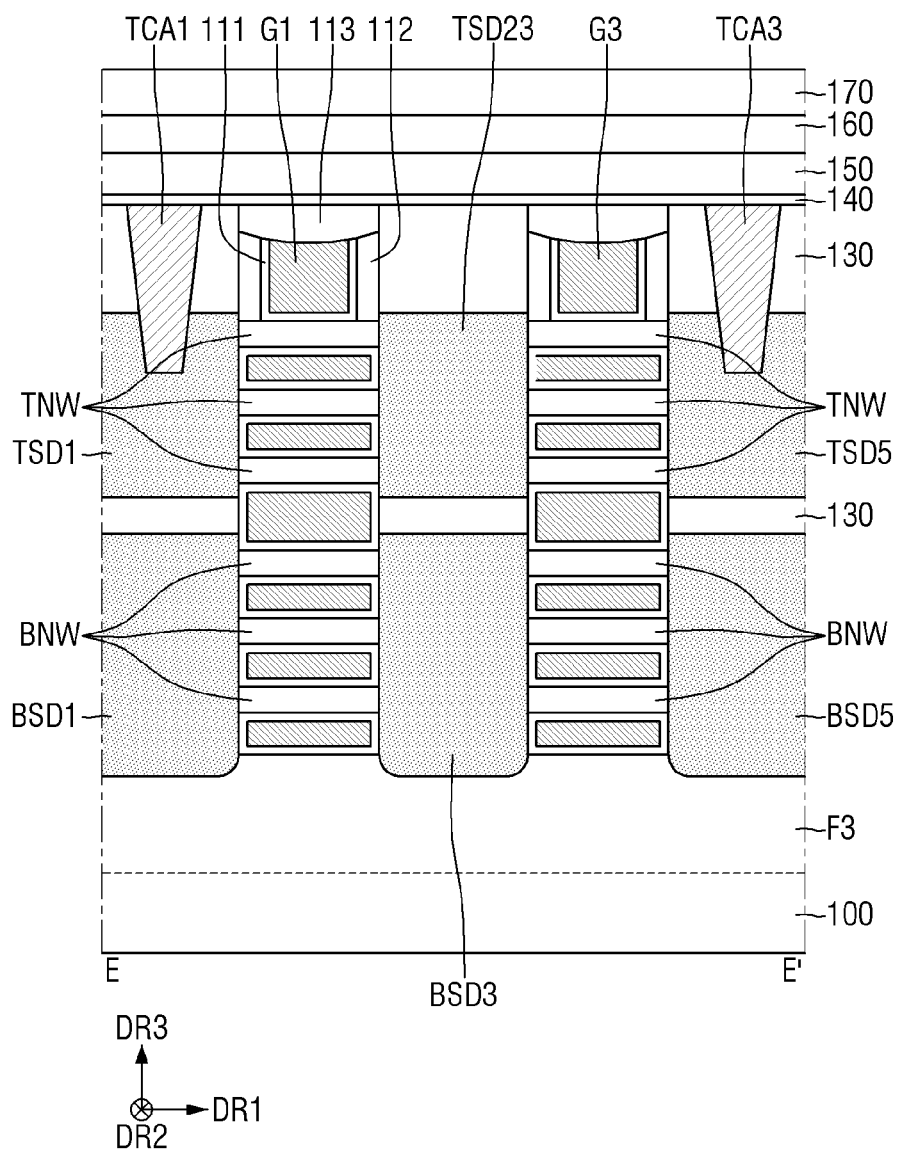
FIG. 15 is a cross-sectional view taken along a line E-E' in each of FIG. 10 and FIG. 11.
Figure 16:
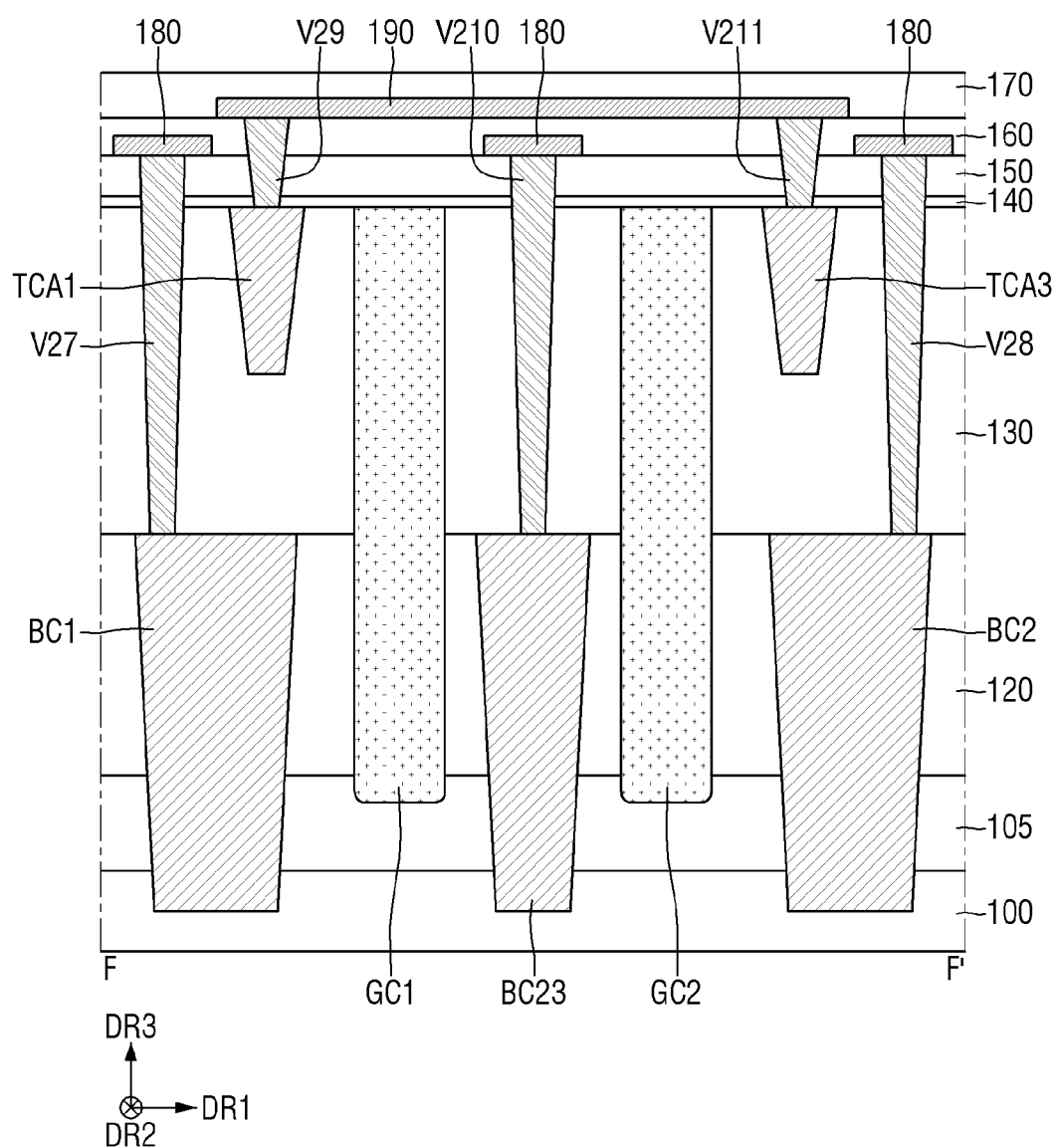
FIG. 16 is a cross-sectional view taken along a line F-F' in each of FIG. 10 and FIG. 11.

FIG. 10 is a layout diagram for illustrating a contact connected to a lower source/drain region in a semiconductor device according to some further embodiments. FIG. 11 is a layout diagram for illustrating a contact connected to an upper source/drain region in a semiconductor device according to some further embodiments. FIG. 12 is a cross-sectional view taken along a line B-B' in each of FIG. 10 and FIG. 11. FIG. 13 is a cross-sectional view taken along a line C-C' in each of FIG. 10 and FIG. 11. FIG. 14 is a cross-sectional view taken along a line D-D' in each of FIG. 10 and FIG. 11. FIG. 15 is a cross-sectional view taken along a line E-E' in each of FIG. 10 and FIG. 11. FIG. 16 is a cross-sectional view taken along a line F-F' in each of FIG. 10 and FIG. 11.

Referring to FIG. 1, FIG. 10 to FIG. 16, in the semiconductor device according to some further embodiments, an area in which the plurality of lower nanosheets BNW is disposed may be referred to as a PMOS region, while an area in which the plurality of upper nanosheets TNW are disposed may be referred to as an NMOS region.

The first transistor TR1 may include the plurality of lower nanosheets BNW and the second gate electrode G2. The second transistor TR2 may include the plurality of lower nanosheets BNW and the first gate electrode G1. The third transistor TR3 may include the plurality of lower nanosheets BNW and the fourth gate electrode G4. The fourth transistor TR4 may include the plurality of lower nanosheets BNW and the third gate electrode G3.

Further, the fifth transistor TR5 may include the plurality of upper nanosheets TNW and the second gate electrode G2. The sixth transistor TR6 may include the plurality of upper nanosheets TNW and the fourth gate electrode G4. The seventh transistor TR7 may include the plurality of upper nanosheets TNW and the first gate electrode G1. The eighth transistor TR8 may include the plurality of upper nanosheets TNW and the third gate electrode G3.

A third upper source/drain region TSD23 may be disposed on a third lower source/drain region BSD3 and between the first gate electrode G1 and the third gate electrode G3. The third upper source/drain region TSD23 may overlap with each of the first to third active patterns F1, F2, and F3 in the vertical direction DR3. A fourth upper source/drain region TSD24 may be disposed on a fourth lower source/drain region BSD4 and between the second gate electrode G2 and the fourth gate electrode G4. The fourth upper source/drain region TSD24 may overlap each of the fourth to sixth active patterns F4, F5, and F6 in the vertical direction DR3.

The third upper source/drain region TSD23 may be disposed on the first active pattern F1 and between the first gate electrode G1 and the third gate electrode G3. Further, the fourth upper source/drain region TSD24 may be disposed on the sixth active pattern F6 and between the second gate electrode G2 and the fourth gate electrode G4.

A third buried contact BC23 may be disposed between the first and second gate electrodes G1 and G2 and the third and fourth gate electrodes G3 and G4. The third buried contact BC23 may be disposed between the third active pattern F3 and the fourth active pattern F4. The third buried contact BC23 may extend through the first interlayer insulating layer 120 and the field insulating layer 105 in the vertical direction DR3, and may extend into an interior of the substrate 100. A top face of the third buried contact BC23 may be coplanar with a top face of each of the lower source/drain regions BSD1 to BSD5.

A fourth upper source/drain contact TCA24 may be disposed on the first active pattern F1 and between the first gate electrode G1 and the third gate electrode G3. The fourth upper source/drain contact TCA24 may extend through a portion of the second interlayer insulating layer 130 in the vertical direction DR3, and thus may be electrically connected to the third upper source/drain region TSD23.

A fifth upper source/drain contact TCA25 may be disposed on the sixth active pattern F6 and between the second gate electrode G2 and the fourth gate electrode G4. The fifth upper source/drain contact TCA25 may extend through a portion of the second interlayer insulating layer 130 in the vertical direction DR3, and thus may be electrically connected to the fourth upper source/drain region TSD24.

A fifth via V25 may be disposed on the fourth upper source/drain contact TCA24. The fifth via V25 may extend through the third interlayer insulating layer 150 and the etching stop layer 140 in the vertical direction DR3, thereby electrically connecting the fourth upper source/drain contact TCA24 and the first line pattern 180 to each other. A sixth via V26 may be disposed on the fifth upper source/drain contact TCA25. The sixth via V26 may extend through the third interlayer insulating layer 150 and the etching stop layer 140 in the vertical direction DR3, thereby electrically connecting the fifth upper source/drain contact TCA25 and the first line pattern 180 to each other.

A seventh via V27 may be disposed on the first buried contact BC1. The seventh via V27 may be disposed on a portion of the first buried contact BC1 protruding, in the opposite direction to the first horizontal direction DR1, beyond each of the distal ends of the third active pattern F3 and the fourth active pattern F4. The seventh via V27 may extend through the third interlayer insulating layer 150, the etching stop layer 140, and the second interlayer insulating layer 130 in the vertical direction DR3, thereby electrically connecting the first buried contact BC1 and the first line pattern 180 to each other.

An eighth via V28 may be disposed on the second buried contact BC2. The eighth via V28 may be disposed on a portion of the second buried contact BC2 protruding, in the first horizontal direction DR1, beyond each of the distal ends of the third active pattern F3 and the fourth active pattern F4. The eighth via V28 may extend through the third interlayer insulating layer 150, the etching stop layer 140 and the second interlayer insulating layer 130 in the vertical direction DR3, thereby making an electrical connection between the second buried contact BC2 and the first line pattern 180. A tenth via V210 may be disposed on the third buried contact BC23. The tenth via V210 may extend through the third interlayer insulating layer 150, the etching stop layer 140, and the second interlayer insulating layer 130 in the vertical direction DR3, thereby making an electrical connection between the third buried contact BC23 and the first line pattern 180.

A ninth via V29 may be disposed on the first upper source/drain contact TCA1. The ninth via V29 may extend through the fourth interlayer insulating layer 160, the third interlayer insulating layer 150, and the etching stop layer 140 in the vertical direction DR3, thereby electrically connecting the first upper source/drain contact TCA1 and the second line pattern 190 to each other. An eleventh via V211 may be disposed on the third upper source/drain contact TCA3. The eleventh via V211 may extend through the fourth interlayer insulating layer 160, the third interlayer insulating layer 150, and the etching stop layer 140 in the vertical direction DR3, thereby electrically connecting the third upper source/drain contact TCA3 and the second line pattern 190 to each other. The first upper source/drain contact TCA1 and the third upper source/drain contact TCA3 may be electrically connected to each other via the second line pattern 190.

Hereinafter, a semiconductor device according to still some further embodiments will be described with reference to FIG. 1, FIG. 17 to FIG. 25. Following descriptions will be based on differences from those of the semiconductor device shown in FIG. 1 to FIG. 9.

Figure 17:
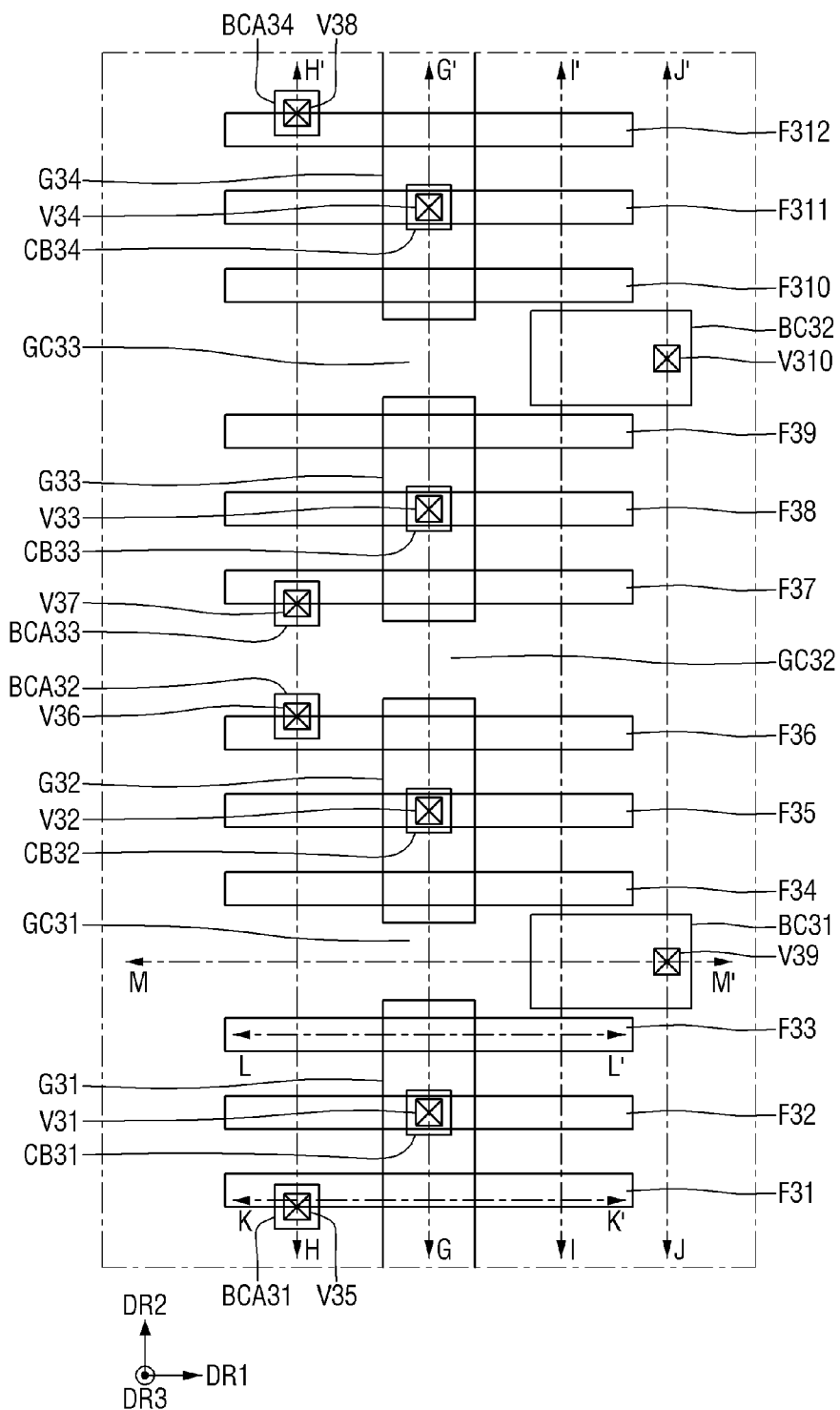
FIG. 17 is a layout diagram for illustrating a contact connected to a lower source/drain region in a semiconductor device according to still some further embodiments.
Figure 18:
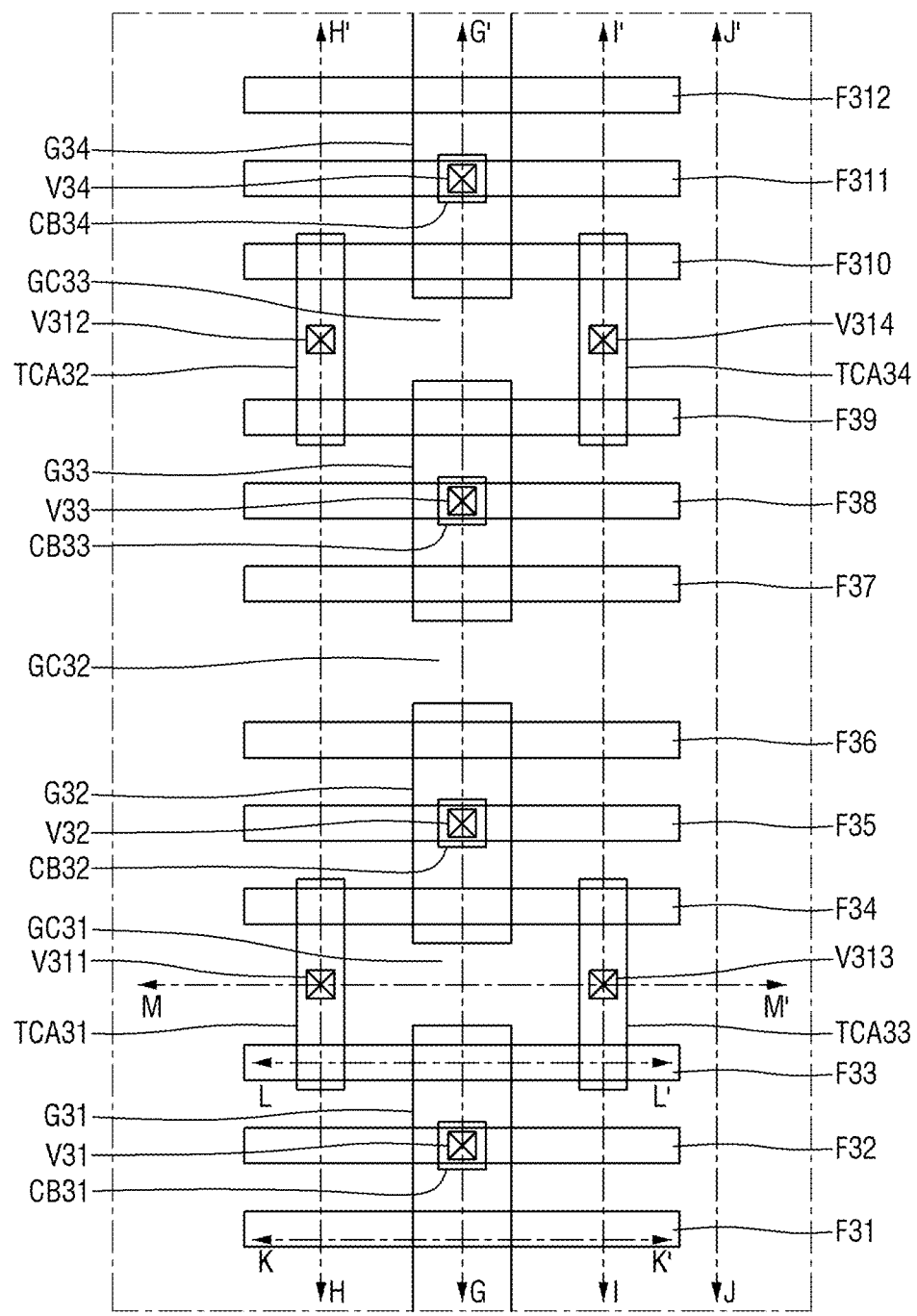
FIG. 18 is a layout diagram for illustrating a contact connected to an upper source/drain region in a semiconductor device according to still some further embodiments.
Figure 18:
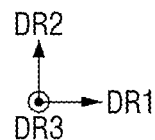
Figure 19:
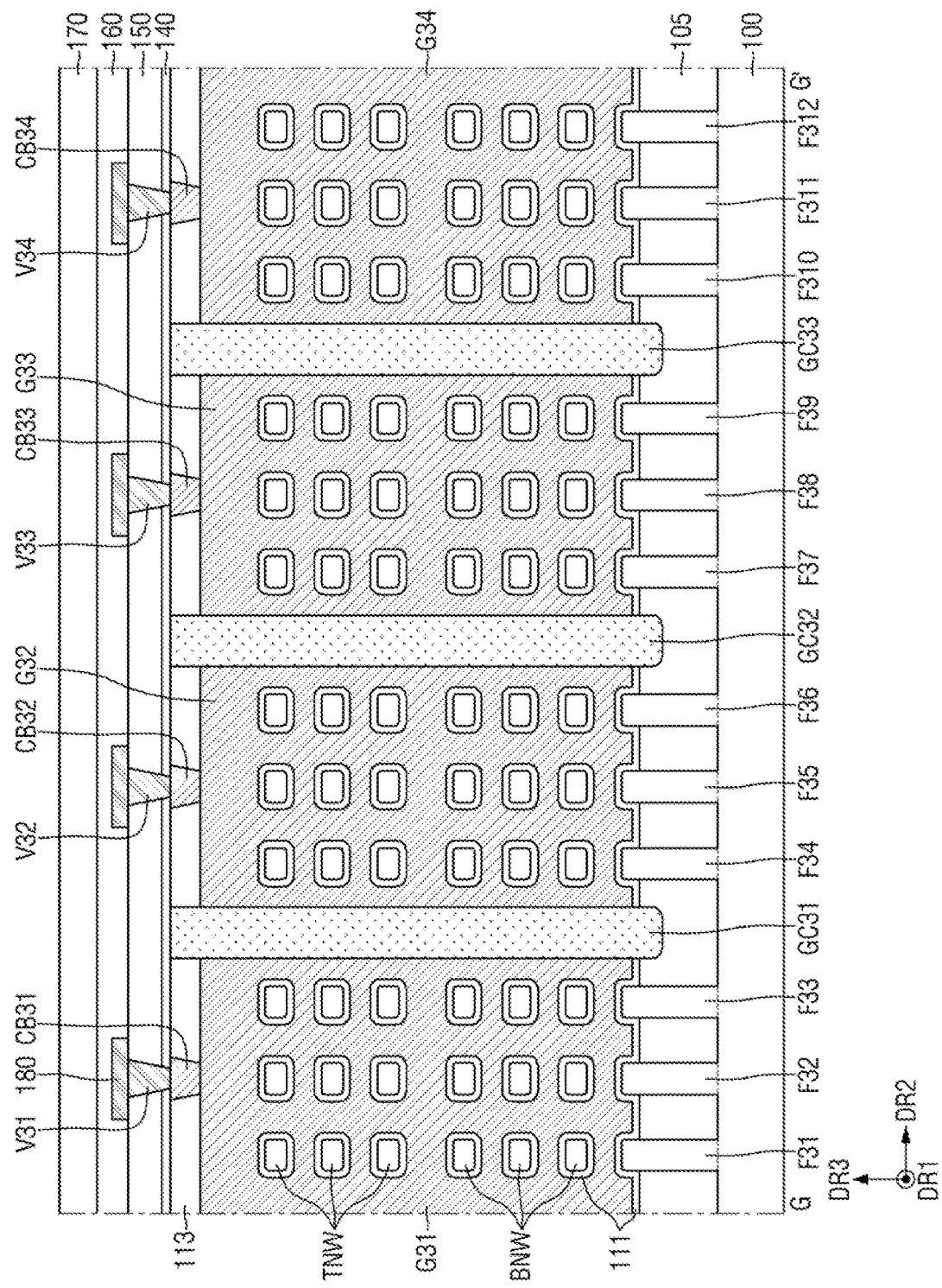
FIG. 19 is a cross-sectional view taken along a line G-G' in each of FIG. 17 and FIG. 18.
Figure 20:
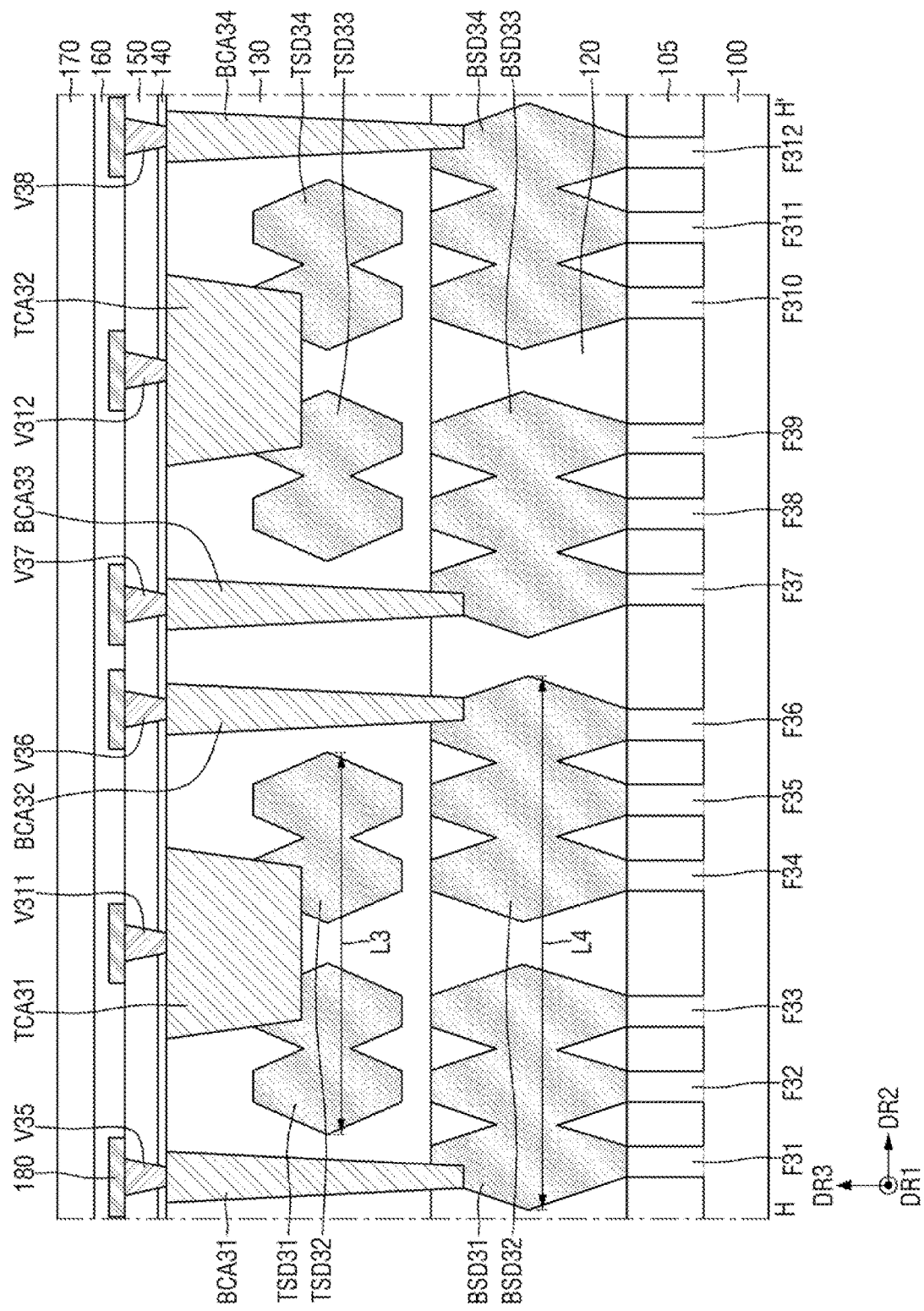
FIG. 20 is a cross-sectional view taken along a line H-H' in each of FIG. 17 and FIG. 18.
Figure 21:
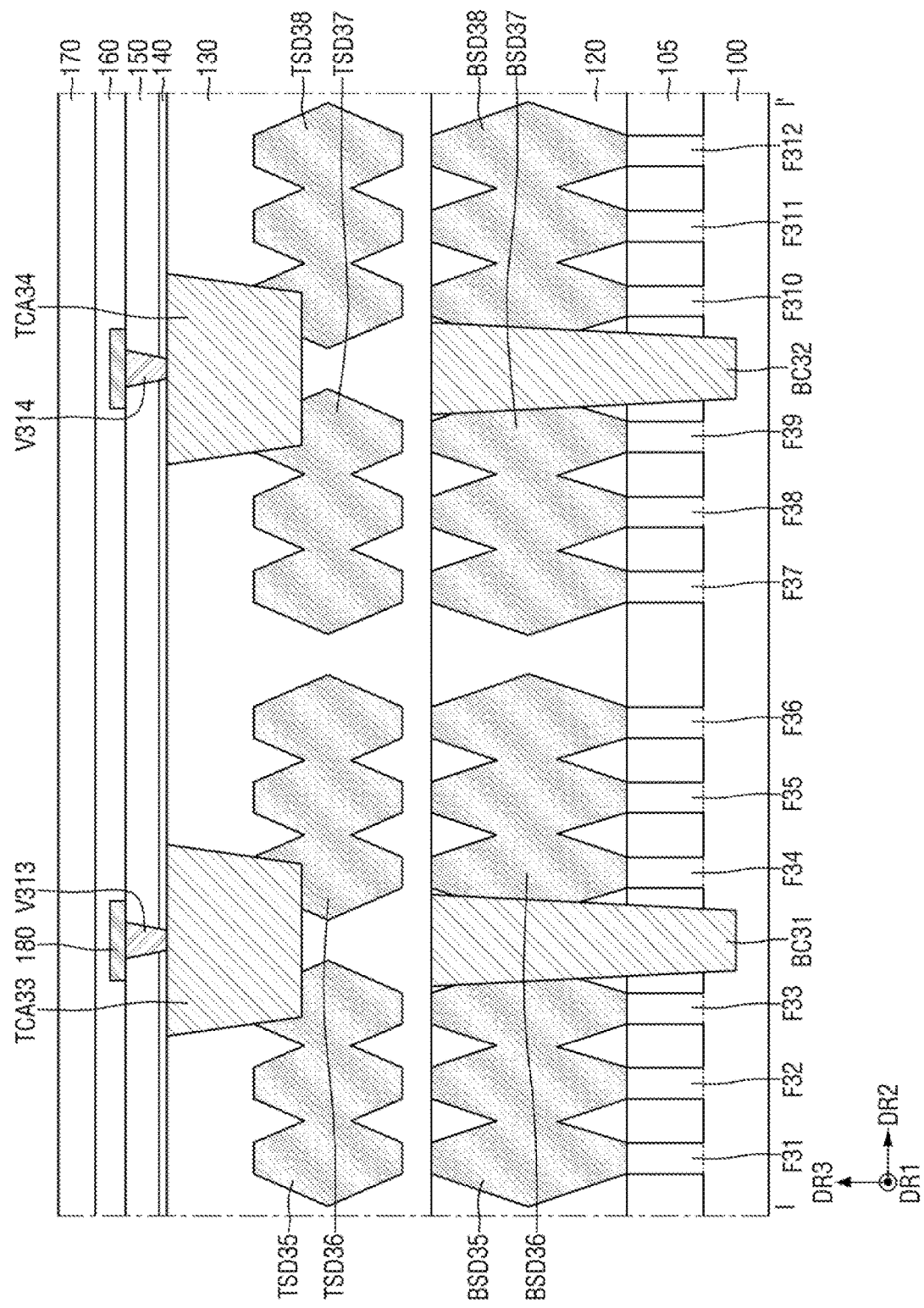
FIG. 21 is a cross-sectional view taken along a line I-I' in each of FIG. 17 and FIG. 18.
Figure 22:
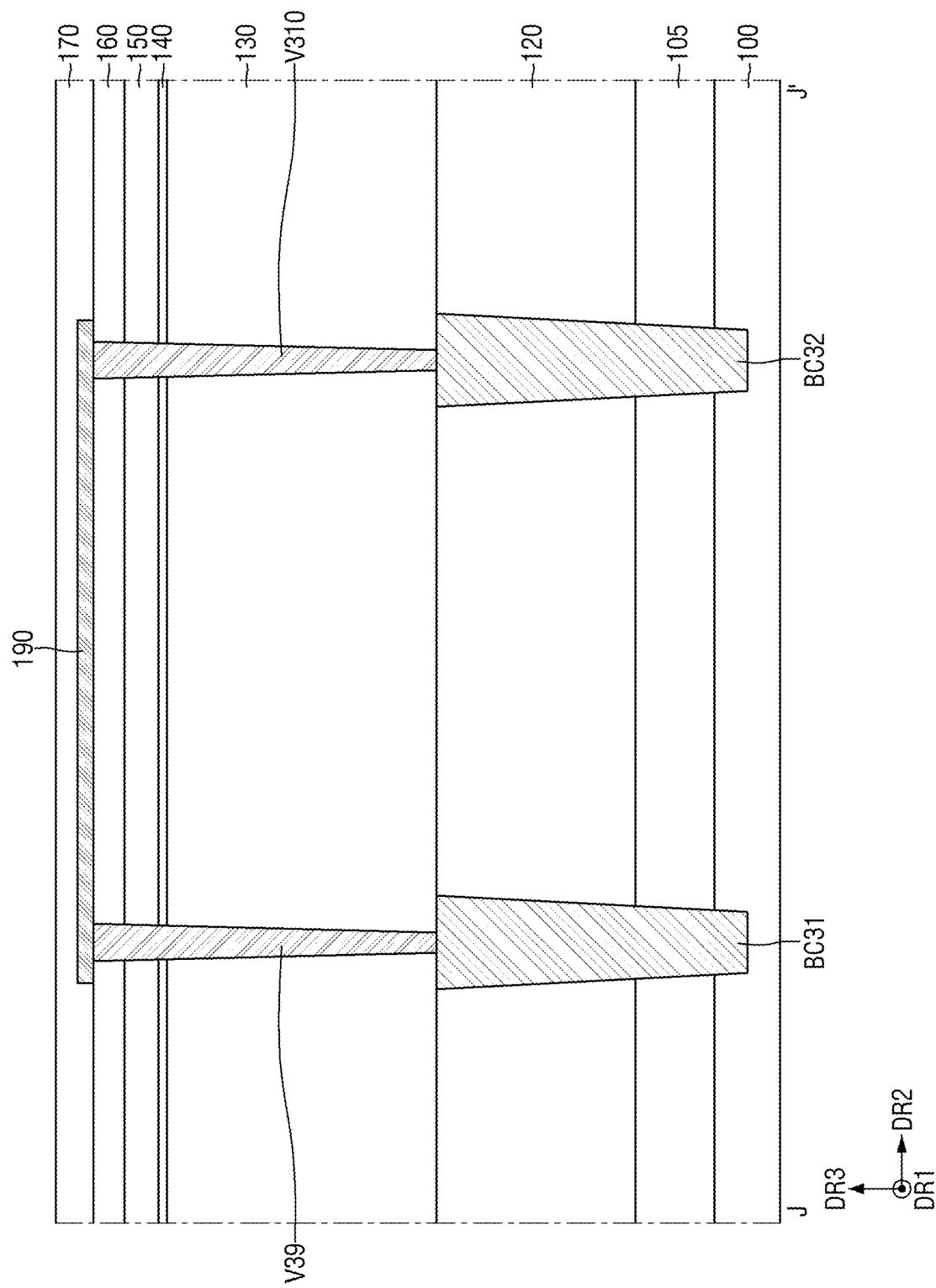
FIG. 22 is a cross-sectional view taken along a line J-J' in each of FIG. 17 and FIG. 18.
Figure 23:
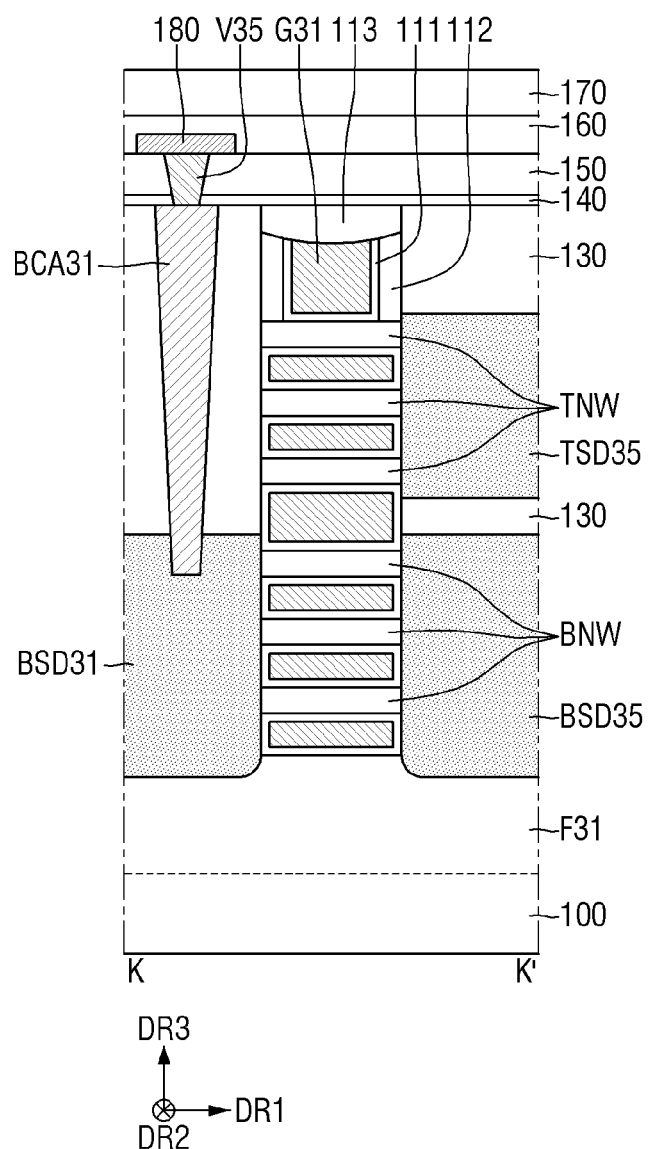
FIG. 23 is a cross-sectional view taken along a line K-K' in each of FIG. 17 and FIG. 18.
Figure 24:
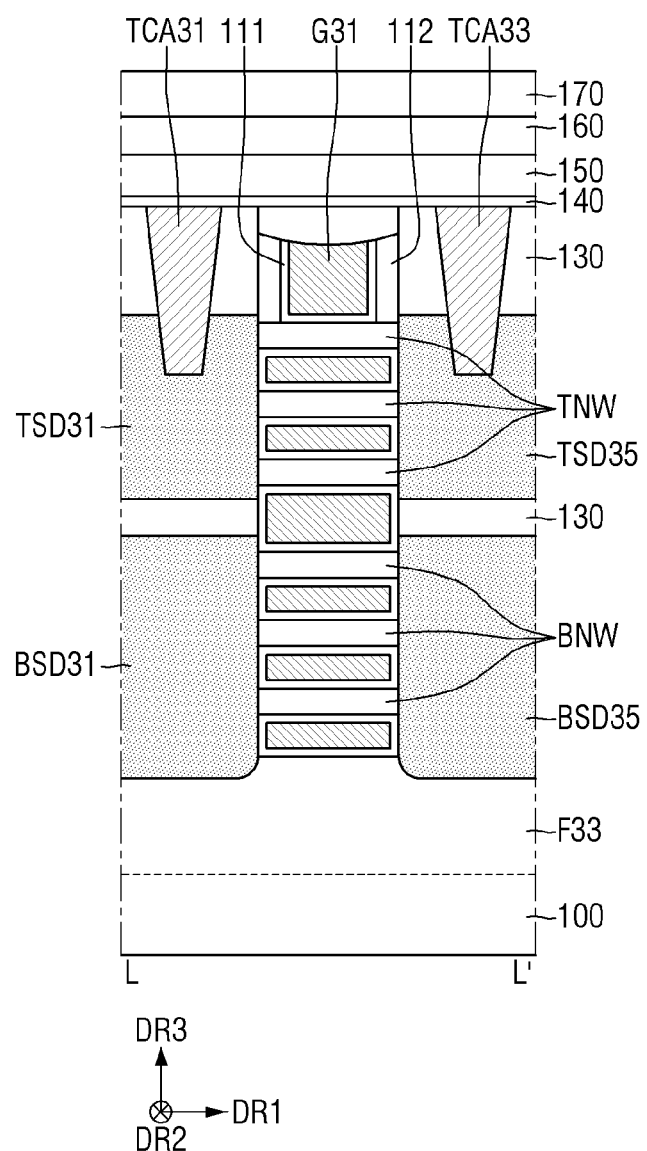
FIG. 24 is a cross-sectional view taken along a line L-L' in each of FIG. 17 and FIG. 18.
Figure 25:
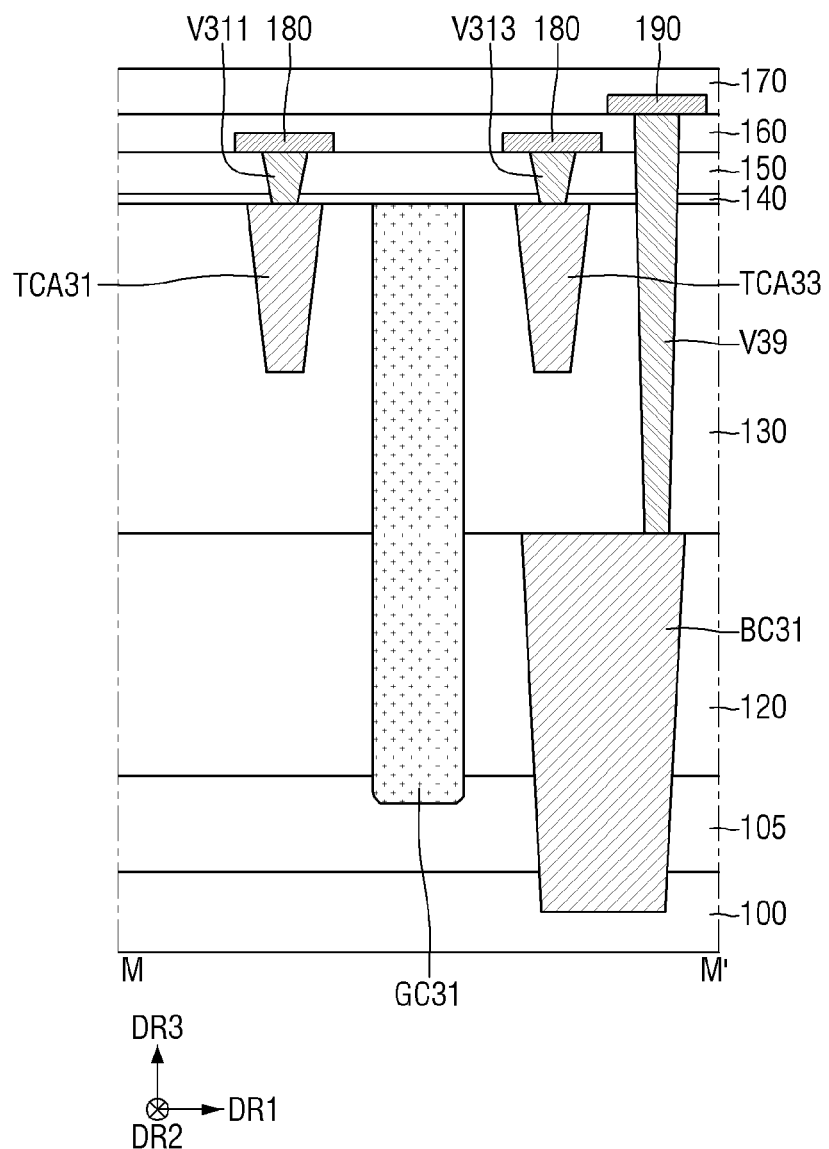
FIG. 25 is a cross-sectional view taken along a line M-M' in each of FIG. 17 and FIG. 18.

FIG. 17 is a layout diagram for illustrating a contact connected to a lower source/drain region in a semiconductor device according to still some further embodiments. FIG. 18 is a layout diagram for illustrating a contact connected to an upper source/drain region in a semiconductor device according to still some further embodiments. FIG. 19 is a cross-sectional view taken along a line G-G' in each of FIG. 17 and FIG. 18. FIG. 20 is a cross-sectional view taken along a line H-H' in each of FIG. 17 and FIG. 18. FIG. 21 is a cross-sectional view taken along a line I-I' in each of FIG. 17 and FIG. 18. FIG. 22 is a cross-sectional view taken along a line J-J' in each of FIG. 17 and FIG. 18. FIG. 23 is a cross-sectional view taken along a line K-K' in each of FIG. 17 and FIG. 18. FIG. 24 is a cross-sectional view taken along a line L-L' in each of FIG. 17 and FIG. 18. FIG. 25 is a cross-sectional view taken along a line M-M' in each of FIG. 17 and FIG. 18.

Referring to FIG. 1, FIG. 17 to FIG. 25, in the semiconductor device according to still some further embodiments, first to fourth gate electrodes G31 to G34 may be arranged in the second horizontal direction DR2.

Each of first to twelfth active patterns F31 to F312 may protrude from the substrate 100 in the vertical direction DR3. Each of the first to twelfth active patterns F31 to F312 may extend in the first horizontal direction DR1. The first to twelfth active patterns F31 to F312 may be sequentially provided and spaced apart from each other in the second horizontal direction DR2.

For example, the first to third active patterns F31, F32, and F33 may be spaced apart from each other by the same spacing. The fourth to sixth active patterns F34, F35, and F36 may be spaced apart from each other by the same spacing. The seventh to ninth active patterns F37, F38, and F39 may be spaced apart from each other by the same spacing. The tenth to the twelfth active patterns F310, F311, and F312 may be spaced apart from each other by the same spacing.

For example, each of the spacing between the third active pattern F33 and the fourth active pattern F34, the spacing between the sixth active pattern F36 and the seventh active pattern F37, and the spacing between the ninth active pattern F39 and the tenth active pattern F310 may be greater than the spacing between the second active pattern F32 and the third active pattern F33.

The first gate electrode G31 may extend in the second horizontal direction DR2 and may be disposed on the first to third active patterns F31, F32, and F33. The second gate electrode G32 may extend in the second horizontal direction DR2 and may be disposed on the fourth to sixth active patterns F34, F35, and F36. The third gate electrode G33 may extend in the second horizontal direction DR2 may be disposed on the seventh to ninth active patterns F37, F38, and F39. The fourth gate electrode G34 may extend in the second horizontal direction DR2 and may be disposed on the tenth to the twelfth active patterns F310, F311, and F312. The first to fourth gate electrodes G31 to G34 may be sequentially spaced provided and apart from each other in the second horizontal direction DR2.

The first transistor TR1 may include the plurality of upper nanosheets TNW and the fourth gate electrode G34. The second transistor TR2 may include the plurality of upper nanosheets TNW and the third gate electrode G33. The third transistor TR3 may include the plurality of upper nanosheets TNW and the second gate electrode G32. The fourth transistor TR4 may include the plurality of upper nanosheets TNW and the first gate electrode G31.

Further, the fifth transistor TR5 may include the plurality of lower nanosheets BNW and the fourth gate electrode G34. The sixth transistor TR6 may include the plurality of lower nanosheets BNW and the second gate electrode G32. The seventh transistor TR7 may include the plurality of lower nanosheets BNW and the third gate electrode G33. The eighth transistor TR8 may include the plurality of lower nanosheets BNW and the first gate electrode G31.

A first gate cut GC31 may be disposed between the first gate electrode G31 and the second gate electrode G32. A second gate cut GC32 may be disposed between the second gate electrode G32 and the third gate electrode G33. A third gate cut GC33 may be disposed between the third gate electrode G33 and the fourth gate electrode G34.

A first lower source/drain region BSD31 may be disposed on the first side of the first gate electrode G31 and on each of the first to third active patterns F31 to F33. A second lower source/drain region BSD32 may be disposed on the first side of the second gate electrode G32 and on each of the fourth to sixth active patterns F34 to F36. A third lower source/drain region BSD33 may be disposed on the first side of the third gate electrode G33 and on each of the seventh to ninth active patterns F37 to F39. A fourth lower source/drain region BSD34 may be disposed on the first side of the fourth gate electrode G34 and on each of the tenth to the twelfth active patterns F10 to F12. The first to fourth lower source/drain regions BSD31 to BSD34 may be spaced apart from each other in the second horizontal direction DR2.

A fifth lower source/drain region BSD35 may be disposed on the second side of the first gate electrode G31 and on each of the first to third active patterns F31 to F33. A sixth lower source/drain region BSD36 may be disposed on the second side of the second gate electrode G32 and on each of the fourth to sixth active patterns F34 to F36. A seventh lower source/drain region BSD37 may be disposed on the second side of the third gate electrode G33 and on each of the seventh to ninth active patterns F37 to F39. An eighth lower source/drain region BSD38 may be disposed on the second side of the fourth gate electrode G34 and on each of the tenth to the twelfth active patterns F10 to F12. The fifth to eighth lower source/drain regions BSD35 to BSD38 may be spaced apart from each other in the second horizontal direction DR2.

A first upper source/drain region TSD31 may be disposed on the first side of the first gate electrode G31 and on the first lower source/drain region BSD31. The first upper source/drain region TSD31 may not be disposed on the first active pattern F31. A second upper source/drain region TSD32 may be disposed on the first side of the second gate electrode G32 and on the second lower source/drain region BSD32. The second upper source/drain region TSD32 may not be disposed on the sixth active pattern F36. A third upper source/drain region TSD33 may be disposed on the first side of the third gate electrode G33 and on the third lower source/drain region BSD33. The third upper source/drain region TSD33 may not be disposed on the seventh active pattern F37. A fourth upper source/drain region TSD34 may be disposed on the first side of the fourth gate electrode G34 and on the fourth lower source/drain region BSD34. The fourth upper source/drain region TSD34 may not be disposed on the twelfth active pattern F312. The first to fourth upper source/drain regions TSD31 to TSD34 may be spaced apart from each other in the second horizontal direction DR2.

A fifth upper source/drain region TSD35 may be disposed on the second side of the first gate electrode G31 and on the fifth lower source/drain region BSD35. A sixth upper source/drain region TSD36 may be disposed on the second side of the second gate electrode G32 and on the sixth lower source/drain region BSD36. A seventh upper source/drain region TSD37 may be disposed on the second side of the third gate electrode G33 and on the seventh lower source/drain region BSD37. An eighth upper source/drain region TSD38 may be disposed on the second side of the fourth gate electrode G34 and on the eighth lower source/drain region BSD38. The fifth to eighth upper source/drain regions TSD35 to TSD38 may be spaced apart from each other in the second horizontal direction DR2.

A length in the second horizontal direction DR2 from a side wall of the first lower source/drain region BSD31 disposed on the first active pattern F31 to a side wall of the second lower source/drain region BSD32 disposed on the sixth active pattern F36 may be referred to as a fourth length L4. Further, a length in the second horizontal direction DR2 from a side wall of the first upper source/drain region TSD31 disposed on the second active pattern F32 to a side wall of the second upper source/drain region TSD32 disposed on the fifth active pattern F35 may be referred to as a third length L3.

On the first side of each of the first and second gate electrodes G31 and G32, the fourth length L4 in the second horizontal direction DR2 of the lower source/drain region may be longer than the third length L3 in the second horizontal direction DR2 of the upper source/drain region. Further, the fourth length L4 in the second horizontal direction DR2 of the lower source/drain region may be shorter than three times of the third length L3 in the second horizontal direction DR2 of the upper source/drain region.

Each of the third lower source/drain region BSD33, the fourth lower source/drain region BSD34, the third upper source/drain region TSD33 and the fourth upper source/drain region TSD34 may have a structure similar to that of each of the first lower source/drain region BSD31, the second lower source/drain region BSD32, the first upper source/drain region TSD31, and the fourth upper source/drain region TSD32.

A first gate contact CB31 may be disposed on the first gate electrode G31. A second gate contact CB32 may be disposed on the second gate electrode G32. A third gate contact CB33 may be disposed on the third gate electrode G33. A fourth gate contact CB34 may be disposed on the fourth gate electrode G34.

A first buried contact BC31 may be disposed on the second side of each of the first and second gate electrodes G31 and G32. The first buried contact BC31 may be disposed between the third active pattern F33 and the fourth active pattern F34. The first buried contact BC31 may protrude, in the first horizontal direction DR1, beyond each of the distal ends of the third active pattern F33 and the fourth active pattern F34.

A second buried contact BC32 may be disposed on the second side of each of the third and fourth gate electrodes G33 and G34. The second buried contact BC32 may be disposed between the ninth active pattern F39 and the tenth active pattern F310. The second buried contact BC32 may protrude, in the first horizontal direction DR1, beyond each of the distal ends of the ninth active pattern F39 and the tenth active pattern F310.

Each of the first and second buried contacts BC31 and BC32 may extend through the first interlayer insulating layer 120 and the field insulating layer 105 in the vertical direction DR3, and then may extend into the interior of the substrate 100. A top face of each of the first and second buried contacts BC31 and BC32 may be coplanar with a top face of each of the lower source/drain regions BSD31 to BSD38.

A first lower source/drain contact BCA31 may be disposed on the first active pattern F31 and on the first side of the first gate electrode G31. The first lower source/drain contact BCA31 may extend through the second interlayer insulating layer 130 in the vertical direction DR3, and may be electrically connected to the first lower source/drain region BSD31. The first lower source/drain contact BCA31 may be spaced apart from the first upper source/drain region TSD31.

A second lower source/drain contact BCA32 may be disposed on the first side of the second gate electrode G32 and on the sixth active pattern F36. The second lower source/drain contact BCA32 may extend through the second interlayer insulating layer 130 in the vertical direction DR3, and may be electrically connected to the second lower source/drain region BSD32. The second lower source/drain contact BCA32 may be spaced apart from the second upper source/drain region TSD32.

A third lower source/drain contact BCA33 may be disposed on the first side of the third gate electrode G33, and on the seventh active pattern F37. The third lower source/drain contact BCA33 may extend through the second interlayer insulating layer 130 in the vertical direction DR3, and may be electrically connected to the third lower source/drain region BSD33. The third lower source/drain contact BCA33 may be spaced apart from the third upper source/drain region TSD33.

A fourth lower source/drain contact BCA34 may be disposed on the twelfth active pattern F312 and on the first side of the fourth gate electrode G34. The fourth lower source/drain contact BCA34 may extend through the second interlayer insulating layer 130 in the vertical direction DR3, and may be electrically connected to the fourth lower source/drain region BSD34. The fourth lower source/drain contact BCA34 may be spaced apart from the fourth upper source/drain region TSD34.

A first upper source/drain contact TCA31 may be disposed on the first side of each of the first and second gate electrodes G31 and G32, and on the third and fourth active patterns F33 and F34. The first upper source/drain contact TCA31 may extend through a portion of the second interlayer insulating layer 130 in the vertical direction DR3, and may be electrically connected to each of the first upper source/drain region TSD31 and the second upper source/drain region TSD32.

A second upper source/drain contact TCA32 may be disposed on the first side of each of the third and fourth gate electrodes G33 and G34, and on the ninth and tenth active patterns F39 and F310. The second upper source/drain contact TCA32 may extend through a portion of the second interlayer insulating layer 130 in the vertical direction DR3, and may be electrically connected to each of the third upper source/drain region TSD33 and the fourth upper source/drain region TSD34.

A third upper source/drain contact TCA33 may be disposed on the second side of each of the first and second gate electrodes G31 and G32, and on the third and fourth active patterns F33 and F34. The third upper source/drain contact TCA33 may extend through a portion of the second interlayer insulating layer 130 in the vertical direction DR3, and may be electrically connected to each of the fifth upper source/drain region TSD35 and the sixth upper source/drain region TSD36.

A fourth upper source/drain contact TCA34 may be disposed on the ninth and tenth active patterns F39 and F310 and on the second side of each of the third and fourth gate electrodes G33 and G34. The fourth upper source/drain contact TCA34 may extend through a portion of the second interlayer insulating layer 130 in the vertical direction DR3, and may be electrically connected to each of the seventh upper source/drain region TSD37 and the eighth upper source/drain region TSD38.

A first via V31 may be disposed on the first gate contact CB31. A second via V32 may be disposed on the second gate contact CB32. A third via V33 may be disposed on the third gate contact CB33. A fourth via V34 may be disposed on the fourth gate contact CB34.

A fifth via V35 may be disposed on the first lower source/drain contact BCA31. The fifth via V35 may extend through the third interlayer insulating layer 150 and the etching stop layer 140 in the vertical direction DR3, thereby electrically connecting the first lower source/drain contact BCA31 and the first line pattern 180 to each other. A sixth via V36 may be disposed on the second lower source/drain contact BCA32. The sixth via V36 may extend through the third interlayer insulating layer 150 and the etching stop layer 140 in the vertical direction DR3, thereby electrically connecting the second lower source/drain contact BCA32 and the first line pattern 180 to each other.

A seventh via V37 may be disposed on the third lower source/drain contact BCA33. The seventh via V37 may extend through the third interlayer insulating layer 150 and the etching stop layer 140 in the vertical direction DR3, thereby electrically connecting the third lower source/drain contact BCA33 and the first line pattern 180 to each other. An eighth via V38 may be disposed on the fourth lower source/drain contact BCA34. The eighth via V38 may extend through the third interlayer insulating layer 150 and the etching stop layer 140 in the vertical direction DR3, thereby electrically connecting the fourth lower source/drain contact BCA34 and the first line pattern 180 to each other.

A ninth via V39 may be disposed on the first buried contact BC31. The ninth via V39 may be disposed on a portion of the first buried contact BC31 protruding, in the first horizontal direction DR1, beyond each of distal ends of the third active pattern F33 and the fourth active pattern F34. The ninth via V39 may extend through the fourth interlayer insulating layer 160, the third interlayer insulating layer 150, the etching stop layer 140 and the second interlayer insulating layer 130 in the vertical direction DR3, thereby electrically connecting the first buried contact BC31 and the second line pattern 190 to each other.

A tenth via V310 may be disposed on the second buried contact BC32. The tenth via V310 may be disposed on a portion of the second buried contact BC32, protruding in the first horizontal direction DR1, beyond each of distal ends of the ninth active pattern F39 and the tenth active pattern F310. The tenth via V310 may extend through the fourth interlayer insulating layer 160, the third interlayer insulating layer 150, the etching stop layer 140 and the second interlayer insulating layer 130 in the vertical direction DR3, such that the second buried contact BC32 and the second line pattern 190 may be electrically connected to each other via the tenth via V310. The first buried contact BC31 and the second buried contact BC32 may be electrically connected to each other via the second line pattern 190.

An eleventh via V311 may be disposed on the first upper source/drain contact TCA31. The eleventh via V311 may extend through the third interlayer insulating layer 150 and the etching stop layer 140 in the vertical direction DR3, thereby electrically connecting the first upper source/drain contact TCA31 and the first line pattern 180 to each other. A twelfth via V312 may be disposed on the second upper source/drain contact TCA32. The twelfth via V312 may extend through the third interlayer insulating layer 150 and the etching stop layer 140 in the vertical direction DR3, thereby electrically connecting the second upper source/drain contact TCA32 and the first line pattern 180 to each other.

A thirteenth via V313 may be disposed on the third upper source/drain contact TCA33. The thirteenth via V313 may extend through the third interlayer insulating layer 150 and the etching stop layer 140 in the vertical direction DR3, thereby electrically connecting the third upper source/drain contact TCA33 and the first line pattern 180 to each other. A fourteenth via V314 may be disposed on the fourth upper source/drain contact TCA34. The fourteenth via V314 may extend through the third interlayer insulating layer 150 and the etching stop layer 140 in the vertical direction DR3, thereby electrically connecting the fourth upper source/drain contact TCA34 and the first line pattern 180 to each other.

Hereinafter, a semiconductor device according to still some further embodiments will be described with reference to FIG. 1, FIG. 26 to FIG. 33. Following descriptions will be based on differences from those of the semiconductor device shown in FIG. 17 to FIG. 25.

Figure 26:
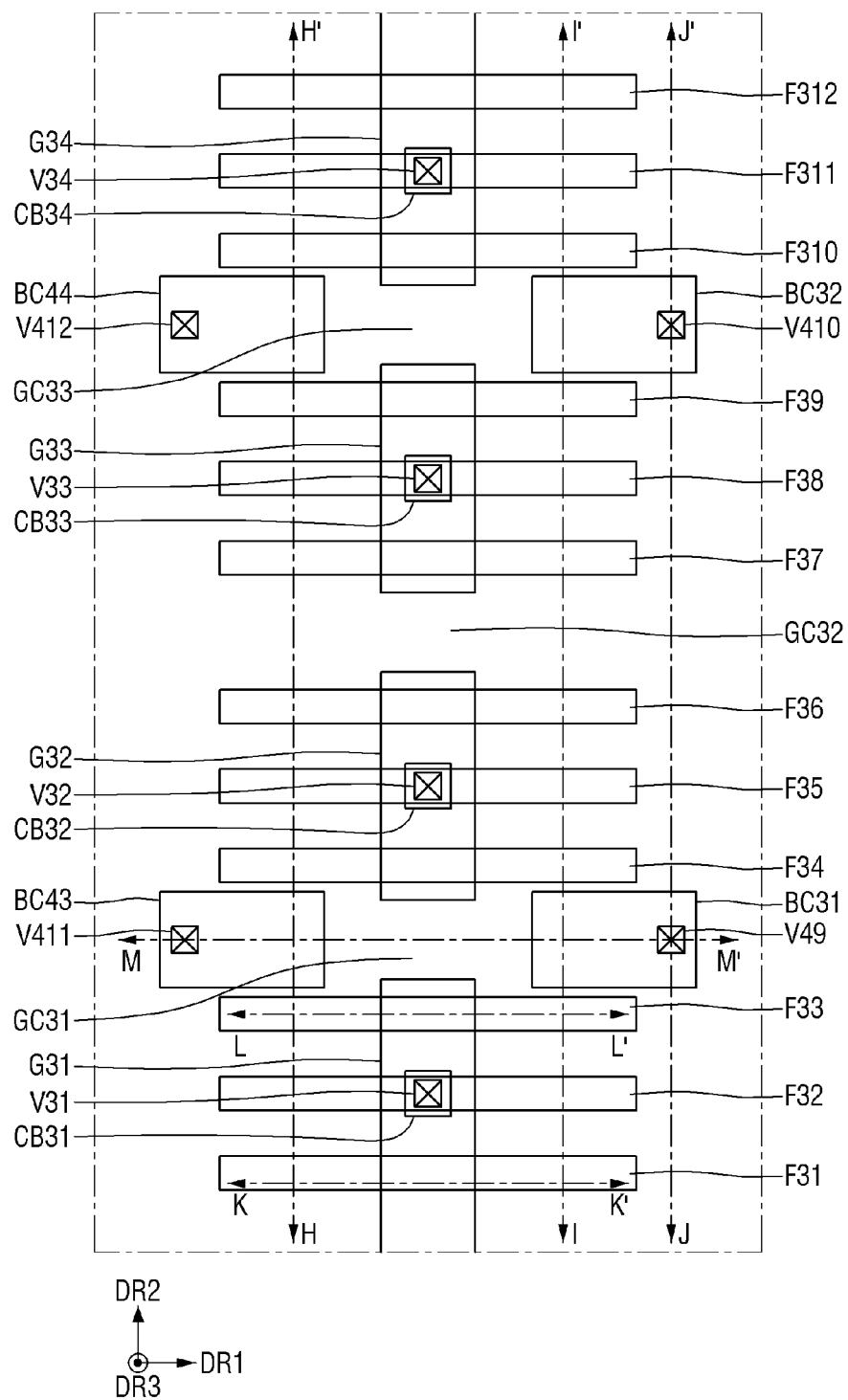
FIG. 26 is a layout diagram for illustrating a contact connected to a lower source/drain region in a semiconductor device according to still some further embodiments.
Figure 27:
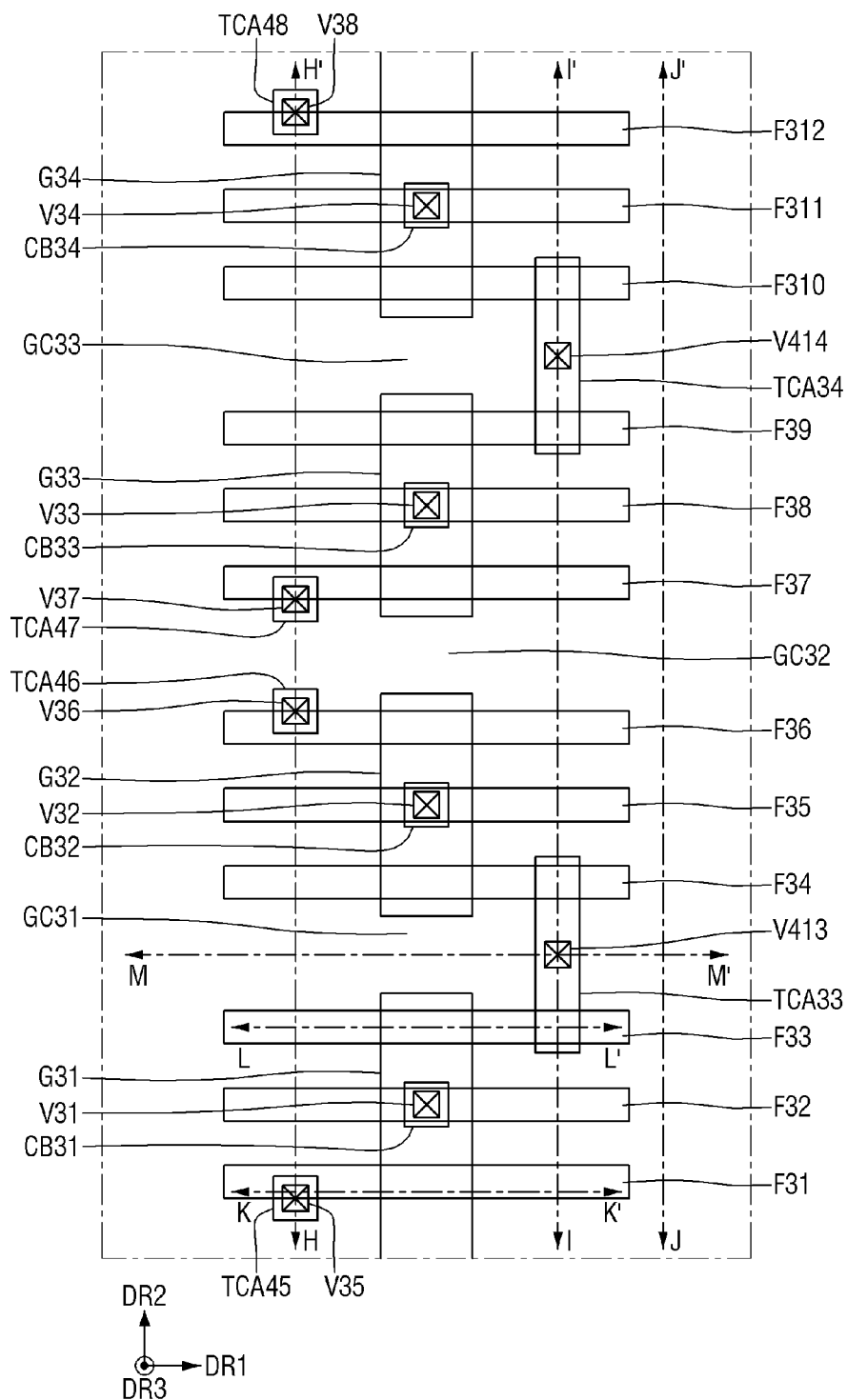
FIG. 27 is a layout diagram for illustrating a contact connected to an upper source/drain region in a semiconductor device according to still some further embodiments.
Figure 28:
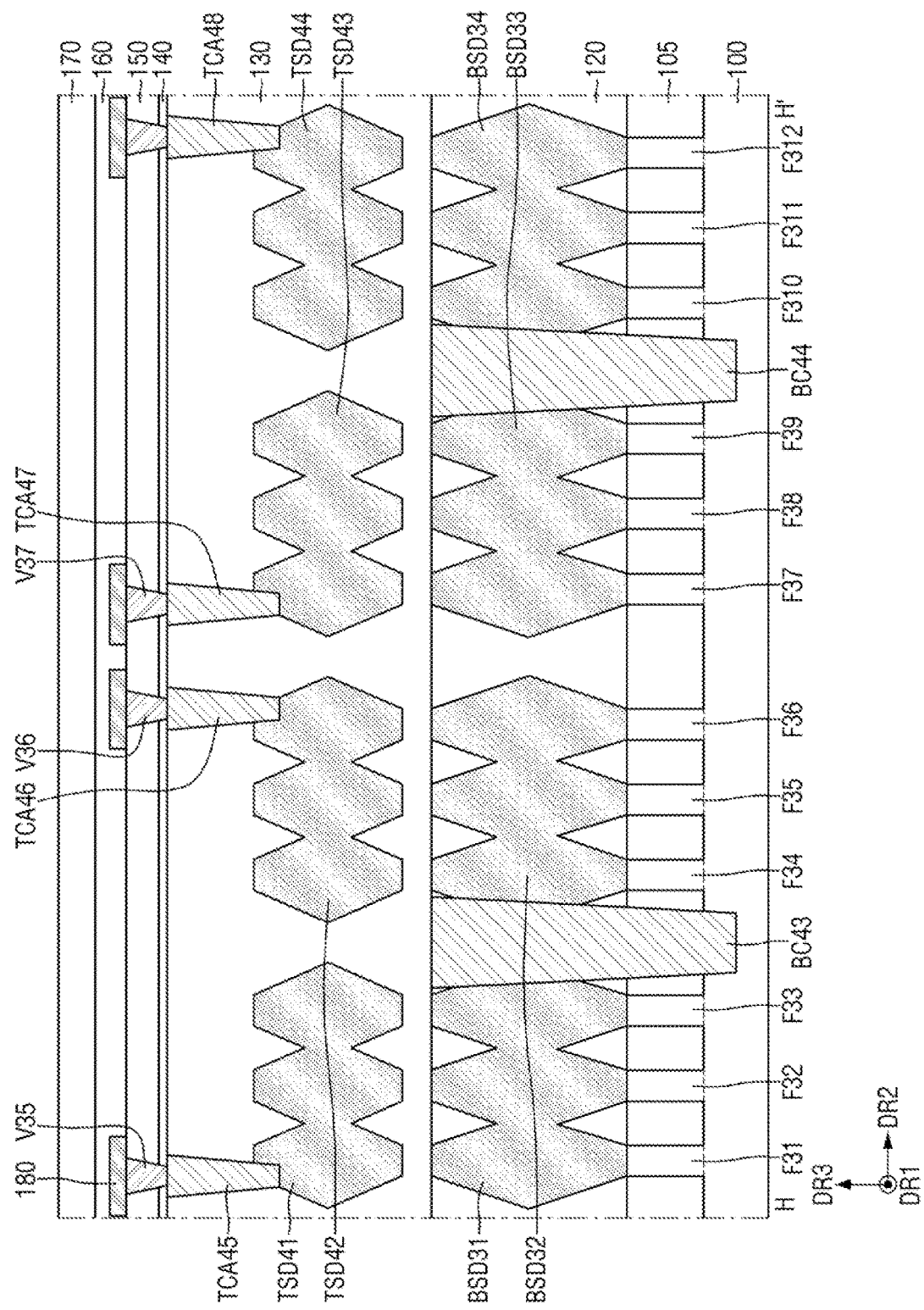
FIG. 28 is a cross-sectional view taken along a line H-H' in each of FIG. 26 and FIG. 27.
Figure 29:
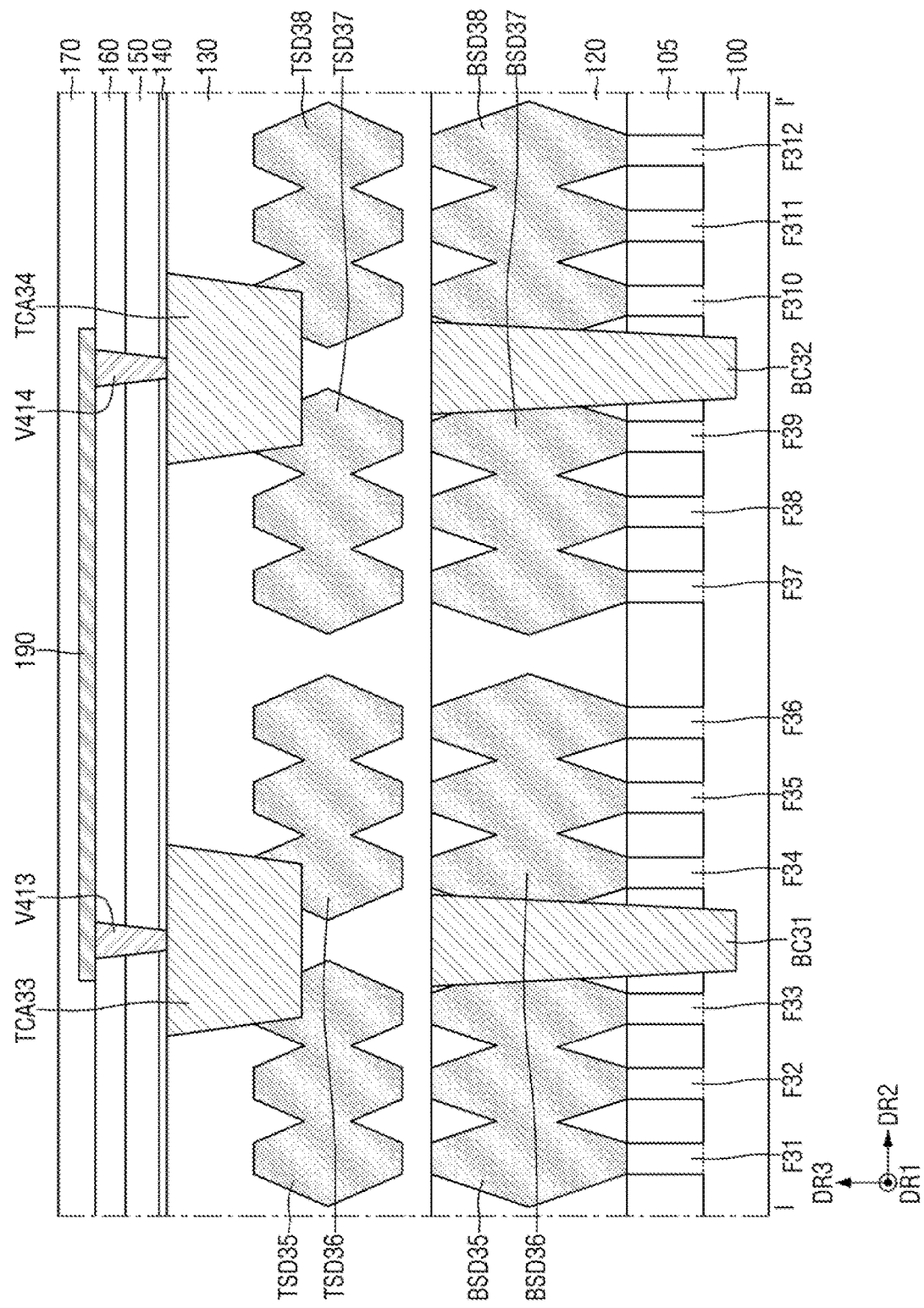
FIG. 29 is a cross-sectional view taken along a line I-I' in each of FIG. 26 and FIG. 27.
Figure 30:
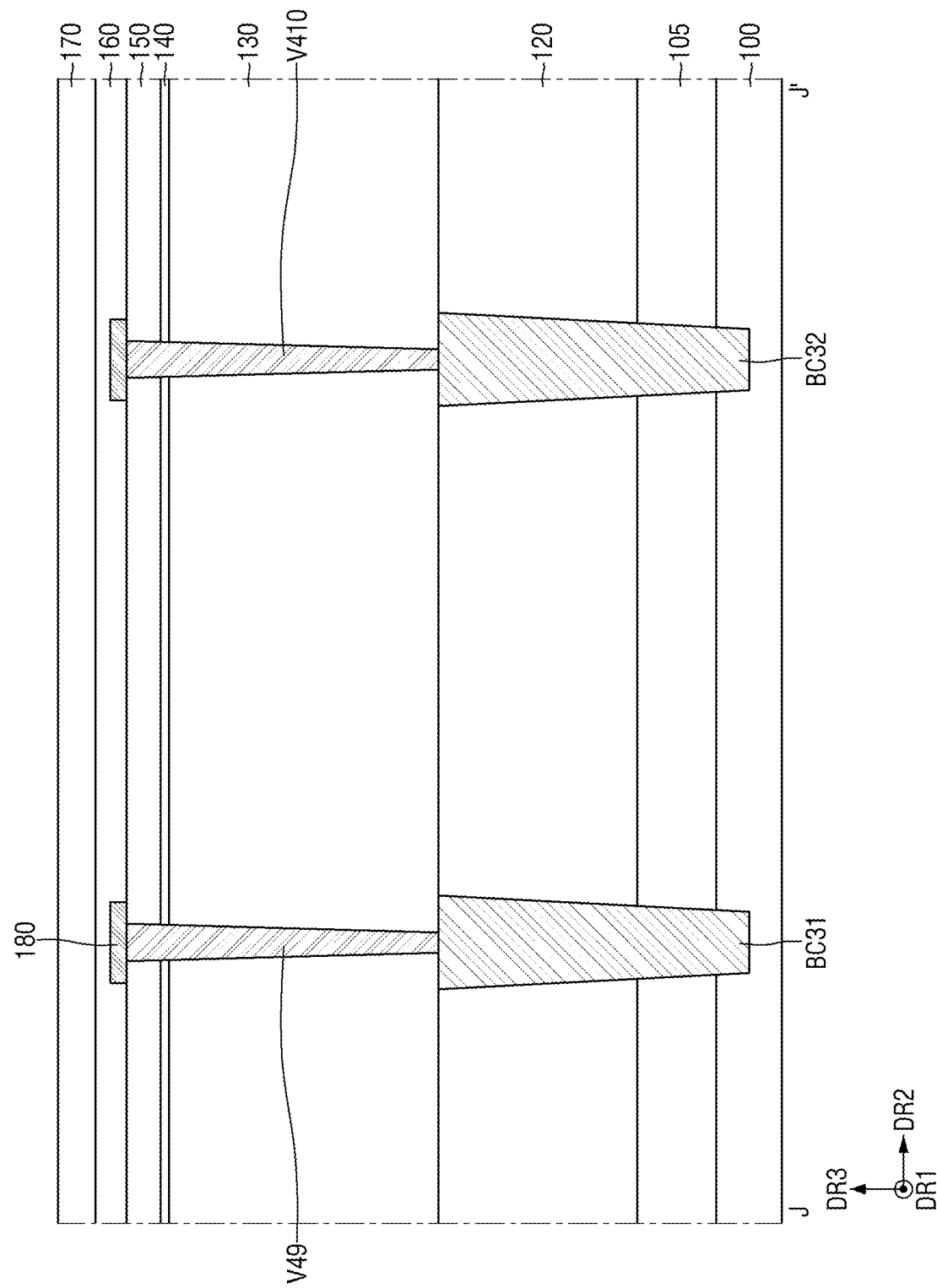
FIG. 30 is a cross-sectional view taken along a line J-J' in each of FIG. 26 and FIG. 27.
Figure 31:
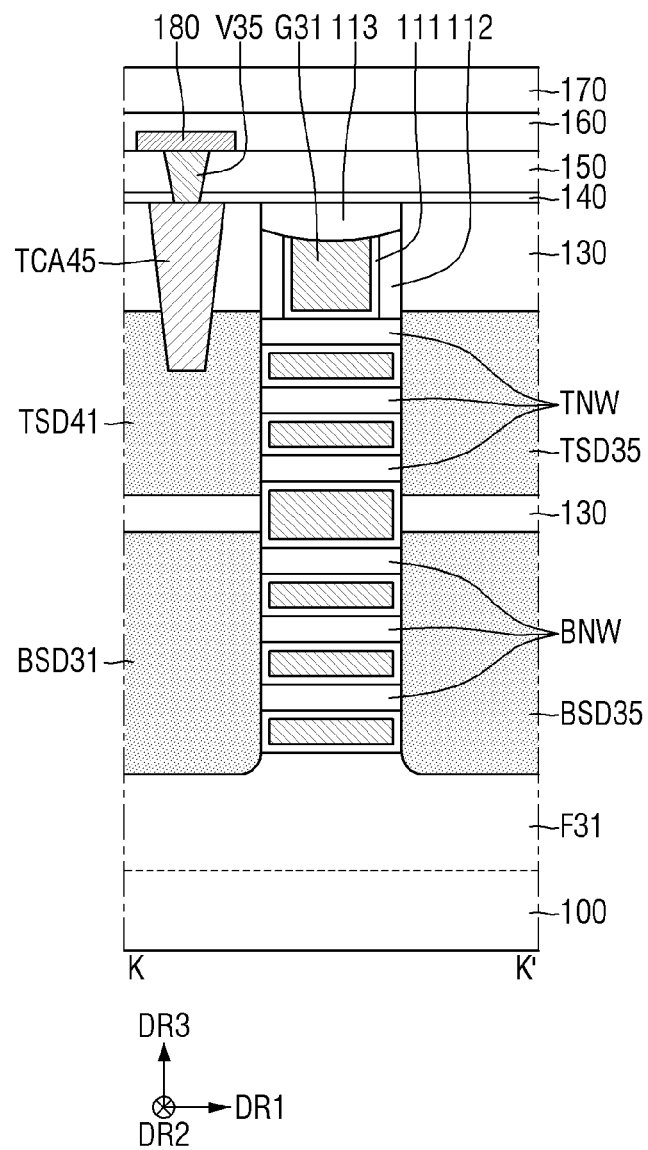
FIG. 31 is a cross-sectional view taken along a line K-K' in each of FIG. 26 and FIG. 27.
Figure 32:
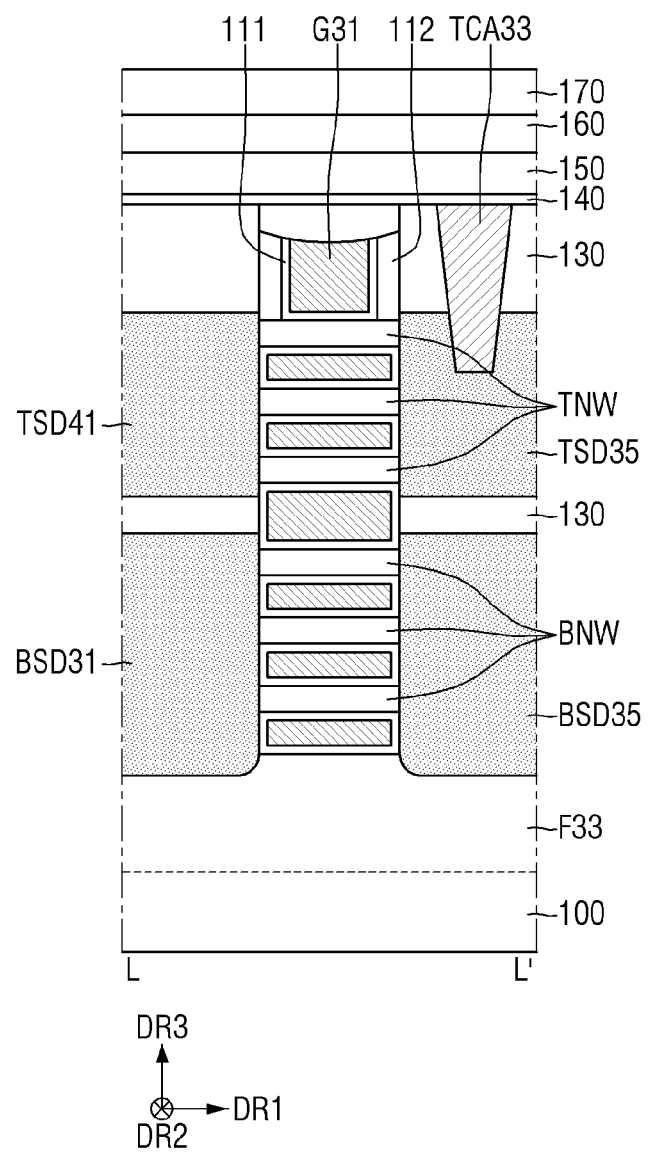
FIG. 32 is a cross-sectional view taken along a line L-L' in each of FIG. 26 and FIG. 27.
Figure 33:
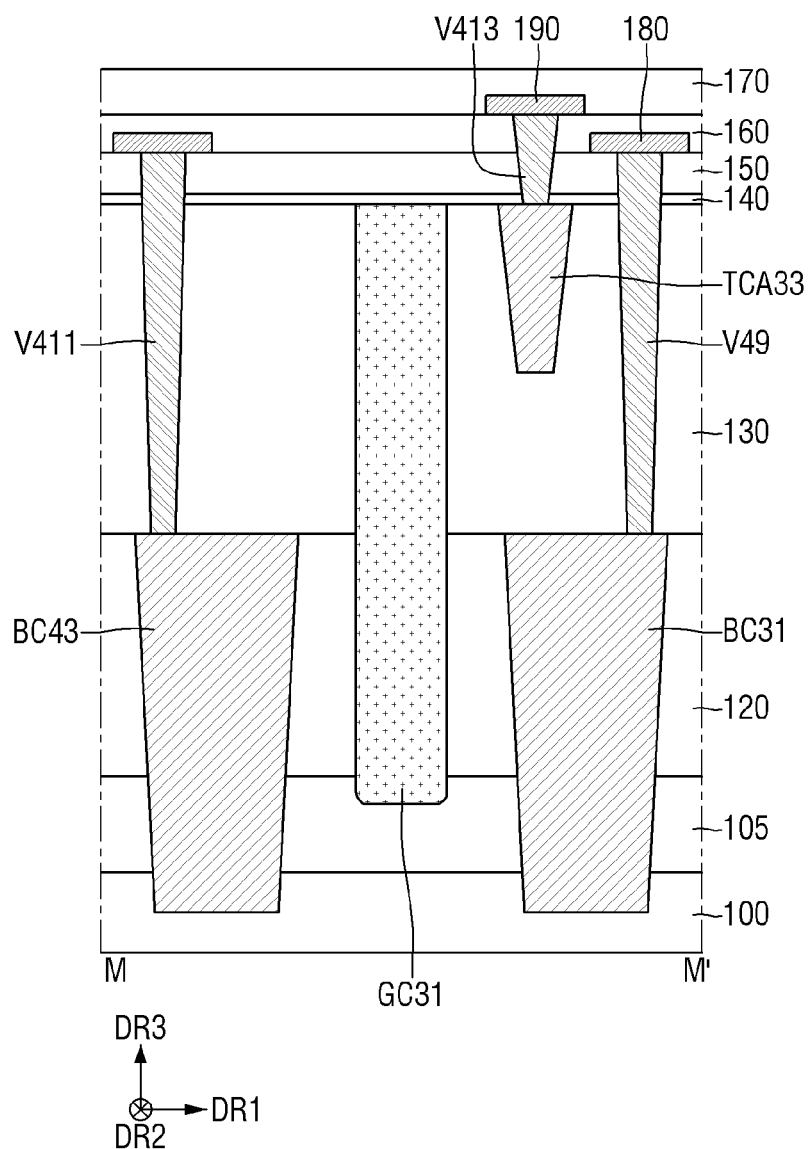
FIG. 33 is a cross-sectional view taken along a line M-M' in each of FIG. 26 and FIG. 27.

FIG. 26 is a layout diagram for illustrating a contact connected to a lower source/drain region in a semiconductor device according to still some further embodiments. FIG. 27 is a layout diagram for illustrating a contact connected to an upper source/drain region in a semiconductor device according to still some further embodiments. FIG. 28 is a cross-sectional view taken along a line H-H' in each of FIG. 26 and FIG. 27. FIG. 29 is a cross-sectional view taken along a line I-I' in each of FIG. 26 and FIG. 27. FIG. 30 is a cross-sectional view taken along a line J-J' in each of FIG. 26 and FIG. 27. FIG. 31 is a cross-sectional view taken along a line K-K' in each of FIG. 26 and FIG. 27. FIG. 32 is a cross-sectional view taken along a line L-L' in each of FIG. 26 and FIG. 27. FIG. 33 is a cross-sectional view taken along a line M-M' in each of FIG. 26 and FIG. 27.

Referring to FIG. 1, FIG. 26 to FIG. 33, in the semiconductor device according to still some further embodiments, an area in which the plurality of lower nanosheets BNW is disposed may be referred to as a PMOS region, while an area in which the plurality of upper nanosheets TNW are disposed may be referred to as an NMOS region.

The first transistor TR1 may include the plurality of lower nanosheets BNW and the fourth gate electrode G34. The second transistor TR2 may include the plurality of lower nanosheets BNW and the third gate electrode G33. The third transistor TR3 may include the plurality of lower nanosheets BNW and the second gate electrode G32. The fourth transistor TR4 may include the plurality of lower nanosheets BNW and the first gate electrode G31.

Further, the fifth transistor TR5 may include the plurality of upper nanosheets TNW and the fourth gate electrode G34. The sixth transistor TR6 may include the plurality of upper nanosheets TNW and the second gate electrode G32. The seventh transistor TR7 may include the plurality of upper nanosheets TNW and the third gate electrode G33. The eighth transistor TR8 may include the plurality of upper nanosheets TNW and the first gate electrode G31.

A first upper source/drain region TSD41 may be disposed on the first side of the first gate electrode G31 and on the first lower source/drain region BSD31. The first upper source/drain region TSD41 may overlap the first to third active pattern F31 to F33 in the vertical direction DR3. A second upper source/drain region TSD42 may be disposed on the first side of the second gate electrode G32 and on the second lower source/drain region BSD32. The second upper source/drain region TSD42 may overlap the fourth to sixth active patterns F34 to F36 in the vertical direction DR3.

A third upper source/drain region TSD43 may be disposed on the first side of the third gate electrode G33 and on the third lower source/drain region BSD33. The third upper source/drain region TSD43 may overlap the seventh to ninth active patterns F37 to F39 in the vertical direction DR3. A fourth upper source/drain region TSD44 may be disposed on the first side of the fourth gate electrode G34 and on the fourth lower source/drain region BSD34. The fourth upper source/drain region TSD44 may overlap the tenth to the twelfth active pattern F310 to F312 in the vertical direction DR3. The first to fourth upper source/drain regions TSD41 to TSD44 may be spaced apart from each other in the second horizontal direction DR2.

A third buried contact BC43 may be disposed on the first side of each of the first and second gate electrodes G31 and G32. The third buried contact BC43 may be disposed between the third active pattern F33 and the fourth active pattern F34. The third buried contact BC43 may protrude, in the opposite direction to the first horizontal direction DR1, beyond each of the distal ends of the third active pattern F33 and the fourth active pattern F34.

A fourth buried contact BC44 may be disposed on the first side of each of the third and fourth gate electrodes G33 and G34. The fourth buried contact BC44 may be disposed between the ninth active pattern F39 and the tenth active pattern F310. The fourth buried contact BC44 may protrude, in the opposite direction to the first horizontal direction DR1, beyond each of the distal ends of the ninth active pattern F39 and the tenth active pattern F310.

Each of the third and fourth buried contacts BC43 and BC44 may extend through the first interlayer insulating layer 120 and the field insulating layer 105 in the vertical direction DR3, and then may extend into the interior of the substrate 100. Each of the third and fourth buried contacts BC43 and BC44 may have a top face coplanar with a top face of each of the lower source/drain regions BSD31 to BSD38.

A fifth upper source/drain contact TCA45 may be disposed on the first active pattern F31 and on the first side of the first gate electrode G31. The fifth upper source/drain contact TCA45 may extend through a portion of the second interlayer insulating layer 130 in the vertical direction DR3, and may be electrically connected to the first upper source/drain region TSD41. A sixth upper source/drain contact TCA46 may be disposed on the sixth active pattern F36 and on the first side of the second gate electrode G32. The sixth upper source/drain contact TCA46 may extend through a portion of the second interlayer insulating layer 130 in the vertical direction DR3, and may be electrically connected to the second upper source/drain region TSD42.

A seventh upper source/drain contact TCA47 may be disposed on the seventh active pattern F37 and on the first side of the third gate electrode G33. The seventh upper source/drain contact TCA47 may extend through a portion of the second interlayer insulating layer 130 in the vertical direction DR3, and thus may be electrically connected to the third upper source/drain region TSD43. An eighth upper source/drain contact TCA48 may be disposed on the twelfth active pattern F312 and on the first side of the fourth gate electrode G34. The eighth upper source/drain contact TCA48 may extend through a portion of the second interlayer insulating layer 130 in the vertical direction DR3, and may be electrically connected to the fourth upper source/drain region TSD44.

A ninth via V49 may be disposed on the first buried contact BC31. The ninth via V49 may be disposed on a portion of the first buried contact BC31, protruding in the first horizontal direction DR1, beyond each of distal ends of the third active pattern F33 and the fourth active pattern F34. The ninth via V49 may extend through the third interlayer insulating layer 150, the etching stop layer 140, and the second interlayer insulating layer 130 in the vertical direction DR3, thereby electrically connecting the first buried contact BC31 and the first line pattern 180 to each other.

A tenth via V410 may be disposed on the second buried contact BC32. The tenth via V410 may be disposed on a portion of the second buried contact BC32 protruding, in the first horizontal direction DR1, beyond each of distal ends of the ninth active pattern F39 and the tenth active pattern F310. The tenth via V410 may extend through the third interlayer insulating layer 150, the etching stop layer 140, and the second interlayer insulating layer 130 in the vertical direction DR3, thereby electrically connecting the second buried contact BC32 and the first line pattern 180 to each other.

An eleventh via V411 may be disposed on the third buried contact BC43. The eleventh via V411 may be disposed on a portion of the third buried contact BC43, protruding, in the opposite direction to the first horizontal direction DR1, beyond each of the distal ends of the third active pattern F33 and the fourth active pattern F34. The eleventh via V411 may extend through the third interlayer insulating layer 150, the etching stop layer 140 and the second interlayer insulating layer 130 in the vertical direction DR3, thereby making an electrical connection between the third buried contact BC43 and the first line pattern 180.

A twelfth via V412 may be disposed on the fourth buried contact BC44. The twelfth via V412 may be disposed on a portion of the fourth buried contact BC44 protruding, in the opposite direction to the first horizontal direction DR1, beyond each of the distal ends of the ninth active pattern F39 and the tenth active pattern F310. The twelfth via V412 may extend through the third interlayer insulating layer 150, the etching stop layer 140 and the second interlayer insulating layer 130 in the vertical direction DR3, thereby electrically connecting the fourth buried contact BC44 and the first line pattern 180 to each other.

A thirteenth via V413 may be disposed on the third upper source/drain contact TCA33. The thirteenth via V413 may extend through the fourth interlayer insulating layer 160, the third interlayer insulating layer 150 and the etching stop layer 140 in the vertical direction DR3, thereby electrically connecting the third upper source/drain contact TCA33 and the second line pattern 190 to each other. A fourteenth via V414 may be disposed on the fourth upper source/drain contact TCA34. The fourteenth via V414 may extend through the fourth interlayer insulating layer 160, the third interlayer insulating layer 150 and the etching stop layer 140 in the vertical direction DR3, thereby electrically connecting the fourth upper source/drain contact TCA34 and the second line pattern 190 to each other. The third upper source/drain contact TCA33 and the fourth upper source/drain contact TCA34 may be electrically connected to each other via the second line pattern 190.

Hereinafter, a semiconductor device according to still some further embodiments will be described with reference to FIG. 34 to FIG. 37. Following descriptions will be based on differences from those of the semiconductor device shown in FIG. 1 to FIG. 9.

Figure 34:
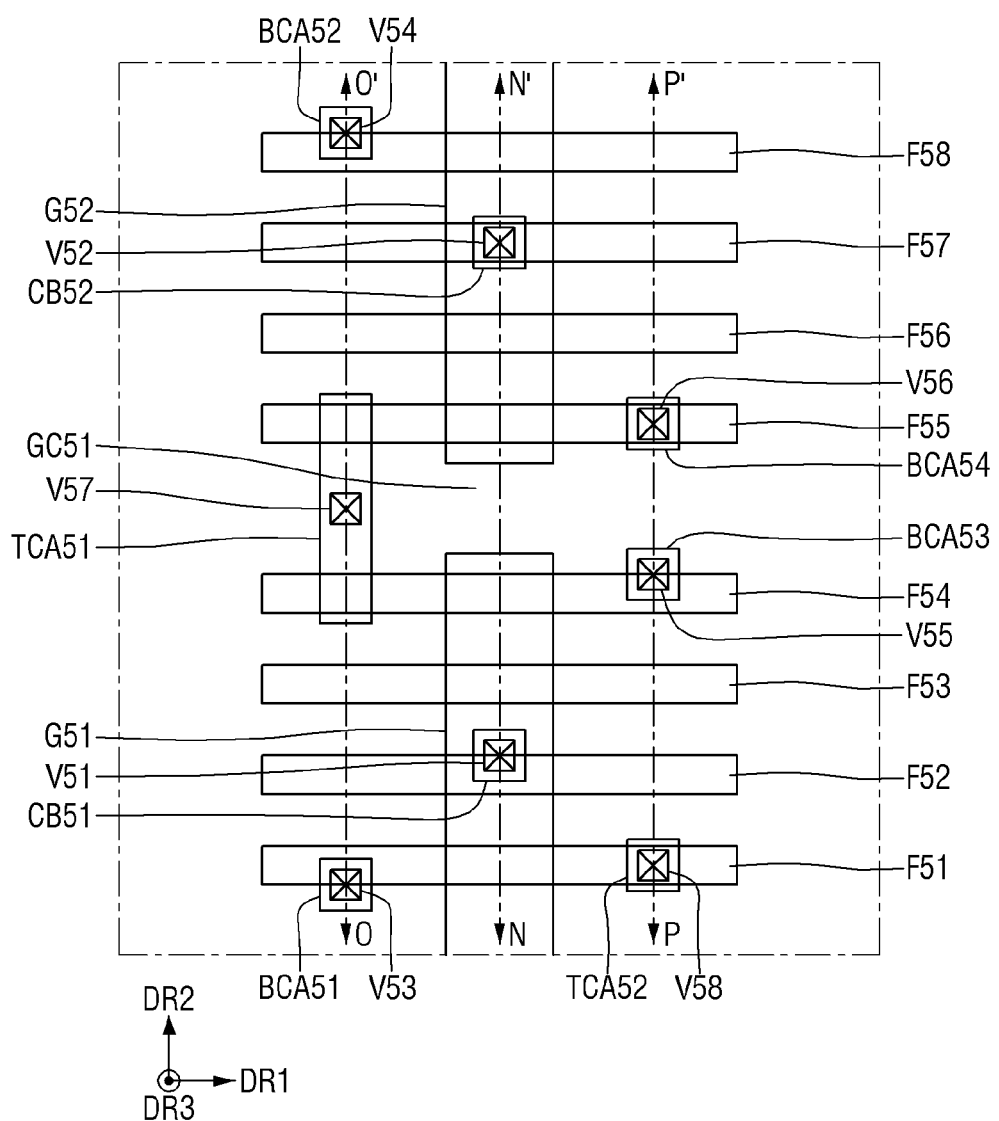
FIG. 34 is a layout diagram for illustrating a semiconductor device according to still some further embodiments.
Figure 35:
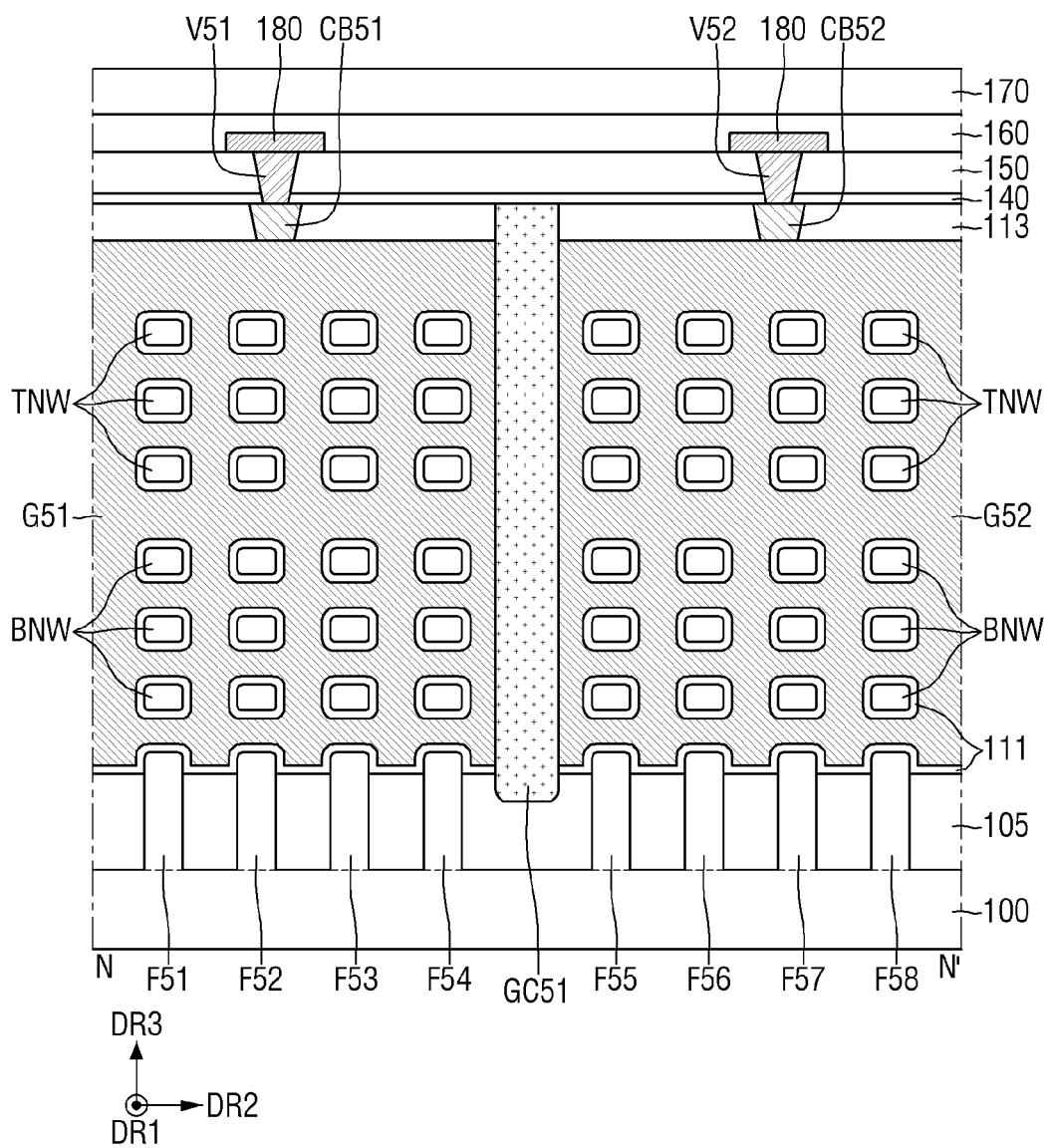
FIG. 35 is a cross-sectional view taken along a line N-N' in FIG. 34.
Figure 36:
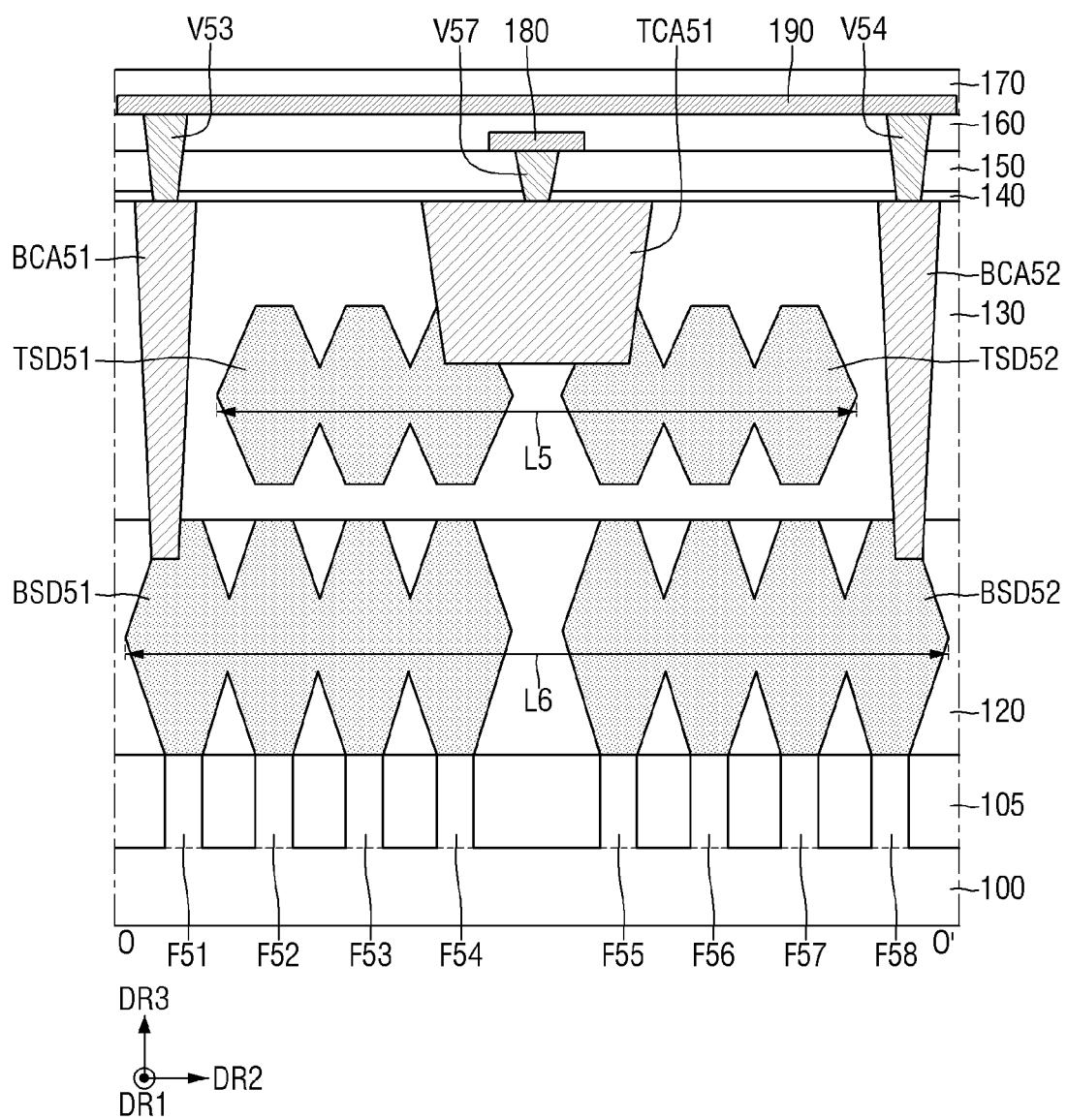
FIG. 36 is a cross-sectional view taken along a line O-O' in FIG. 34.
Figure 37:
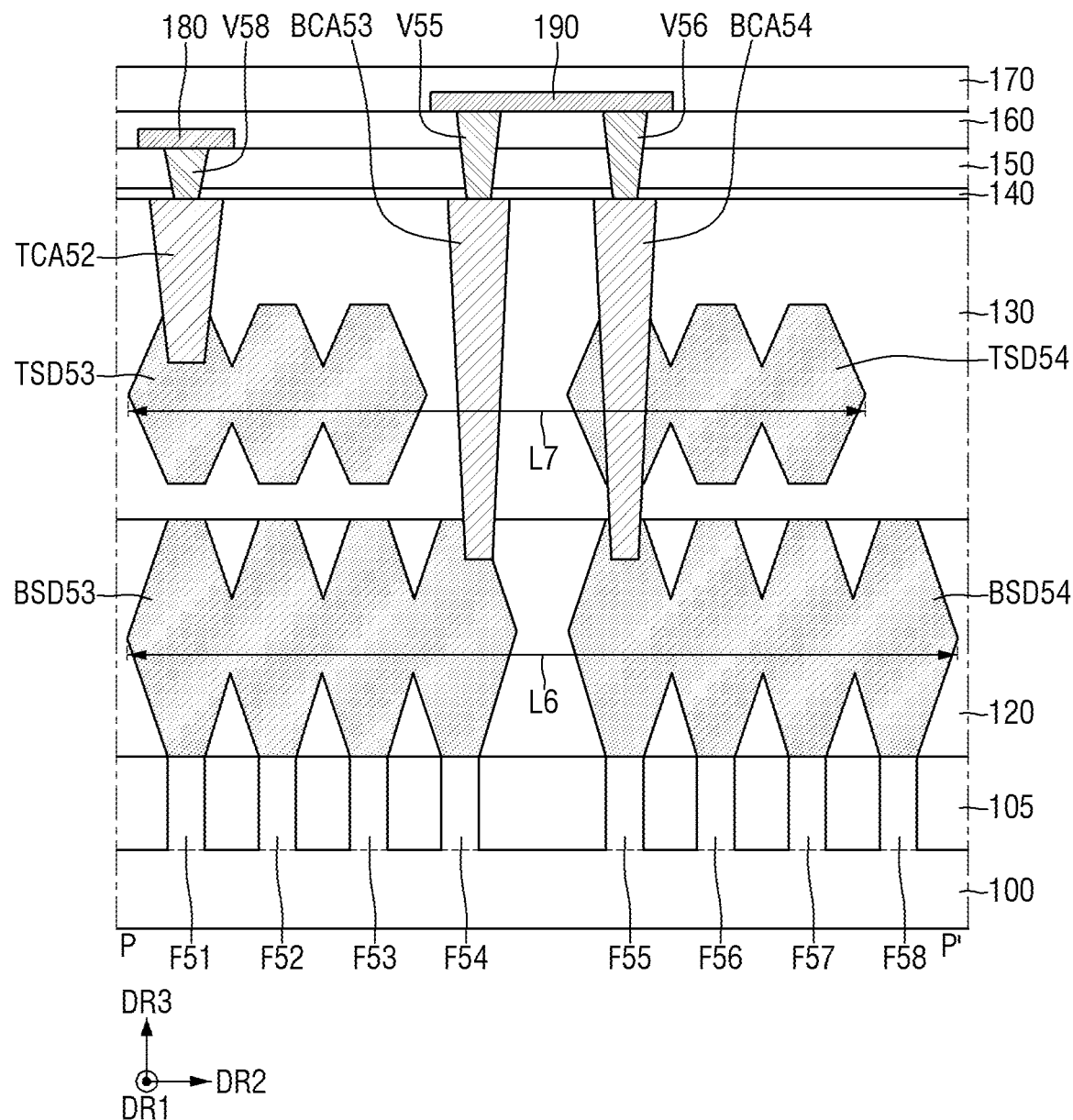
FIG. 37 is a cross-sectional view taken along a line P-P' in FIG. 34.

FIG. 34 is a layout diagram for illustrating a semiconductor device according to still some further embodiments. FIG. 35 is a cross-sectional view taken along a line N-N' in FIG. 34. FIG. 36 is a cross-sectional view taken along a line O-O' in FIG. 34. FIG. 37 is a cross-sectional view taken along a line P-P' in FIG. 34.

Referring to FIG. 34 to FIG. 37, the semiconductor device according to still some further embodiments may include two gate electrodes G51 and G52.

Each of first to eighth active patterns F51 to F58 may protrude from the substrate 100 in the vertical direction DR3. Each of the first to eighth active patterns F51 to F58 may extend in the first horizontal direction DR1. Each of the first to eighth active patterns F51 to F58 may be sequentially provided and spaced apart from each other in the second horizontal direction DR2.

For example, the first to fourth active patterns F51, F52, F53, and F54 may be spaced apart from each other by the same spacing. The fifth to eighth active pattern F55, F56, F57, F58 may be spaced apart from each other by the same spacing. For example, the spacing between the fourth active pattern F54 and the fifth active pattern F55 may be greater than the spacing between the third active pattern F53 and the fourth active pattern F54.

A first gate electrode G51 may extend in the second horizontal direction DR2 and may be disposed on the first to fourth active patterns F51, F52, F53, and F54. A second gate electrode G52 may extend in the second horizontal direction DR2 and may be disposed on the fifth to eighth active patterns F55, F56, F57, and F58. The second gate electrode G52 may be spaced apart from the first gate electrode G51 in the second horizontal direction DR2. A gate cut GC51 may be disposed between the first gate electrode G51 and the second gate electrode G52.

A first lower source/drain region BSD51 may be disposed on the first side of the first gate electrode G51 and on each of the first to fourth active patterns F51, F52, F53, and F54. A second lower source/drain region BSD52 may be disposed on the first side of the second gate electrode G52 and on each of the fifth to eighth active patterns F55, F56, F57, and F58. The second lower source/drain region BSD52 may be spaced apart from the first lower source/drain region BSD51 in the second horizontal direction DR2.

A third lower source/drain region BSD53 may be disposed on the second side of the first gate electrode G51 and on each of the first to fourth active patterns F51, F52, F53, and F54. A fourth lower source/drain region BSD54 may be disposed on the second side of the second gate electrode G52 and on each of the fifth to eighth active patterns F55, F56, F57, and F58. The fourth lower source/drain region BSD54 may be spaced apart from the third lower source/drain region BSD53 in the second horizontal direction DR2.

A first upper source/drain region TSD51 may be disposed on the first side of the first gate electrode G51 and on the first lower source/drain region BSD51. The first upper source/drain region TSD51 may not be disposed on the first active pattern F51. A second upper source/drain region TSD52 may be disposed on the first side of the second gate electrode G52 and on the second lower source/drain region BSD52. The second upper source/drain region TSD52 may not be disposed on the eighth active pattern F58.

A third upper source/drain region TSD53 may be disposed on the second side of the first gate electrode G51 and on the third lower source/drain region BSD53. The third upper source/drain region TSD53 may not be disposed on the fourth active pattern F54. A fourth upper source/drain region TSD54 may be disposed on the second side of the second gate electrode G52 and on the fourth lower source/drain region BSD54. The fourth upper source/drain region TSD54 may not be disposed on the eighth active pattern F58.

A length in the second horizontal direction DR2 from a side wall of the first lower source/drain region BSD51 disposed on the first active pattern F51 to a side wall of the second lower source/drain region BSD52 disposed on the eighth active pattern F58 may be referred to as a sixth length L6. Further, a length in the second horizontal direction DR2 from a side wall of the first upper source/drain region TSD51 disposed on the second active pattern F52 to a side wall of the second upper source/drain region TSD52 disposed on the seventh active pattern F57 may be referred to as a fifth length L5. Further, a length in the second horizontal direction DR2 from a side wall of the third upper source/drain region TSD53 disposed on the first active pattern F51 to a side wall of the fourth upper source/drain region TSD54 disposed on the seventh active pattern F57 may be referred to as the seventh length L7.

On the first side of each of the first and second gate electrodes G51 and G52, the sixth length L6 in the second horizontal direction DR2 of the lower source/drain region may be longer than the fifth length L5 in the second horizontal direction DR2 of the upper source/drain region. Further, the sixth length L6 in the second horizontal direction DR2 of the lower source/drain region may be shorter than three times of the fifth length L5 in the second horizontal direction DR2 of the upper source/drain region.

On the second side of each of the first and second gate electrodes G51 and G52, the sixth length L6 in the second horizontal direction DR2 of the lower source/drain region may be longer than the seventh length L7 in the second horizontal direction DR2 of the upper source/drain region. Further, the sixth length L6 in the second horizontal direction DR2 of the lower source/drain region may be shorter than three times of the seventh length L7 in the second horizontal direction DR2 of the upper source/drain region.

A first gate contact CB51 may be disposed on the first gate electrode G51. A second gate contact CB52 may be disposed on the second gate electrode G52. A first lower source/drain contact BCA51 may be disposed on the first active pattern F51 and on the first side of the first gate electrode G51. The first lower source/drain contact BCA51 may extend through the second interlayer insulating layer 130 in the vertical direction DR3, and may be electrically connected to the first lower source/drain region BSD51. The first lower source/drain contact BCA51 may be spaced apart from the first upper source/drain region TSD51.

A second lower source/drain contact BCA52 may be disposed on the eighth active pattern F58 and on the first side of the second gate electrode G52. The second lower source/drain contact BCA52 may extend through the second interlayer insulating layer 130 in the vertical direction DR3, and may be electrically connected to the second lower source/drain region BSD52. The second lower source/drain contact BCA52 may be spaced apart from the second upper source/drain region TSD52.

A third lower source/drain contact BCA53 may be disposed on the fourth active pattern F54 and on the second side of the first gate electrode G51. The third lower source/drain contact BCA53 may extend through the second interlayer insulating layer 130 in the vertical direction DR3, and may be electrically connected to the third lower source/drain region BSD53. The third lower source/drain contact BCA53 may be spaced apart from the third upper source/drain region TSD53.

A fourth lower source/drain contact BCA54 may be disposed on the fifth active pattern F55 and on the second side of the second gate electrode G52. The fourth lower source/drain contact BCA54 may extend through the second interlayer insulating layer 130 and the fourth upper source/drain region TSD54 in the vertical direction DR3, and may be electrically connected to the fourth lower source/drain region BSD54 and the fourth upper source/drain region TSD54.

A first upper source/drain contact TCA51 may be disposed on the first side of each of the first and second gate electrodes G51 and G52, and on the third and fourth active patterns F53 and F54. The first upper source/drain contact TCA51 may extend through a portion of the second interlayer insulating layer 130 in the vertical direction DR3, and may be electrically connected to the first upper source/drain region TSD51 and the second upper source/drain region TSD52.

A second upper source/drain contact TCA52 may be disposed on the first active pattern F51 and on the second side of the first gate electrode G51. The second upper source/drain contact TCA52 may extend through a portion of the second interlayer insulating layer 130 in the vertical direction DR3, and may be electrically connected to the third upper source/drain region TSD53.

A first via V51 may be disposed on the first gate contact CB51. A second via V52 may be disposed on the second gate contact CB52. A third via V53 may be disposed on the first lower source/drain contact BCA51. The third via V53 may extend through the fourth interlayer insulating layer 160, the third interlayer insulating layer 150 and the etching stop layer 140 in the vertical direction DR3, thereby electrically connecting the first lower source/drain contact BCA51 and the second line pattern 190 to each other.

A fourth via V54 may be disposed on the second lower source/drain contact BCA52. The fourth via V54 may extend through the fourth interlayer insulating layer 160, the third interlayer insulating layer 150 and the etching stop layer 140 in the vertical direction DR3, thereby electrically connecting the second lower source/drain contact BCA54 and the second line pattern 190 to each other. The first lower source/drain contact BCA51 and the second lower source/drain contact BCA52 may be electrically connected to each other via the second line pattern 190.

A fifth via V55 may be disposed on the third lower source/drain contact BCA53. The fifth via V55 may extend through the fourth interlayer insulating layer 160, the third interlayer insulating layer 150, and the etching stop layer 140 in the vertical direction DR3, thereby electrically connecting the third lower source/drain contact BCA53 and the second line pattern 190 to each other.

A sixth via V56 may be disposed on the fourth lower source/drain contact BCA54. The sixth via V56 may extend through the fourth interlayer insulating layer 160, the third interlayer insulating layer 150, and the etching stop layer 140 in the vertical direction DR3, thereby electrically connecting the fourth lower source/drain contact BCA54 and the second line pattern 190 to each other. The third lower source/drain contact BCA53 and the fourth lower source/drain contact BCA54 may be electrically connected to each other via the second line pattern 190.

A seventh via V57 may be disposed on the first upper source/drain contact TCA51. The seventh via V57 may extend through the third interlayer insulating layer 150 and the etching stop layer 140 in the vertical direction DR3, thereby electrically connecting the first upper source/drain contact TCA51 and the first line pattern 180 to each other. An eighth via V58 may be disposed on the second upper source/drain contact TCA52. The eighth via V58 may extend through the third interlayer insulating layer 150 and the etching stop layer 140 in the vertical direction DR3, thereby electrically connecting the second upper source/drain contact TCA52 and the first line pattern 180 to each other.

While aspects of embodiments have been particularly shown and described, it will be understood that various changes in form and details may be made therein without departing from the spirit and scope of the following claims.

What is claimed is:

1. A semiconductor device comprising:
    a substrate;
    a plurality of lower nanosheets on the substrate and extending in a first horizontal direction, wherein the plurality of lower nanosheets are stacked and spaced apart from each other in a vertical direction;
    a plurality of upper nanosheets on the plurality of lower nanosheets and extending in the first horizontal direction, wherein the plurality of upper nanosheets are stacked and spaced apart from each other in the vertical direction;
    first to fourth gate electrodes on the substrate and extending in a second horizontal direction different from the first horizontal direction, wherein the first to fourth gate electrodes are provided around each of the plurality of lower nanosheets and each of the plurality of upper nanosheets, the second gate electrode is spaced apart from the first gate electrode in the second horizontal direction, the third gate electrode is spaced apart from the first gate electrode in the first horizontal direction, and the fourth gate electrode is spaced apart from the third gate electrode in the second horizontal direction;
    a first lower source/drain region on a first side of the first and second gate electrodes;
    a second lower source/drain region on a second side of the first and second gate electrodes opposite to the first side in the first horizontal direction, wherein the second side of the first and second gate electrodes faces the third and fourth gate electrodes;
    a first upper source/drain region on the first lower source/drain region;
    a second upper source/drain region on the second lower source/drain region,
    a buried contact connected to the first lower source/drain region; and
    an interlayer insulating layer between the first lower source/drain region and the first upper source/drain region, and between the second lower source/drain region and the second upper source/drain region,
    wherein a first length in the second horizontal direction of the second lower source/drain region is greater than a second length in the second horizontal direction of the second upper source/drain region,
    wherein the first lower source/drain region comprises a third lower source/drain region on the first side of the first gate electrode and a fourth lower source/drain region on the first side of the second gate electrode, and
    wherein the buried contact extends between the third lower source/drain region and the fourth lower source/drain region.

2. The semiconductor device of claim 1,
    wherein the second lower source/drain region comprises a fifth lower source/drain region on the second side of the first gate electrode, and a sixth lower source/drain region on the second side of the second gate electrode,
    wherein the fourth lower source/drain region is spaced apart from the third lower source/drain region in the second horizontal direction, and
    wherein the sixth lower source/drain region is spaced apart from the fifth lower source/drain region in the second horizontal direction.

3. The semiconductor device of claim 2,
    wherein the buried contact is electrically connected to each of the third and fourth lower source/drain regions, and the buried contact extends into an inside of the substrate.

4. The semiconductor device of claim 3, wherein at least a portion of the buried contact does not overlap the first lower source/drain region in the second horizontal direction.

5. The semiconductor device of claim 2, further comprising:
    a first lower source/drain contact on the second side of the first gate electrode, and electrically connected to the fifth lower source/drain region; and
    a second lower source/drain contact on the second side of the second gate electrode, and electrically connected to the sixth lower source/drain region,
    wherein the first and second lower source/drain contacts are spaced apart from the second upper source/drain region.

6. The semiconductor device of claim 1, wherein the first upper source/drain region comprises a third upper source/drain region on the first side of the first gate electrode and a fourth upper source/drain region on the first side of the second gate electrode,
    wherein the second upper source/drain region comprises a fifth upper source/drain region on the second side of the first gate electrode and a sixth upper source/drain region on the second side of the second gate electrode, wherein the fourth upper source/drain region is spaced apart from the third upper source/drain region in the second horizontal direction, and wherein the sixth upper source/drain region is spaced apart from the fifth upper source/drain region in the second horizontal direction.

7. The semiconductor device of claim 6, further comprising:
a first upper source/drain contact on the first side of the first and second gate electrodes, and electrically connected to each of the third and fourth upper source/drain regions; and
a second upper source/drain contact on the second side of the first and second gate electrodes, and electrically connected to each of the fifth and sixth upper source/drain regions.

8. The semiconductor device of claim 1, wherein the first length is shorter than three times of the second length.

9. The semiconductor device of claim 1, wherein the plurality of lower nanosheets are in an NMOS region, and the plurality of upper nanosheets are in a PMOS region.

10. A semiconductor device comprising:
a substrate;
a plurality of lower nanosheets on the substrate and extending in a first horizontal direction, wherein the plurality of lower nanosheets are stacked and spaced apart from each other in a vertical direction;
a plurality of upper nanosheets on the plurality of lower nanosheets and extending in the first horizontal direction, wherein the plurality of upper nanosheets are stacked and spaced apart from each other in the vertical direction;
a first gate electrode on the substrate and extending in a second horizontal direction different from the first horizontal direction, wherein the first gate electrode is provided around each of the plurality of lower nanosheets and each of the plurality of upper nanosheets;
a second gate electrode on the substrate and extending in the second horizontal direction, wherein the second gate electrode is spaced apart from the first gate electrode in the second horizontal direction, and the second gate electrode is provided around each of the plurality of lower nanosheets and each of the plurality of upper nanosheets;
a lower source/drain region on first and second sides of the first and second gate electrodes;
an upper source/drain region on the lower source/drain region on the first and second sides of the first and second gate electrodes;
a buried contact connected to the lower source/drain region; and
an interlayer insulating layer between the lower source/drain region and the upper source/drain region,
wherein on at least one side of the first and second sides of the first and second gate electrodes, a first length in the second horizontal direction of the lower source/drain region is greater than a second length in the second horizontal direction of the upper source/drain region,
wherein the lower source/drain region comprises a first lower source/drain region on the first side of the first gate electrode and a second lower source/drain region on the first side of the second gate electrode, and wherein the buried contact extends between the first lower source/drain region and the second lower source/drain region.

11. The semiconductor device of claim 10, further comprising:
a third gate electrode on the substrate and extending in the second horizontal direction, wherein the third gate electrode is spaced apart from the first gate electrode in the first horizontal direction; and
a fourth gate electrode on the substrate and extending in the second horizontal direction, wherein the fourth gate electrode is spaced apart from the third gate electrode in the second horizontal direction,
wherein the at least one side is between the first and third gate electrodes, and between the second and fourth gate electrodes.

12. The semiconductor device of claim 10,
wherein the buried contact extends between the first lower source/drain region and the second lower source/drain region, wherein the buried contact is electrically connected to each of the first and second lower source/drain regions, and the buried contact extends into an inside of the substrate.

13. The semiconductor device of claim 10, further comprising:
a third gate electrode on the substrate and extending in the second horizontal direction, wherein the third gate electrode is spaced apart from the second gate electrode in the second horizontal direction; and
a fourth gate electrode on the substrate and extending in the second horizontal direction, wherein the fourth gate electrode is spaced apart from the third gate electrode in the second horizontal direction.

14. The semiconductor device of claim 10,
wherein the lower source/drain region comprises a third lower source/drain region on the second side of the first and second gate electrodes,
wherein the upper source/drain region comprises:
a first upper source/drain region on the first lower source/drain region; and
a third upper source/drain region on the third lower source/drain region,
wherein the first length in the second horizontal direction of the first lower source/drain region is greater than the second length in the second horizontal direction of the first upper source/drain region, and
wherein a third length in the second horizontal direction of the third lower source/drain region is greater than a fourth length in the second horizontal direction of the third upper source/drain region.

15. A semiconductor device comprising:
a substrate;
a plurality of lower nanosheets on the substrate and extending in a first horizontal direction, wherein the plurality of lower nanosheets are stacked and spaced apart from each other in a vertical direction;
a plurality of upper nanosheets on the plurality of lower nanosheets and extending in the first horizontal direction, the plurality of upper nanosheets are stacked and spaced apart from each other in the vertical direction;
a first gate electrode on the substrate and extending in a second horizontal direction different from the first horizontal direction, wherein the first gate electrode is provided around each of the plurality of lower nanosheets and each of the plurality of upper nanosheets;

a second gate electrode on the substrate and extending in the second horizontal direction, wherein the second gate electrode is spaced apart from the first gate electrode in the second horizontal direction, and the second gate electrode is provided around each of the plurality of lower nanosheets and each of the plurality of upper nanosheets;

a first lower source/drain region on a first side of the first and second gate electrodes;

a second lower source/drain region on a second side of the first and second gate electrodes opposite to the first side in the first horizontal direction;

a first upper source/drain region on the first lower source/drain region;

a second upper source/drain region on the second lower source/drain region;

an interlayer insulating layer between the first lower source/drain region and the first upper source/drain region, and between the second lower source/drain region and the second upper source/drain region; and a buried contact electrically connected to a lower source/drain region of the first and second lower source/drain regions and extending between portions of the lower/source drain region into an inside of the substrate.

16. The semiconductor device of claim 15, further comprising:

a third gate electrode on the substrate and extending in the second horizontal direction, wherein the third gate electrode is spaced apart from the first gate electrode in the first horizontal direction; and a fourth gate electrode on the substrate and extending in the second horizontal direction, wherein the fourth gate electrode is spaced apart from the third gate electrode in the second horizontal direction.

17. The semiconductor device of claim 16, wherein between the first and third gate electrodes, and between the second and fourth gate electrodes, a first length in the second horizontal direction of the second lower source/drain region is greater than a second length in the second horizontal direction of the second upper source/drain region.

18. The semiconductor device of claim 15, further comprising:

a third gate electrode on the substrate and extending in the second horizontal direction, wherein the third gate electrode is spaced apart from the second gate electrode in the second horizontal direction; and a fourth gate electrode on the substrate and extending in the second horizontal direction, wherein the fourth gate electrode is spaced apart from the third gate electrode in the second horizontal direction.

19. The semiconductor device of claim 18, wherein on the first side of the first and second gate electrodes, a third length in the second horizontal direction of the first lower source/drain region is greater than a fourth length in the second horizontal direction of the first upper source/drain region.

20. The semiconductor device of claim 15, wherein the buried contact comprises:

a first buried contact electrically connected to the first lower source/drain region, and extending into the inside of the substrate; and a second buried contact electrically connected to the second lower source/drain region, and extending into the inside of the substrate.

\* \* \* \* \*